(12) United States Patent
Kim et al.

(10) Patent No.: US 11,152,349 B2
(45) Date of Patent: Oct. 19, 2021

(54) INTEGRATED CIRCUIT (IC) DEVICE

(71) Applicant: Samsung Electronics Co., Ltd., Suwon-si (KR)

(72) Inventors: Hyun-jo Kim, Seoul (KR); Joong-won Jeon, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/871,414

(22) Filed: May 11, 2020

(65) Prior Publication Data

US 2020/0273852 A1     Aug. 27, 2020

Related U.S. Application Data

(63) Continuation of application No. 16/275,768, filed on Feb. 14, 2019, now Pat. No. 10,714,467.

(30) Foreign Application Priority Data

Aug. 23, 2018    (KR) .................. 10-2018-0098759

(51) Int. Cl.
*H01L 27/02*      (2006.01)
*H01L 27/092*     (2006.01)
(Continued)

(52) U.S. Cl.
CPC .. *H01L 27/0207* (2013.01); *H01L 21/823821* (2013.01); *H01L 21/823878* (2013.01);
(Continued)

(58) Field of Classification Search
CPC ............ H01L 27/0207; H01L 27/0886; H01L 27/0924; H01L 29/0653; H01L 21/823821; H01L 21/823878
See application file for complete search history.

(56) References Cited

U.S. PATENT DOCUMENTS 8,051,390 B2    11/2011 Frederick et al.
8,431,967 B2     4/2013 Nakanishi et al.
(Continued)

FOREIGN PATENT DOCUMENTS

KR    10-2016-0047380 A     5/2016
TW       201639158 A        11/2016
(Continued)

OTHER PUBLICATIONS

Office Action dated Aug. 25, 2020, issued in corresponding Taiwanese Patent Application No. TW 108107508.
(Continued)

*Primary Examiner* — Changhyun Yi
(74) *Attorney, Agent, or Firm* — Harness, Dickey & Pierce, P.L.C.

(57) ABSTRACT

Provided is an integrated circuit (IC) device including a logic cell having an area defined by a cell boundary. The logic cell includes a first device region, a device isolation region, and a second device region. The first device region and the second device region are arranged apart from each other in a first direction that is perpendicular to a second direction. The device isolation region is between the first device region and the second device region. A first maximum length of the first device region in the second direction is less than a width of the cell boundary in the second direction, and a second maximum length of the second device region is substantially equal to the width of the cell boundary in the second direction.

19 Claims, 56 Drawing Sheets

(51) Int. Cl.
*H01L 21/8238* (2006.01)
*H01L 29/06* (2006.01)
*H01L 27/088* (2006.01)

(52) U.S. Cl.
CPC ...... *H01L 27/0886* (2013.01); *H01L 27/0924* (2013.01); *H01L 29/0653* (2013.01)

(56) References Cited

U.S. PATENT DOCUMENTS

| | | | |
|---|---|---|---|
| 9,691,902 | B2 | 6/2017 | Kang et al. |
| 9,853,029 | B2 | 12/2017 | You et al. |
| 9,865,704 | B2 | 1/2018 | Xie et al. |
| 9,893,063 | B2 | 2/2018 | Jain et al. |
| 9,922,983 | B1 | 3/2018 | Bao et al. |
| 10,373,953 | B2 | 8/2019 | Kim et al. |
| 2005/0274983 | A1 | 12/2005 | Hayashi et al. |
| 2013/0026571 | A1 | 1/2013 | Kawa et al. |
| 2013/0313615 | A1 | 11/2013 | Tzeng et al. |
| 2015/0221639 | A1 | 8/2015 | Chen et al. |
| 2016/0117431 | A1 | 4/2016 | Kim et al. |
| 2016/0268414 | A1 | 9/2016 | Park et al. |
| 2016/0343709 | A1* | 11/2016 | Kim ................ H01L 29/785 |
| 2017/0162574 | A1 | 6/2017 | Kim et al. |
| 2017/0221770 | A1 | 8/2017 | Chung et al. |
| 2017/0287933 | A1 | 10/2017 | Chen et al. |
| 2018/0301447 | A1 | 10/2018 | Zhu et al. |

FOREIGN PATENT DOCUMENTS

| | | |
|---|---|---|
| TW | 201642442 A | 12/2016 |
| TW | 201721868 A | 6/2017 |

OTHER PUBLICATIONS

Notice of Allowance dated Mar. 5, 2020, issued in corresponding U.S. Appl. No. 16/275,768.
U.S. Appl. No. 16/871,441, filed May 11, 2020.
Office Action dated Feb. 24, 2021, issued in corresponding U.S. Appl. No. 16/871,441.

* cited by examiner

X1 – X1'

X2 - X2'

X1 – X1'

X1 – X1'

X1 – X1'

INTEGRATED CIRCUIT (IC) DEVICE

CROSS-REFERENCE TO RELATED PATENT APPLICATION

This application is a continuation of U.S. application Ser. No. 16/275,768, filed Feb. 14, 2019, which claims the benefit of Korean Patent Application No. 10-2018-0098759, filed on Aug. 23, 2018, in the Korean Intellectual Property Office, the disclosure of each of which is incorporated herein in its entirety by reference.

BACKGROUND

Inventive concepts relate to integrated circuit (IC) devices, and more particularly, to an IC device including a fin field-effect transistor.

Recently, as down-scaling of IC devices rapidly progresses, interest obtaining not only a high operation speed but also operational accuracy in IC devices has increased. Accordingly, an IC device having a structure capable of providing improved performance according to a channel type of a transistor and also effectively utilizing a given area within a restricted logic cell area needs to be developed.

SUMMARY

Inventive concepts provide an integrated circuit (IC) device having a structure in which optimal performance may be provided according to each channel type in transistors even though the area of a device region is reduced according to down-scaling of the IC device, and also having a structure in which improved performance may be provided by increasing utilization of an active region.

According to an aspect of inventive concepts, an IC device includes a logic cell having an area defined by a cell boundary. The logic cell includes a first device region, a device isolation region, and a second device region. The first device region and second device region are arranged apart from each other in a first direction that is perpendicular to a second direction. The device isolation region is between the first device region and the second device region. A first maximum length of the first device region in a second direction is less than a width of the cell boundary in the second direction, and a second maximum length of the second device region in the second direction is substantially equal to the width of the cell boundary.

According to another aspect of inventive concepts, an IC device includes a substrate including a first device region and a second device region in a logic cell defined by a cell boundary, a device isolation region in a trench in the substrate between the first device region and the second device region, a first fin separation insulating portion on the substrate, and second fin separation insulating portion on the second device region. The first device region and the second device region are defined by the trench in the substrate and are spaced apart from each other in a first direction. A length of the first device region in a second direction is different than a length of the second device region in the second direction. The second direction is perpendicular to the first direction. The first device region includes a first fin-type active region extending in the second direction. The second device region includes a second fin-type active region extending in the second direction. A first fin separation insulating portion is between the first device region and the cell boundary. The first fin separation insulating portion extends in the first direction along the cell boundary. The first fin separation insulating portion has a first width in the second direction, and the first fin separation insulating portion faces an end of the first fin-type active region. The second fin separation insulating portion is spaced apart from the first fin separation insulating portion, extends in the first direction along the cell boundary, and has a second width in the second direction that is less than the first width in the second direction. The second fin separation insulating portion faces an end of the second fin-type active region.

According to another aspect of inventive concepts, an IC device includes a cell boundary contact portion between a first logic cell and a second logic cell that are adjacent to each other. The cell boundary contact portion defines a first cell boundary of the first logic cell and a second cell boundary of the second logic cell. The first logic cell includes a first device region, a second device region, a first fin separation insulating portion, and a portion of the second fin separation insulating portion. The first device region and the second device region are spaced apart from each other in a first direction. The first device region includes a first fin-type active region that extends in a second direction perpendicular to the first direction. The first fin separation insulating portion has a first inner sidewall and a first outer sidewall. The first inner sidewall faces the first fin-type active region, and the first outer sidewall is aligned with the cell boundary contact portion. The second device region includes a second fin-type active region that extends in the second direction. The second fin separation insulating portion extends in the first direction along the cell boundary contact portion at a location overlapping the cell boundary contact portion. The second fin separation insulating portion has a second inner sidewall and a second outer sidewall. The second inner sidewall faces the second fin-type active region. The second outer sidewall is located within the second logic cell.

BRIEF DESCRIPTION OF THE DRAWINGS

Example embodiments of inventive concepts will be more clearly understood from the following detailed description taken in conjunction with the accompanying drawings in which.

DETAILED DESCRIPTION

Figure 1:
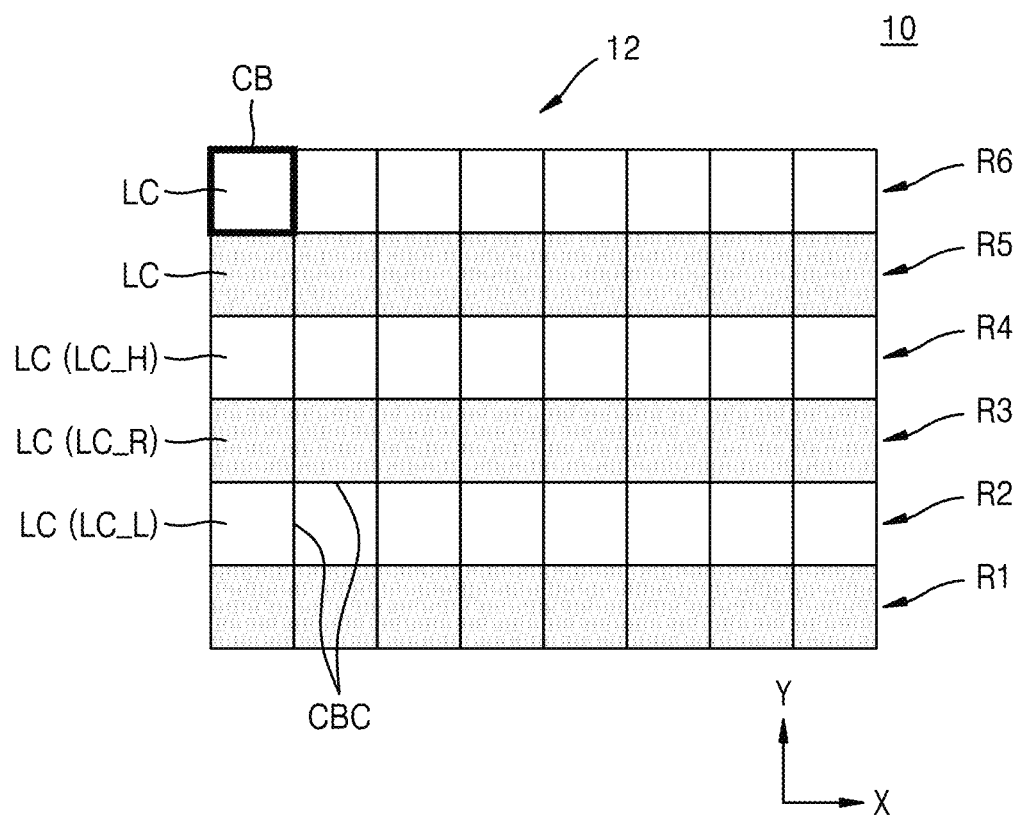
FIG. 1 is a plan layout diagram of an example cell block of an integrated circuit (IC) device according to some embodiments of inventive concepts.

Hereinafter, inventive concepts will be described more fully with reference to the accompanying drawings, in which example embodiments of inventive concepts are shown. Like reference numerals in the drawings denote like elements, and thus their description will be omitted.

FIG. 1 is a schematic plan view of an integrated circuit (IC) device 10 according to some embodiments of inventive concepts.

Referring to FIG. 1, the cell block 12 of the IC device 10 may include a plurality of logic cells LC including circuit patterns for constituting various circuits. The plurality of logic cells LC may be arranged in a width direction (X direction) and a height direction (Y direction) to form a matrix within the cell block 12.

The plurality of logic cells LC may include circuit patterns having a layout designed according to a Place and Route (PnR) technique to perform at least one logic function. The plurality of logic cells LC may perform various logic functions. According to some embodiments, the plurality of logic cells LC may include a plurality of standard cells. According to some embodiments, at least some of the plurality of logic cells LC may perform the same functions as each other. According to some other embodiments, at least some of the plurality of logic cells LC may perform different functions from each other.

The plurality of logic cells LC may be various types of logic cells including a plurality of circuit elements. For example, the plurality of logic cells LC may include one AND, NAND, OR, NOR, exclusive OR (XOR), exclusive NOR (XNORs), inverter (INV), adder (ADD), buffer (BUF), delay (DLY), filter (FILL), multiplexer (MXT/MXIT), OR/AND/INVERTER (OAI), AND/OR (AO), AND/OR/INVERTER (AOI), D flip-flop, reset flip-flop, master-slaver flip-flop, latch, or a combination thereof, but inventive concepts are not limited thereto.

In the cell block 12, at least some of a plurality of logic cells LC forming a row R1, R2, R3, R4, R5, or R6 may have the same widths as each other in the width direction (X direction). The at least some of the plurality of logic cells LC forming the row R1, R2, R3, R4, R5, or R6 may have the same heights as each other. However, inventive concepts are not limited to the illustration of FIG. 1, and at least some of the plurality of logic cells LC forming the row R1, R2, R3, R4, R5, or R6 may have different widths from one another and different heights from one another.

The area of each of the plurality of logic cells LC included in the cell block 12 of the IC device 10 may be defined by a cell boundary CB. A cell boundary contact portion CBC may be included between two logic cells LC adjacent to each other in the width direction (X direction) or the height direction (Y direction) from among the plurality of logic cells LC. In the cell boundary contact portion CBC, respective cell boundaries CB of the two adjacent logic cells meet each other.

Two logic cells LC adjacent to each other in the width direction from among the plurality of logic cells LC forming the row R1, R2, R3, R4, R5, or R6 may contact each other in a cell boundary contact portion CBC.

According to some embodiments, the two logic cells LC adjacent to each other from among the plurality of logic cells LC forming the row R1, R2, R3, R4, R5, or R6 may perform the same functions as each other. In this case, the two adjacent logic cells LC may have the same structures as each other. According to some other embodiments, the two logic cells LC adjacent to each other from among the plurality of logic cells LC forming the row R1, R2, R3, R4, R5, or R6 may perform different functions from each other.

According to some embodiments, a logic cell LC selected from the plurality of logic cells LC included in the cell block 12 of the IC device 10, and a logic cell LC adjacent to the selected logic cell LC in the height direction (Y direction) may have structures that are symmetrical to each other about a cell boundary contact portion CBC between the two logic cells LC. For example, a reference logic cell LC_R on a third row R3 and a lower logic cell LC_L on a second row R2 may have structures that are symmetrical to each other about a cell boundary contact portion CBC between the reference logic cell LC_R and the lower logic cell LC_L. The reference logic cell LC_R on the third row R3 and a higher logic cell LC_H on a fourth row R4 may have structures that are symmetrical to each other about a cell boundary contact portion CBC between the reference logic cell LC_R and the higher logic cell LC_H.

Although the cell block 12 including the six rows R1, R2, . . . , and R6 is illustrated in FIG. 1, this is merely an example. Thus, the cell block 12 may include various numbers of rows selected according to desired arrangements, and various numbers of logic cells selected according to desired arrangements.

Figure 2:
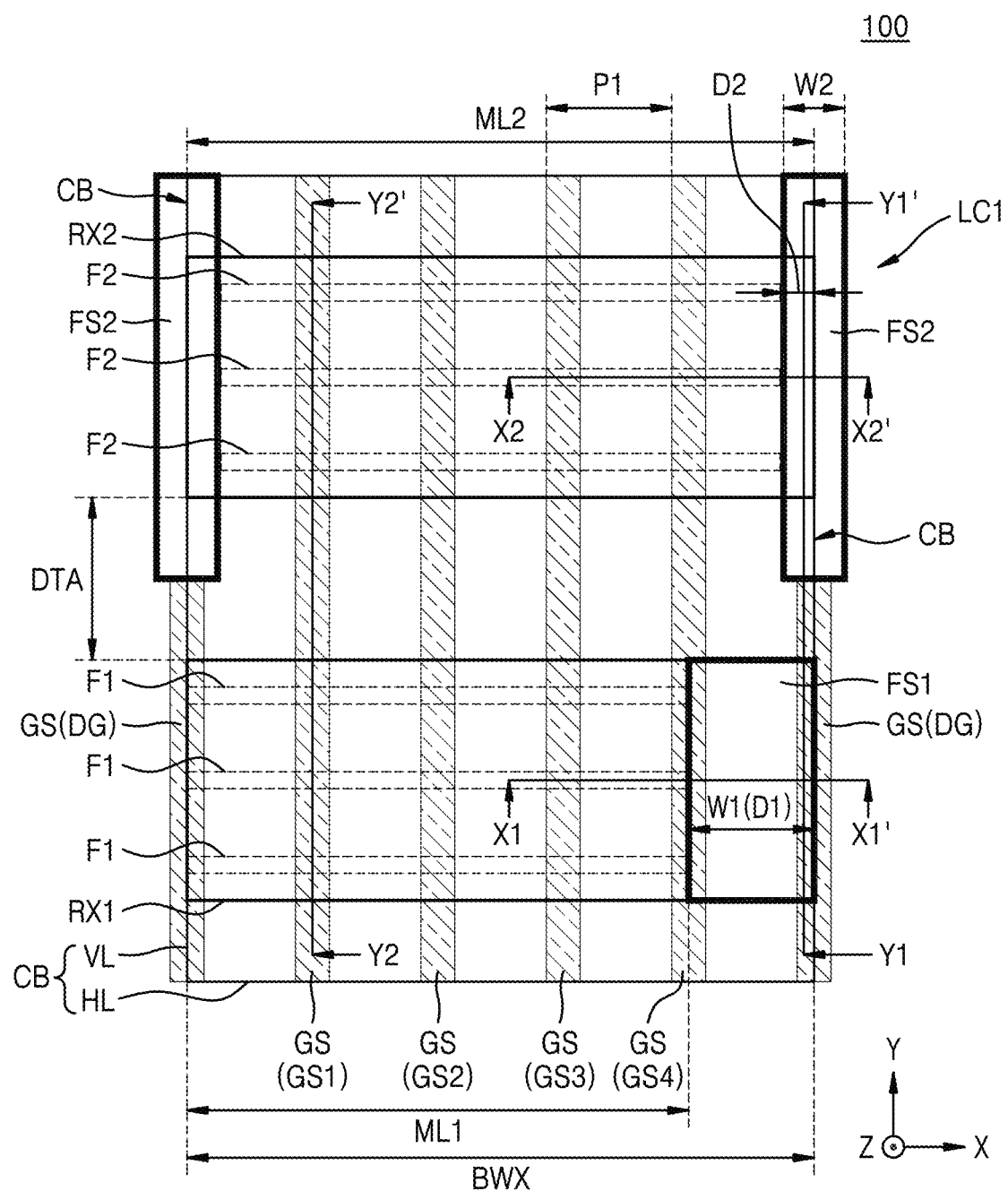
FIG. 2 is a plan layout diagram showing major components of an IC device according to embodiments of inventive concepts.
Figure 3A:
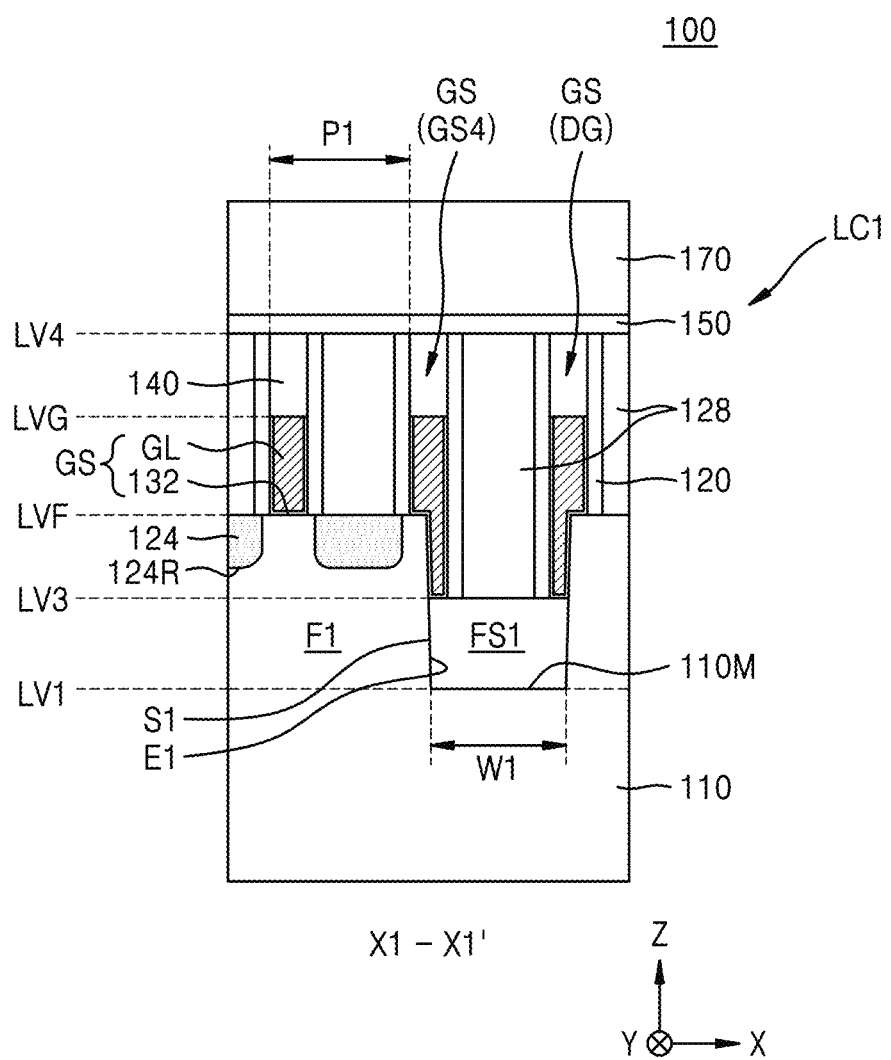
FIG. 3A is a cross-sectional view taken along line X1-X1' of FIG. 2.
Figure 3B:
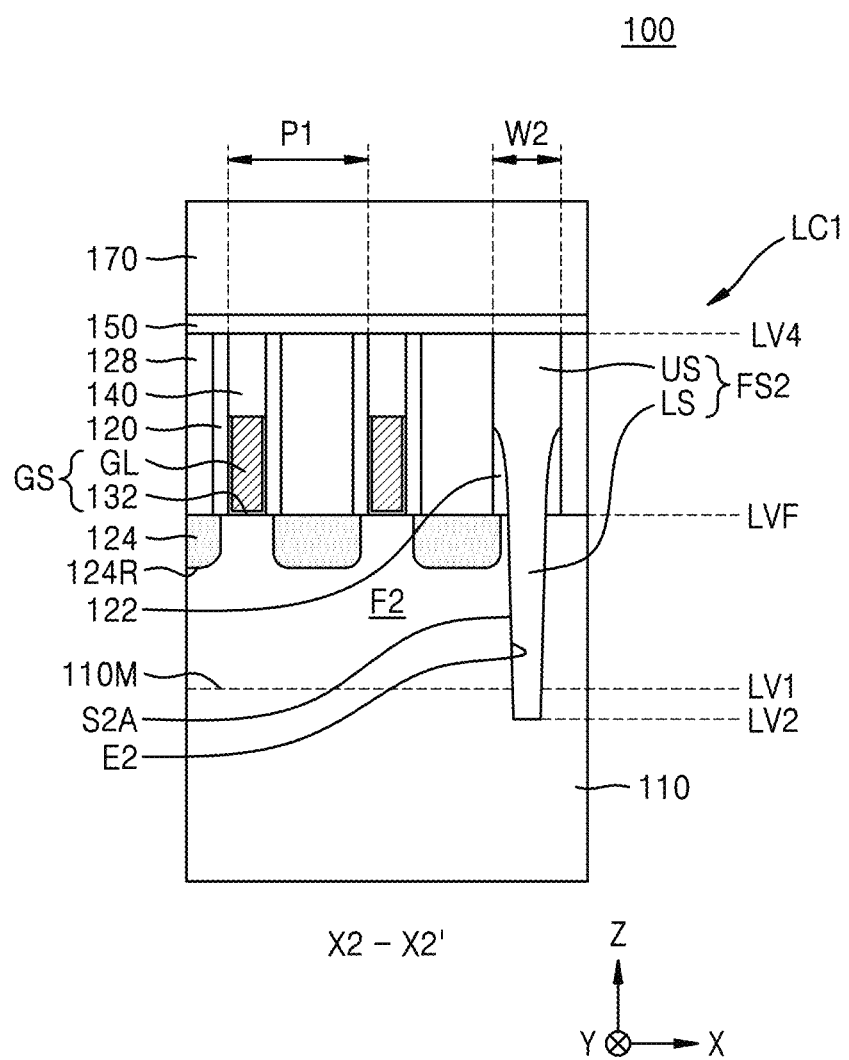
FIG. 3B is a cross-sectional view taken along line X2-X2' of FIG. 2.
Figure 3C:
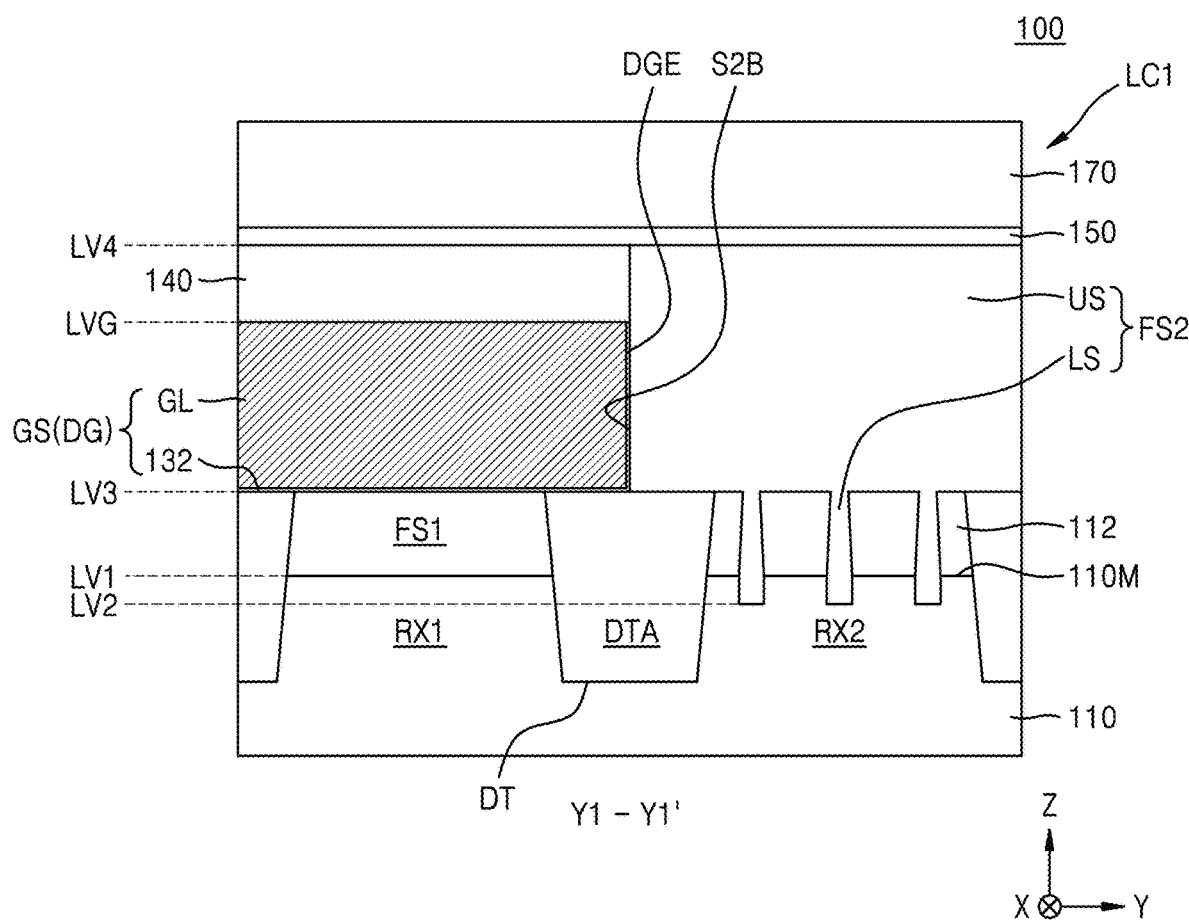
FIG. 3C is a cross-sectional view taken along line Y1-Y1' of FIG. 2.
Figure 3D:
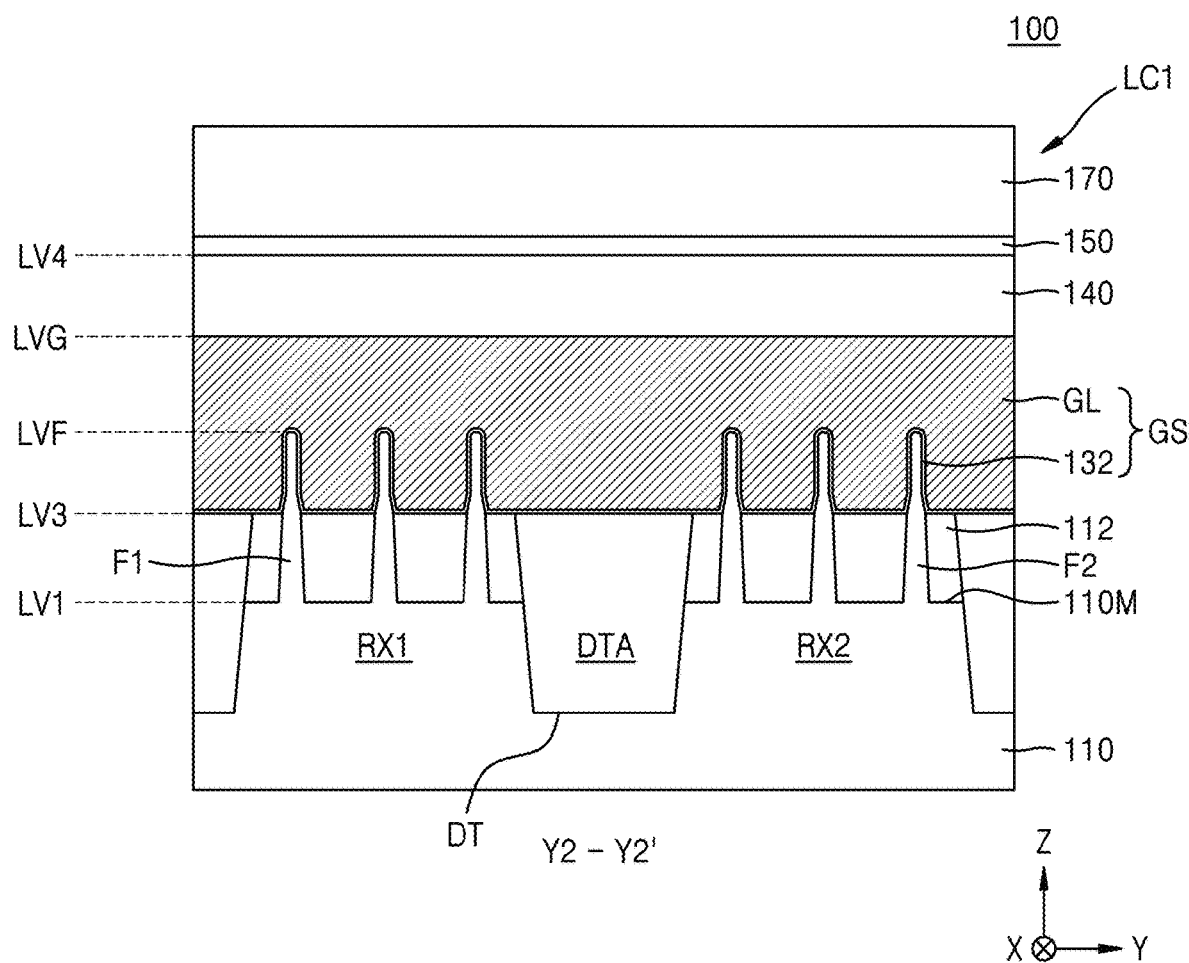
FIG. 3D is a cross-sectional view taken along line Y2-Y2' of FIG. 2.

FIGS. 2 and 3A through 3D are diagrams for explaining an IC device 100 according to some embodiments of inventive concepts. FIG. 2 is a plan layout diagram illustrating major components of the IC device 100, FIG. 3A is a cross-sectional view taken along a line X1-X1' of FIG. 2, FIG. 3B is a cross-sectional view taken along a line X2-X2' of FIG. 2, FIG. 3C is a cross-sectional view taken along a line Y1-Y1' of FIG. 2, and FIG. 3D is a cross-sectional view taken along a line Y2-Y2' of FIG. 2. The IC device 100 may configure a logic cell including a fin field-effect transistor (FinFET).

Referring to FIGS. 2 and 3A through 3D, the IC device 100 includes a logic cell LC1 on a substrate 110. The logic cell LC1 has an area defined by a cell boundary CB. The logic cell LC1 may be one of the plurality of logic cells LC that constitute the cell block 12 of FIG. 1.

The substrate 110 may have a main surface 110M extending from a vertical level LV1 in a horizontal direction (X-Y plane direction). The substrate 110 may include a semiconductor such as Si or Ge, or a compound semiconductor such as SiGe, SiC, GaAs, InAs, or InP. The substrate 110 may include a conductive region, for example, an impurity-doped well or an impurity-doped structure.

The logic cell LC1 may include a first device region RX1 and a second device region RX2. The first device region RX1 and the second device region RX2 may be arranged apart from each other in a height direction (Y direction) of the logic cell LC1, with a device isolation region DTA between the first device region RX1 and the second device region RX2 within the cell boundary CB.

In a width direction (X direction) of the logic cell LC1, a first maximum length ML1 of the first device region RX1 may be less than an X-direction width BWX of the cell boundary CB, and a second maximum length ML2 of the second device region RX2 may be substantially equal to the X-direction width BWX of the cell boundary CB. The cell boundary CB includes a pair of vertical boundary lines VL each extending in the height direction (Y direction) of the logic cell LC1 and being parallel to each other to define a width of the logic cell LC1, and a pair of horizontal boundary lines HL each extending in the width direction (X direction) of the logic cell LC1 and being parallel to each other to define a height of the logic cell LC1.

One of a pair of opposite lateral sides of the first device region RX1 in the width direction (X direction) may be spaced apart from one of the vertical boundary lines VL of the cell boundary CB, and the other of the two opposite lateral sides may meet the other of the vertical boundary lines VL of the cell boundary CB. A pair of opposite lateral sides of the second device region RX2 in the width direction (X direction) may be arranged to meet the pair of vertical boundary lines VL of the cell boundary CB, respectively.

In the first device region RX1, there are a plurality of first fin-type active regions F1 protruding from the substrate 110 in a vertical direction (Z direction). In the second device region RX2, there are a plurality of second fin-type active regions F2 protruding from the substrate 110 in the vertical direction (Z direction). Between the first device region RX1 and the second device region RX2, there may be a deep trench DT in the substrate 110. The device isolation region DTA may be formed to fill the deep trench DT. The plurality of first and second fin-shaped active regions F1 and F2 may each extend in the width direction (X direction) of the logic cell LC1 and may be parallel to each other.

On the first device region RX1 and the second device region RX2, there may be a device isolation layer 112 between the plurality of first fin-type active regions F1 and between the plurality of second fin-type active regions F2. The device isolation layer 112 may cover both side walls of each of the plurality of first and second fin-type active regions F1 and F2. Each of the plurality of first and second fin-type active regions F1 and F2 may protrude above the device isolation layer 112 to have a fin shape.

A first fin separation insulating portion FS1 may be interposed between the first device region RX1 and a vertical boundary line VL of the cell boundary CB. The first fin separation insulating portion FS1 may have a first width W1 in the width direction (X direction) of the logic cell LC1. According to some embodiments, the first width W1 of the first fin separation insulating portion FS1 may correspond to a difference between the first maximum length ML1 of the first device region RX1 and the second maximum length ML2 of the second device region RX2.

Within the cell boundary CB, the first fin separation insulating portion FS1 may face the second device region RX2 with the device isolation region DTA therebetween. According to some embodiments, the first fin separation insulating portion FS1 may be a portion of the device isolation layer 112.

The first fin separation insulating portion FS1 may have a sidewall Si facing an end E1 of each of the plurality of first fin-type active regions F1. In the width direction (X direction) of the logic cell LC1, the end E1 of each of the plurality of first fin-type active regions F1 may be spaced apart from the vertical boundary line VL of the cell boundary CB by a first distance D1 that is substantially equal to the first width W1, with the first fin separation insulating portion FS1 therebetween.

A second fin separation insulating portion FS2 extending along the vertical boundary line VL of the cell boundary CB may be disposed in the second device region RX2. The second fin separation insulating portion FS2 may have a second width W2 in the width direction (X direction) of the logic cell LC1, which is less than the first width W1. The second fin separation insulating portion FS2 may have a first sidewall S2A facing an end E2 of each of the plurality of second fin-type active regions F2. The second fin separation insulating portion FS2 may overlap the vertical boundary line VL of the cell boundary CB and extend along the vertical boundary line VL in the height direction (Y direction) of the logic cell LC1. In the width direction (X direction) of the logic cell LC1, the end E2 of each of the plurality of second fin-type active regions F2 may be spaced apart from the vertical boundary line VL of the cell boundary CB by a second distance D2 that is less than the first distance D1, with the second fin separation insulating portion FS2 therebetween. The second distance D2 may be less than the second width W2 of the second fin separation insulating portion FS2.

According to some embodiments, each of the first fin separation insulating portion FS1 and the second fin separation insulating portion FS2 may include a single insulating layer or a plurality of insulating layers. Although an insulating layer included in each of the first fin separation insulating portion FS1 and the second fin separation insulating portion FS2 may include a silicon oxide layer, a silicon nitride layer, a SiOCN layer, a SiCN layer, or a combination thereof, inventive concepts are not limited thereto. According to some other embodiments, at least some of the first fin separation insulating portion FS1 and the second fin separation insulating portion FS2 may include an air gap.

According to some embodiments, the device isolation layer 112, the device isolation area DTA, and the first fin separation insulating portion FS1 may include the same insulating materials as one another. For example, the device isolation layer 112, the device isolation area DTA, and the first fin separation insulating portion FS1 may each include a silicon oxide layer.

The second fin separation insulating portion FS2 may include an upper insulating portion US and a lower insulating portion LS integrally connected to each other. The upper insulating portion US may extend over the second device region RX2 in the Y direction. Each of the upper insulating portion US and the lower insulating portion LS may include a silicon oxide layer, a silicon nitride layer, a SiOCN layer, a SiCN layer, or a combination thereof.

The first fin separation insulating portion FS1 and the second fin separation insulating portion FS2 may be spaced apart from each other with the device isolation region DTA therebetween, and a portion of the first fin separation insulating portion FS1 and a portion of the second fin separation insulating portion FS2 may face each other with the device isolation region DTA therebetween.

A vertical length (length in the Z direction) of the second fin separation insulating portion FS2 may be greater than a vertical length of the first fin separation insulating portion FS1. A lowermost surface vertical level of the first fin separation insulating portion FS1 may be substantially the same as the vertical level LV1 of the main surface 110M of the substrate 110. However, inventive concepts are not limited to this. According to some embodiments, the lowermost surface vertical level of the first fin separation insulating portion FS1 may be lower or higher than the vertical level LV1 of the main surface 110M of the substrate 110. The term "vertical level" used herein refers to a length in a vertical direction, for example, a ±Z direction, with respect to the main surface 110M of the substrate 110.

A lowermost surface vertical level LV2 of the second fin separation insulating portion FS2 may be lower than the lowermost surface vertical level LV1 of the first fin separation insulating portion FS1 and may be lower than a lowermost surface vertical level of the second fin-type active regions F2. However, inventive concepts are not limited to this. For example, the lowermost surface vertical level LV2 of the second fin separation insulating portion FS2 may be equal to or higher than the lowermost surface vertical level LV1 of the first fin separation insulating portion FS1. The lowermost surface vertical level LV2 of the second fin separation insulating portion FS2 may be equal to or higher than the lowermost surface vertical level of the second fin-type active regions F2.

An uppermost surface vertical level LV3 of the first fin separation insulating portion FS1 and an uppermost surface vertical level LV4 of the second fin separation insulating portion FS2 may be different from each other. According to some embodiments, the uppermost surface vertical level LV4 of the second fin separation insulating portion FS2 may be higher than the uppermost surface vertical level LV3 of the first fin separation insulating portion FS1. The uppermost surface vertical level LV3 of the first fin separation insulating portion FS1 may be substantially the same as an uppermost surface vertical level of the device isolation layer 112. The uppermost surface vertical level LV3 of the first fin separation insulating portion FS1 may be lower than an uppermost surface vertical level LVF of the first and second fin-type active regions F1 and F2, and the uppermost surface vertical level LV4 of the second fin separation insulating portion FS2 may be higher than the uppermost surface vertical level LVF.

A plurality of gate structures GS may extend over the substrate 110 in the Y direction, within the cell boundary CB. The plurality of gate structures GS may have identical widths to one another in the X direction and may be arranged at regular pitches, for example, at a first pitch P1, in the X direction. The difference between the first maximum length ML1 of the first device region RX1 and the second maximum length ML2 of the second device region RX2 may be substantially the same as the first pitch P1. The uppermost surface vertical level LV4 of the second fin separation insulating portion FS2 may be higher than an uppermost surface vertical level LVG of the plurality of gate structures GS.

Each of the plurality of gate structures GS may extend over the first device region RX1, the device isolation region DTA, and the second device region RX2 to be parallel to the vertical boundary lines VL of the cell boundary CB. At least some of gate structures GS1, GS2, GS3, and GS4 spaced apart from the vertical boundary lines VL of the cell boundary CB from among the plurality of gate structures GS may be normal gate structures. The plurality of gate structures GS may include a dummy gate structure DG overlapping the vertical boundary line VL of the cell boundary CB. The dummy gate structure DG may include a portion arranged on the first fin separation insulating portion FS1 such as to vertically overlap the first fin separation insulating portion FS1. The dummy gate structure DG may extend along the vertical boundary line VL to be aligned with the second fin separation insulating portion FS2 in a straight line. In the Y direction, a Y direction length of the dummy gate structure DG may be less than that of each of the gate structures GS1, GS2, GS3, and GS4 included in the plurality of gate structures GS. The dummy gate structure DG may have an end DGE facing a second sidewall S2B of the second fin separation insulating portion FS2.

The gate structure GS4 selected from the plurality of gate structures GS may extend to cover an upper surface of the first fin separation insulating portion FS1 and the plurality of first fin-type active regions F1 on the first device region RX1 and cover the plurality of second fin-type active regions F2 at a location apart from the second fin separation insulating portion FS2 on the second device region RX2. The gate structure GS4 may be arranged to vertically overlap the first device region RX1 and the first fin separation insulating portion FS1. The gate structure GS4 may include a portion vertically overlapping the first fin separation insulating portion FS1, and a portion vertically overlapping the plurality of first fin-type active regions F1. In the gate structure GS4, a vertical length (a length in the Z direction) of the portion vertically overlapping the first fin separation insulating portion FS1 may be greater than that of the portion vertically overlapping the plurality of first fin-type active regions F1. The gate structure GS4 may form a dummy gate structure on the first device region RX1 and may form a normal gate structure on the second device region RX2. The dummy gate structure DG around the first fin separation insulating portion FS1 may have a similar structure to the gate structure GS1.

The plurality of gate structures GS may cover an upper surface and both side walls of each of the plurality of first and second fin-type active regions F1 and F2, and an upper surface of the device isolation layer 112. In the first device region RX1 and the second device region RX2, a plurality of metal-oxide-semiconductor (MOS) transistors may be formed along the plurality of gate structures GS. Each of the plurality of MOS transistors may be a three-dimensional (3D) MOS transistor in which a channel is formed on an upper surface and both sidewalls of each of the plurality of first and second fin-type active regions F1 and F2. According to some embodiments, the first device region RX1 may be an N-type MOS (NMOS) transistor region, and the plurality of first fin-type active regions F1 may include N-type channel regions. According to some embodiments, the second device region RX2 may be a P-type MOS (PMOS) transistor region, and the plurality of second fin-type active regions F2 may include P-type channel regions. However, inventive concepts are not limited thereto, and various modifications may be made. For example, the first device region RX1 may be a PMOS transistor region, and the second device region RX2 may be an NMOS transistor region.

The gate structures GS1, GS2, GS3, and GS4 and the dummy gate structure DG may include the same materials as one another. According to some embodiments, the gate structures GS1, GS2, GS3, and GS4 and the dummy gate structure DG may include the same metal as one another and may have substantially the same stack structure as one another. However, the dummy gate structure DG may maintain an electric floating state during an operation of the IC device 100. Similarly, a portion of the gate structure GS4 that passes through the first device region RX1 may maintain an electric floating state during an operation of the IC device 100.

The plurality of gate structures GS may each have a stack structure of a gate insulating layer 132 and a gate line GL. The gate insulating layer 132 may cover a bottom surface and both sidewalls of the gate line GL. The gate insulating layer 132 may include a silicon oxide layer, a high-k dielectric layer, or a combination thereof. The high-k dielectric layer may include a material having a dielectric constant that is greater than that of a silicon oxide layer. The high-k dielectric layer may include a metal oxide or a metal oxynitride. There may be an interface layer (not shown) between the first fin-type active regions F1 in the first device region RX1 and the gate insulating layer 132 and between the second fin-type active regions F2 in the second device region RX2 and the gate insulating layer 132. The interface layer may include an oxide layer, a nitride layer, or an oxynitride layer.

The plurality of gate lines GL may have a structure in which a metal nitride layer, a metal layer, a conductive capping layer, and a gap-fill metal layer are stacked in this stated order. The metal nitride layer and the metal layer may include at least one metal selected from Ti, Ta, W, Ru, Nb, Mo, and Hf. The gap-fill metal layer may include a W layer or an Al layer. The plurality of gate lines GL may each include a work function metal containing layer. The work function metal containing layer may include at least one metal selected from Ti, W, Ru, Nb, Mo, Hf, Ni, Co, Pt, Yb, Tb, Dy, Er, and Pd. According to some embodiments, the plurality of gate lines GL may each include a stack structure of TiAlC/TiN/W, a stack structure of TiN/TaN/TiAlC/TiN/W, or a stack structure of TiN/TaN/TiN/TiAlC/TiN/W, but inventive concepts are not limited thereto.

An upper surface of each of the plurality of gate structures GS may be covered by a gate insulating capping layer 140. The gate insulating capping layer 140 may include a silicon nitride layer.

A plurality of first insulating spacers 120 may cover both side walls of each of the plurality of gate structures GS. Each of the plurality of first insulating spacers 120 may extend in a line shape in the Y direction, together with the plurality of gate structures GS. A plurality of second insulating spacers 122 may cover both side walls of the second fin separation insulating portion FS2. Each of the plurality of second insulating spacers 122 may extend in a line shape in the Y direction, together with the second fin separation insulating portion FS2. The plurality of first insulating spacers 120 and the plurality of second insulating spacers 122 may include a silicon nitride layer, a SiOCN layer, a SiCN layer, or a combination thereof.

A vertical length (e.g. a length in the Z direction) of the plurality of second insulating spacers 122 may be less than that of the plurality of first insulating spacers 120. A vertical level of an uppermost surface of the plurality of second insulating spacers 122 may be lower than that of an uppermost surface of the plurality of first insulating spacers 120.

In the first device region RX1 and the second device region RX2, there may be a plurality of recesses 124R in the plurality of first and second fin-type active regions F1 and F2. The plurality of recesses 124R may be filled with a plurality of source/drain regions 124. The plurality of source/drain regions 124 may include a semiconductor layer grown epitaxially from a surface of each of the plurality of first and second fin-type active regions F1 and F2 included in inner walls of the plurality of recesses 124R. According to some embodiments, the plurality of source/drain regions 124 may include a plurality of epitaxially grown SiGe layers, an epitaxially grown Si layer, and/or an epitaxially grown SiC layer. According to some embodiments, the plurality of source/drain regions 124 on the first device region RX1 may include an epitaxially grown Si layer or an epitaxially grown SiC layer. According to some embodiments, the plurality of source/drain regions 124 on the second device region RX2 may include a plurality of epitaxially grown SiGe layers.

An inter-gate insulating layer 128 may be in each of between the plurality of gate structures GS and between a gate structure GS and the second fin separation insulating portion FS2. The plurality of source/drain regions 124 may be covered by the inter-gate insulating layer 128. The inter-gate insulating layer 128 may include a portion that contacts an upper surface of the first fin separation insulating portion FS1. The inter-gate insulating layer 128 may include a silicon oxide layer.

An upper insulating capping layer 150 may cover a plurality of gate insulating capping layers 140, the plurality of first insulating spacers 120, the second fin separation insulating portion FS2, and the inter-gate insulating layer 128. The upper insulating capping layer 150 may include a silicon oxide layer, a silicon nitride layer, a polysilicon layer, or a combination thereof. An interlayer insulating layer 170 may be on the upper insulating capping layer 150. The interlayer insulating layer 170 may include a silicon oxide layer, a silicon nitride layer, or a combination thereof.

Although FIGS. 3A through 3D illustrate the first fin separation insulating portion FS1 and the second fin separation insulating portion FS2 each having a flat bottom surface, inventive concepts are not limited thereto. According to some embodiments, a bottom surface of each of the first fin separation insulating portion FS1 and the second fin separation insulating portion FS2 may include a curved surface included in a portion of a circle or a portion of an oval. According to some other embodiments, a bottom surface of each of the first fin separation insulating portion FS1 and the second fin separation insulating portion FS2 may include a non-planar surface having a point sharply protruding toward the substrate 110.

The IC device 100 of FIGS. 2 and 3A through 3D includes the first device region RX1 and the second device region RX2 having different lengths in the width direction (X direction) of the logic cell LC1, and the first maximum length ML1 of the first device region RX1 is less than the second maximum length ML2 of the second device region RX2. The first fin separation insulating portion FS1 may be interposed between the first device region RX1 and the vertical boundary line VL of the cell boundary CB, and the second fin separation insulating portion FS2 extending along the vertical boundary line VL of the cell boundary CB in the second device region RX2.

Because the IC device 100 of FIGS. 2 and 3A through 3D includes the first fin separation insulating portion FS1 and the second fin separation insulating portion FS2 having different structures from each other and located around the cell boundary CB on the first device region RX1 and the second device region RX2 of the logic cell LC1, respectively, carrier mobility may independently improve according to a conductive type of each channel region in the first device region RX1 and the second device region RX2 including channel regions of different conductive types from each other, and an active region area corresponding to the first width W1 of the first fin separation insulating portion FS1 may be further utilized in the second device region RX2 within the logic cell LC1. Thus, while a stable fin separation region may be provided between transistors included in the IC device 100, improved performance may be provided according to a channel type of each of the transistors, and availability of an active region within the logic cell LC1 may be improved.

Figure 4:
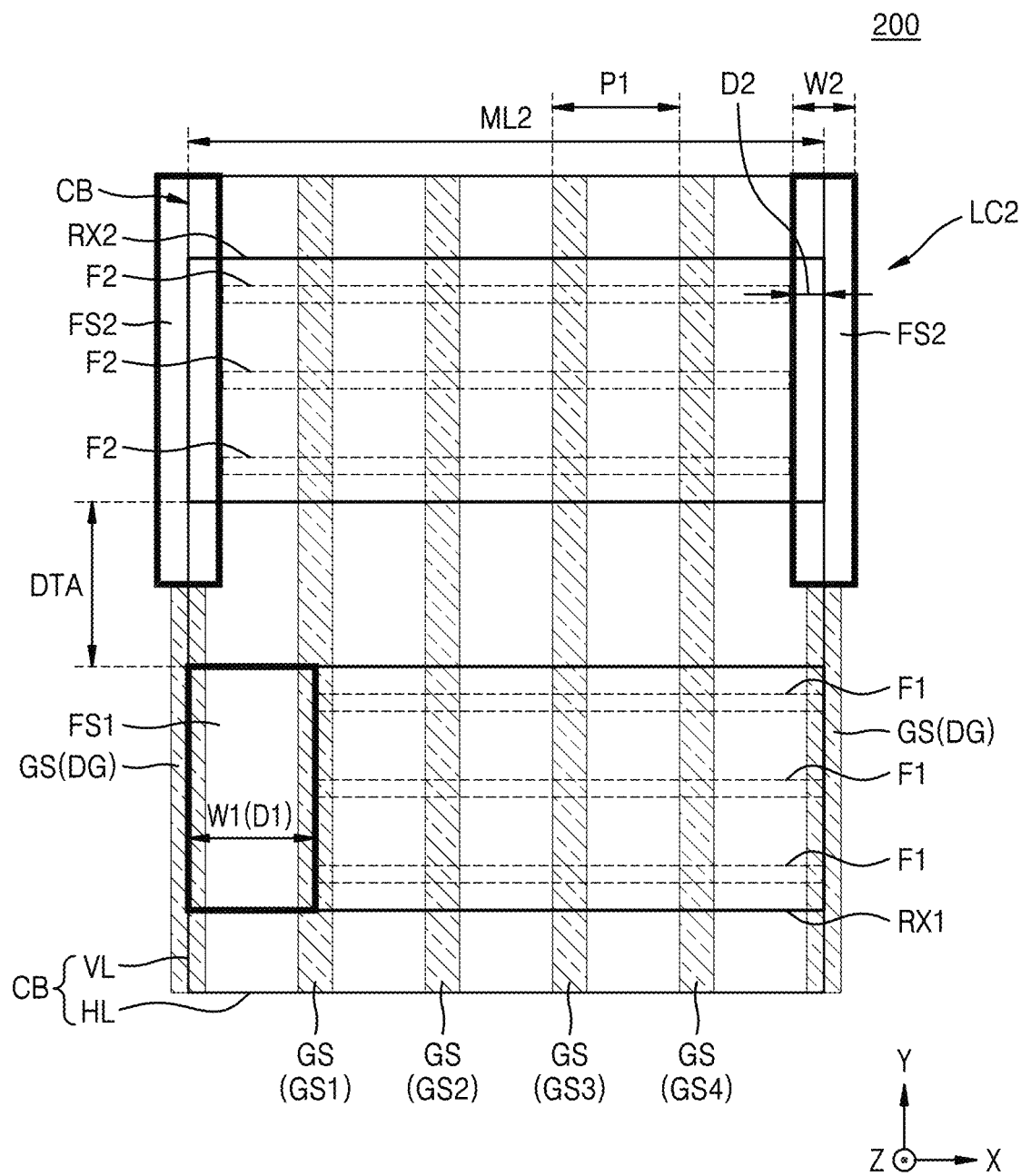
FIG. 4 is a layout diagram for explaining an IC device according to other embodiments of inventive concepts.

FIG. 4 is a layout diagram for explaining an IC device 200 according to other embodiments of inventive concepts. The same reference characters and numerals in FIG. 4 as those in FIGS. 3A through 3D denote the same elements, and thus their description will be omitted herein.

Referring to FIG. 4, the IC device 200 includes a logic cell LC2 having an area defined by the cell boundary CB. The logic cell LC2 may be one of the plurality of logic cells LC that constitute the cell block 12 of FIG. 1. The logic cell LC2 has almost the same configuration as the logic cell LC1 described above with reference to FIGS. 2 and 3A through 3D. However, locations of the first device region RX1 and the first fin separation insulating portion FS1 in the logic cell LC2 are different from those in the logic cell LC1 of FIG. 2. The configuration of the logic cell LC1 of FIG. 2 and that of the logic cell LC2 of FIG. 4 may be symmetrical with each other about one of a pair of vertical boundary lines VL.

Figure 5:
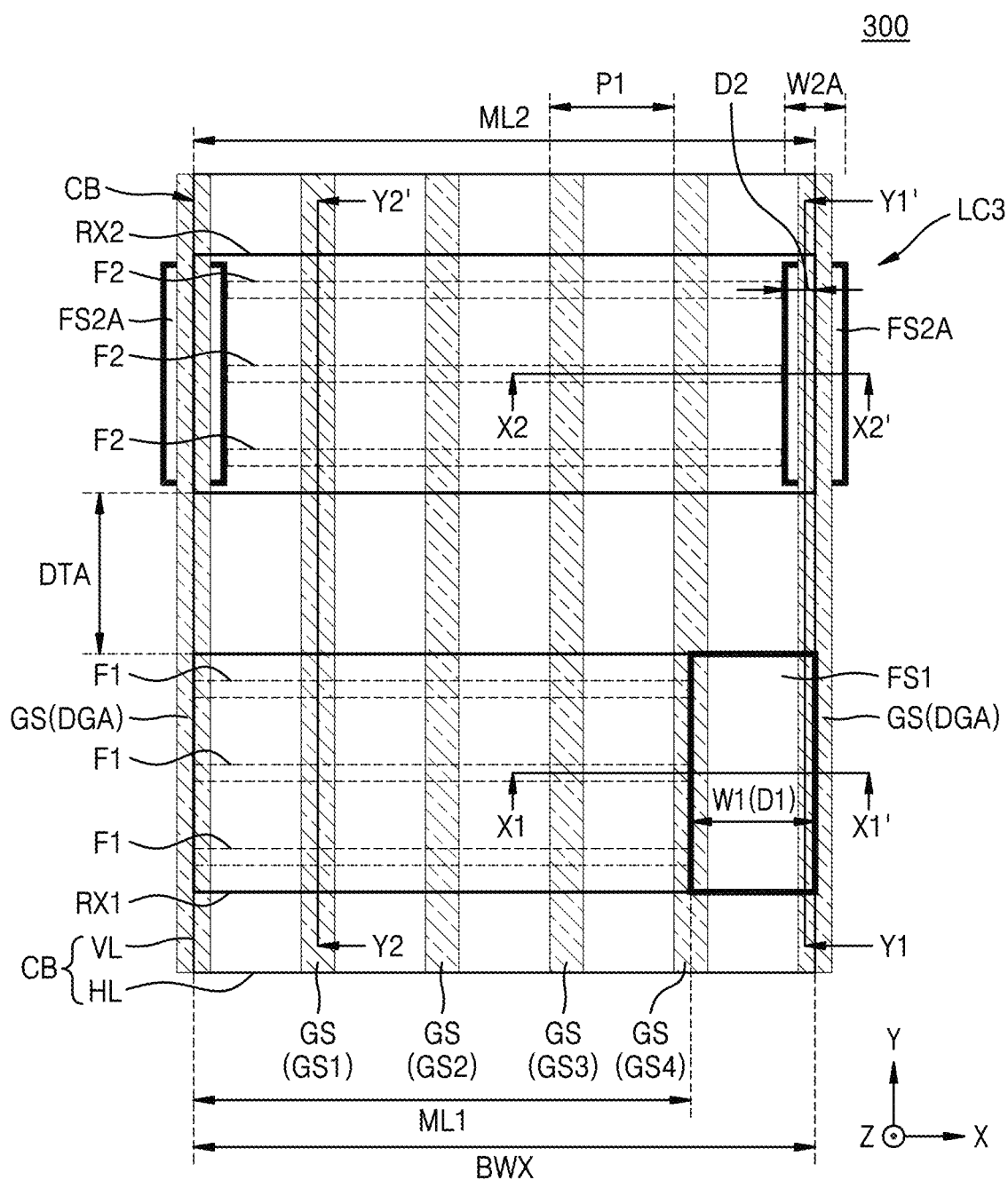
FIG. 5 is a plan layout diagram showing major components of an IC device according to other embodiments of inventive concepts.
Figure 6A:
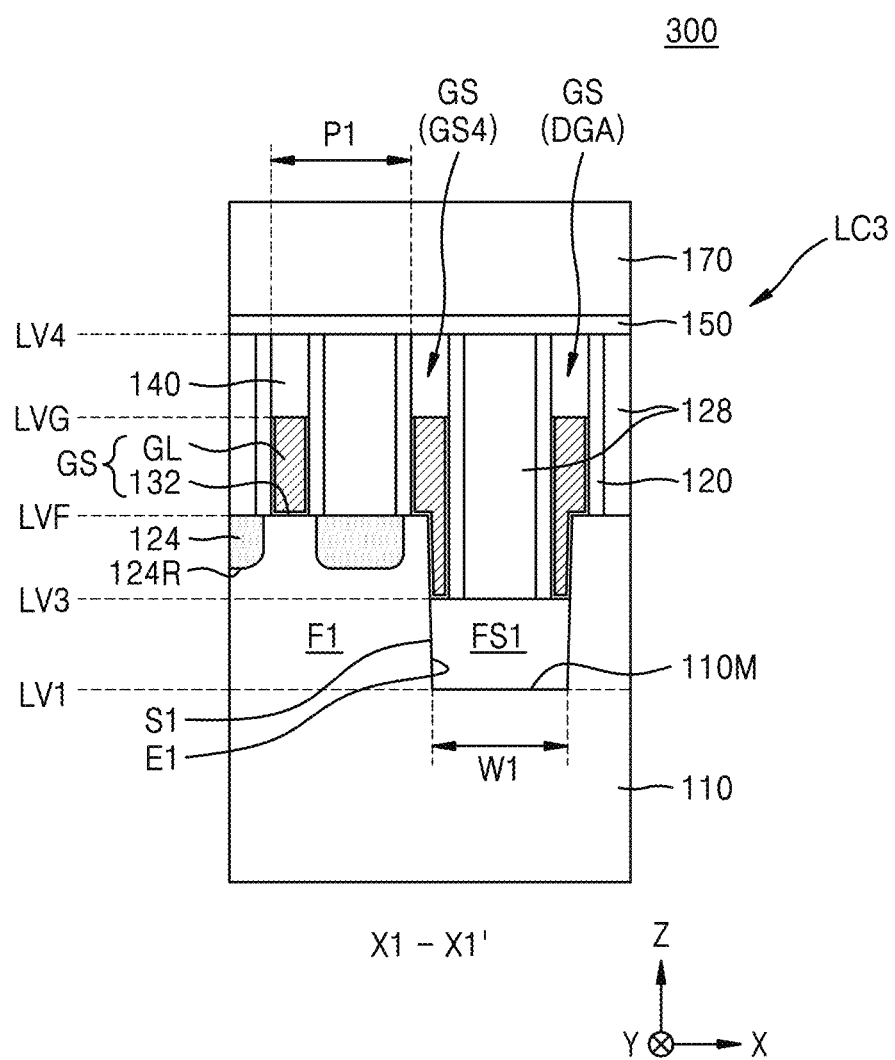
FIG. 6A is a cross-sectional view taken along line X1-X1' of FIG. 5.
Figure 6B:
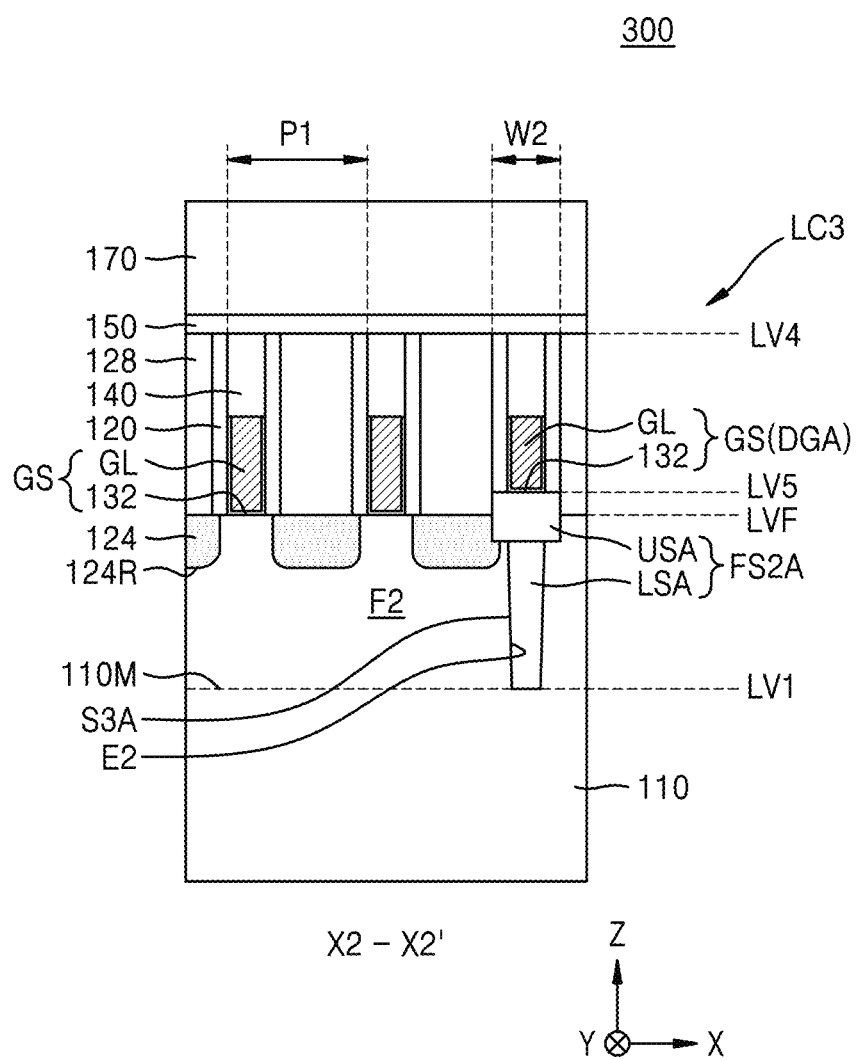
FIG. 6B is a cross-sectional view taken along line X2-X2' of FIG. 5.
Figure 6C:
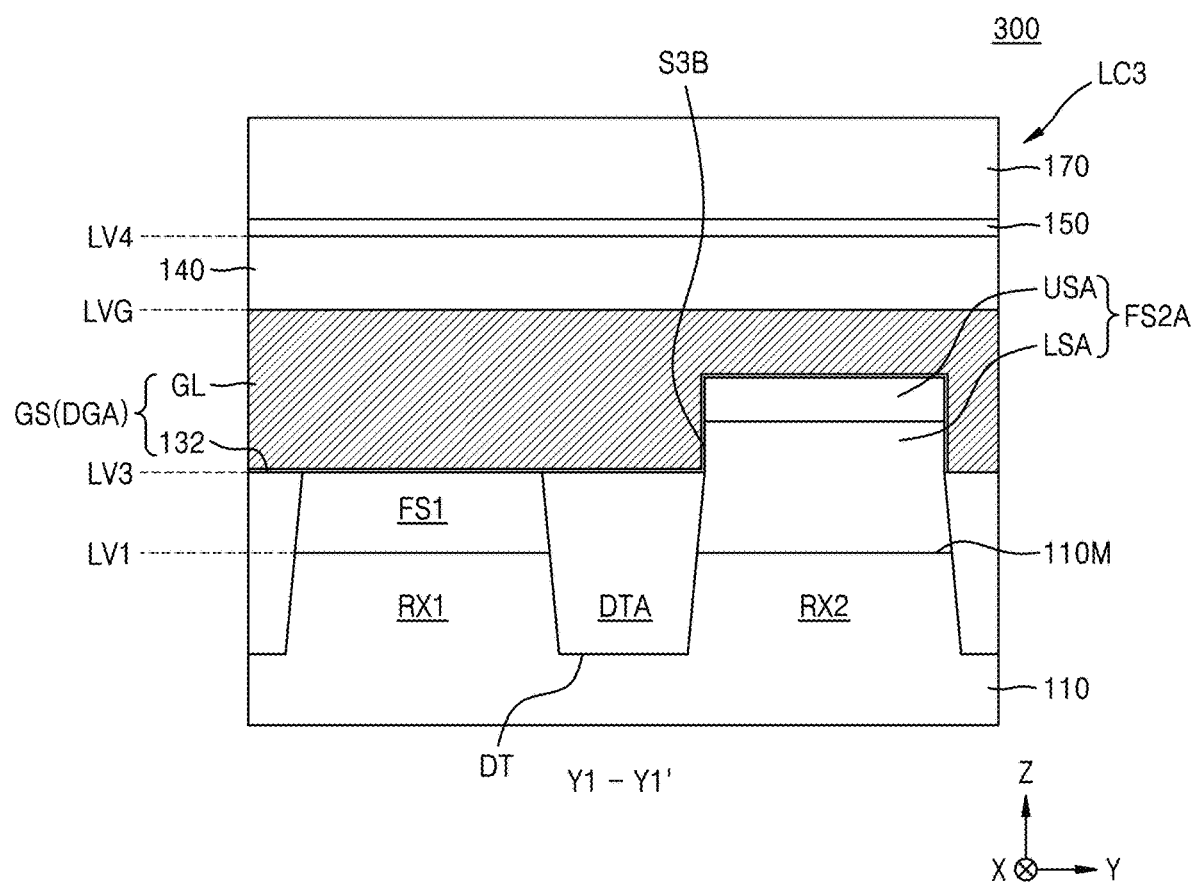
FIG. 6C is a cross-sectional view taken along line Y1-Y1' of FIG. 5.
Figure 6D:
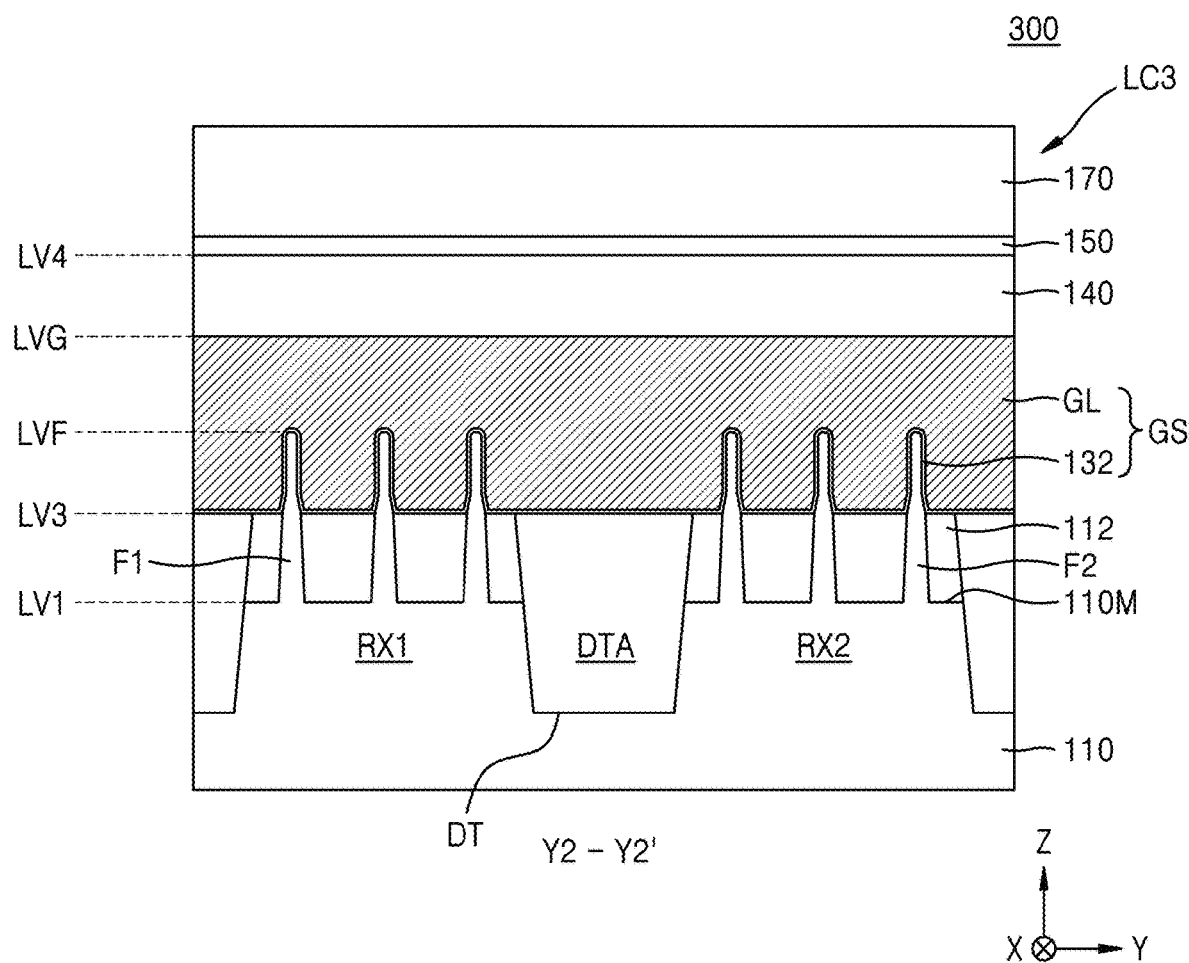
FIG. 6D is a cross-sectional view taken along line Y2-Y2' of FIG. 5.

FIGS. 5 and 6A through 6D are diagrams for explaining an IC device 300 according to other embodiments of inventive concepts. FIG. 5 is a plan layout diagram illustrating major components of the IC device 300, and FIG. 6A is a cross-sectional view taken along a line X1-X1' of FIG. 5, FIG. 6B is a cross-sectional view taken along a line X2-X2' of FIG. 5, FIG. 6C is a cross-sectional view taken along a line Y1-Y1' of FIG. 5, and FIG. 6D is a cross-sectional view taken along a line Y2-Y2' of FIG. 5. The same reference characters and numerals in FIGS. 5 and 6A through 6D as those in FIGS. 2 and 3A through 3D denote the same elements, and thus their description will be omitted herein.

Referring to FIGS. 5 and 6A through 6D, the IC device 300 includes a logic cell LC3 on a substrate 110. The logic cell LC3 has an area defined by a cell boundary CB. The logic cell LC3 may be one of the plurality of logic cells LC that constitute the cell block 12 of FIG. 1. The logic cell LC3 has almost the same configuration as the logic cell LC1 described above with reference to FIGS. 2 and 3A through 3D. However, in the logic cell LC3, a second fin separation insulating portion FS2A extending along the vertical boundary line VL of the cell boundary CB may be disposed in the second device region RX2. The second fin separation insulating portion FS2A may have a second width W2A in a width direction (X direction) of the logic cell LC3, which is less than the first width W1.

The second fin separation insulating portion FS2A may overlap the vertical boundary line VL of the cell boundary CB and extend along the vertical boundary line VL in a height direction (Y direction) of the logic cell LC3. In the width direction (X direction) of the logic cell LC3, the end E2 of each of the plurality of second fin-type active regions F2 may be spaced apart from the vertical boundary line VL of the cell boundary CB by a second distance D2 that is less than the first width W1, with the second fin separation insulating portion FS2A therebetween. The second distance D2 may be less than the second width W2A of the second fin separation insulating portion FS2A.

The second fin separation insulating portion FS2A may extend parallel to the plurality of gate structures GS. The plurality of gate structures GS may include a dummy gate structure DGA overlapping the vertical boundary line VL of the cell boundary CB. In the Y direction, a length of the dummy gate structure DGA may be substantially the same as that of each of the gate structures GS1, GS2, GS3, and GS4 included in the plurality of gate structures GS. The dummy gate structure DGA may include a portion arranged on the first fin separation insulating portion FS1 such as to vertically overlap the first fin separation insulating portion FS1. The dummy gate structure DGA may extend along the vertical boundary line VL to be aligned with the second fin separation insulating portion FS2A in a straight line. A detailed configuration of the dummy gate structure DGA is almost the same as that of the dummy gate structure DG described above with reference to FIGS. 2 and 3A through 3D.

An uppermost surface vertical level LV5 of the second fin separation insulating portion FS2A may be higher than the uppermost surface vertical level LVF of the plurality of first and second fin-type active regions F1 and F2.

The second fin separation insulating portion FS2A may include a lower insulating pattern LSA and an upper insulating pattern USA. The lower insulating pattern LSA may have a first sidewall S3A facing the end E2 of each of the plurality of second fin-type active regions F2, and a second sidewall S3B facing the dummy gate structure DGA. The upper insulating pattern USA may have an upper surface that is on a higher level than that of each of the plurality of first and second fin-type active regions F1 and F2. According to some embodiments, the device isolation layer 112 and the lower insulating pattern LSA may be integrally formed with each other. In the width direction (X direction) of the logic cell LC3, a width of the upper insulating pattern USA may be greater than that of the lower insulating pattern LSA. Although the upper insulating pattern USA has a flat upper surface in FIGS. 6B and 6C, inventive concepts are not limited thereto. According to some embodiments, the upper surface of the upper insulating pattern USA may have a rounded profile that is upwardly convex.

Because the uppermost surface vertical level LV5 of the second fin separation insulating portion FS2A is higher than the uppermost surface vertical level LVF of the second fin-type active regions F2 and an upper surface of the dummy gate structure DGA extends flatly on the uppermost surface vertical level LVG of the plurality of gate structures GS, a portion of the dummy gate structure DGA located on the second fin separation insulating portion FS2A may have a smaller thickness than the other portion of the dummy gate structure DGA.

According to some embodiments, the lower insulating pattern LSA and the upper insulating pattern USA included in the second fin separation insulating portion FS2A may be integrally connected to each other, or may be independently formed from each other but may contact each other. Each of the lower insulating pattern LSA and the upper insulating pattern USA included in the second fin separation insulating portion FS2A may include a single insulating layer or a plurality of insulating layers. For example, each of the upper insulating pattern USA and the lower insulating pattern LSA may include a silicon oxide layer, a silicon nitride layer, a SiOCN layer, a SiCN layer, or a combination thereof.

Although the second fin separation insulating portion FS2A has a flat lower surface in FIGS. 6B and 6C, inventive concepts are not limited thereto. According to some embodiments, the lower surface of the second fin separation insulating portion FS2A may include a curved surface included in a portion of a circle or a portion of an oval. According to some other embodiments, the lower surface of the second fin separation insulating portion FS2A may include a non-planar surface having a point sharply protruding toward the substrate 110.

Because the IC device 300 illustrated in FIGS. 5 and 6A through 6D includes the first fin separation insulating portion FS1 and the second fin separation insulating portion FS2A having different structures from each other and the cell boundary CB in the first device region RX1 and the second device region RX2 of the logic cell LC3, respectively, carrier mobility may independently improve according to a conductive type of each channel region in the first device region RX1 and the second device region RX2 including channel regions of different conductive types from each other, and an active region area corresponding to the first width W1 of the first fin separation insulating portion FS1 may be further utilized in the second device region RX2 within the logic cell LC3. Thus, while a stable fin separation region may be provided between transistors included in the IC device 300, improved performance may be provided according to a channel type of each of the transistors, and availability of an active region within the logic cell LC3 may be improved.

Figure 7A:
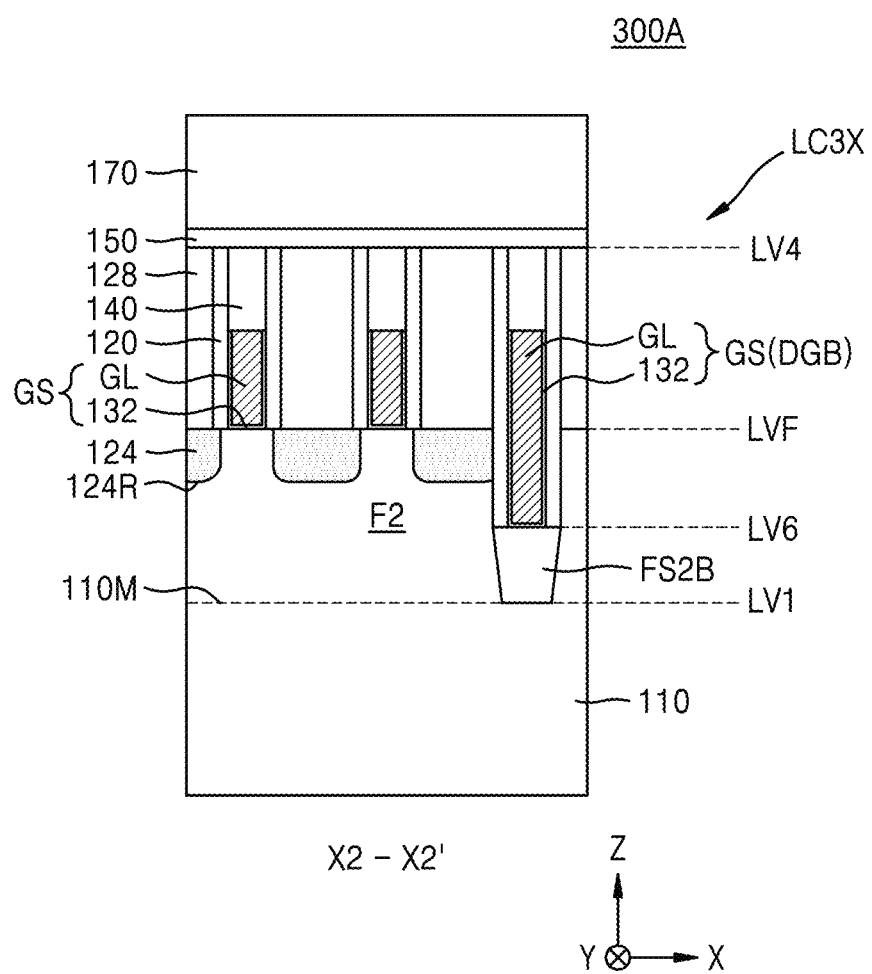
FIGS. 7A and 7B are cross-sectional views for explaining an IC device according to other embodiments of inventive concepts.
Figure 7B:
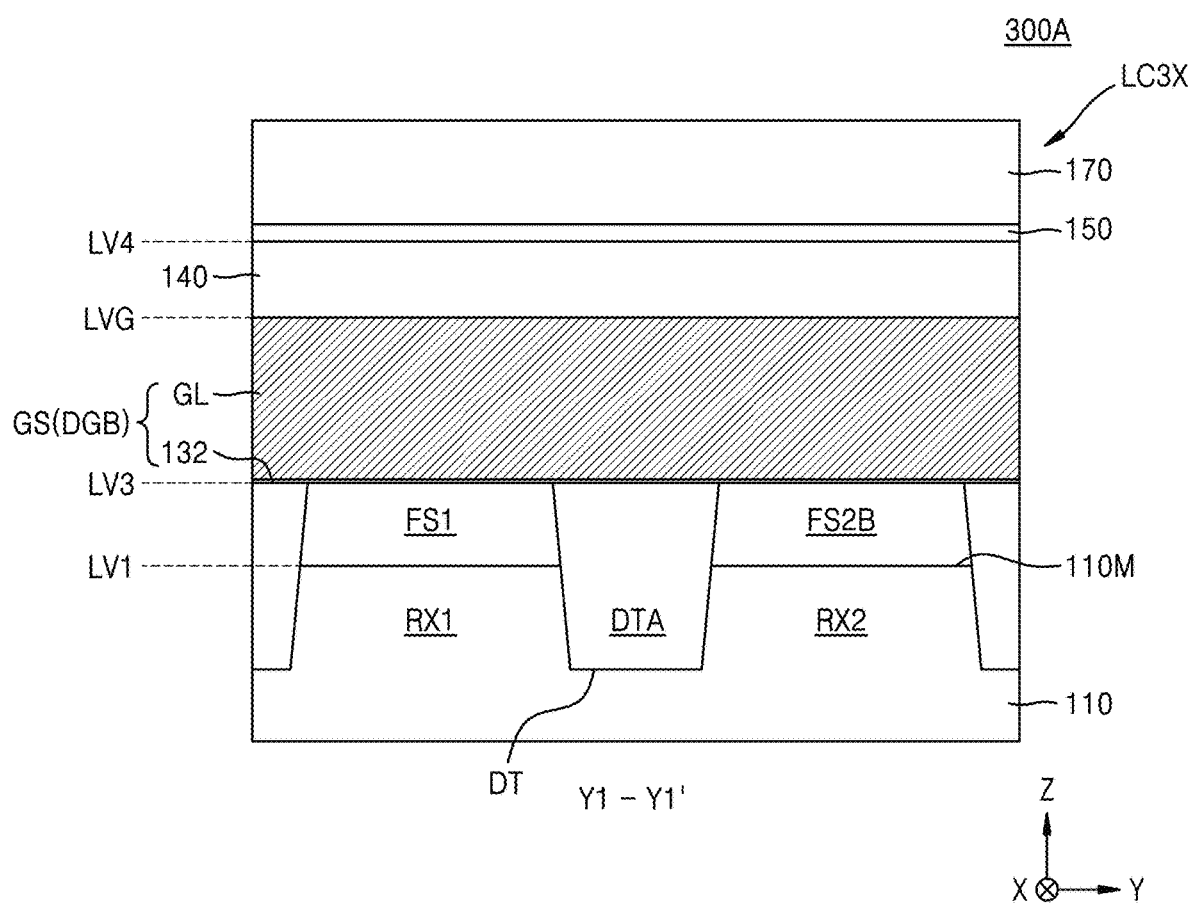

FIGS. 7A and 7B are cross-sectional views for explaining an IC device 300A according to other embodiments of inventive concepts. The IC device 300A of FIGS. 7A and 7B may have the planar layout illustrated in FIG. 5. FIG. 7A illustrates a cross-sectional structure corresponding to a cross-section taken along a line X2-X2' of FIG. 5, and FIG. 7B illustrates a cross-sectional structure corresponding to a cross-section taken along a line Y1-Y1' of FIG. 5. The same reference characters and numerals in FIGS. 7A and 7B as those in FIGS. 2 through 6D denote the same elements, and thus their description will be omitted herein.

Referring to FIGS. 7A and 7B, the IC device 300A includes a logic cell LC3X. The logic cell LC3X may be one of the plurality of logic cells LC that constitute the cell block 12 of FIG. 1. The logic cell LC3X has almost the same configuration as the logic cell LC3 described above with reference to FIGS. 6A through 6D. However, the logic cell LC3X includes a second fin separation insulating portion FS2B instead of the second fin separation insulating portion FS2A. The second fin separation insulating portion FS2B extends along the vertical boundary line VL of the cell boundary CB in the second device region RX2. The second fin separation insulating portion FS2B has almost the same configuration as the second fin separation insulating portion FS2A described above with reference to FIGS. 6A through 6D. However, an uppermost surface vertical level LV6 of the second fin separation insulating portion FS2B is lower than the uppermost surface vertical level LVF of the plurality of first and second fin-type active regions F1 and F2. According to some embodiments, the uppermost surface vertical level LV6 of the second fin separation insulating portion FS2B may be the same as or similar to the uppermost surface vertical level LV3 of the first fin separation insulating portion FS1. The second fin separation insulating portion FS2B may include a silicon oxide layer, a silicon nitride layer, a SiOCN layer, a SiCN layer, or a combination thereof.

The plurality of gate structures GS may include a dummy gate structure DGB overlapping the vertical boundary line VL of the cell boundary CB. The dummy gate structure DGB may include a portion arranged on the first fin separation insulating portion FS1 such as to vertically overlap the first fin separation insulating portion FS1, and a portion arranged on the second fin separation insulating portion FS2B such as to vertically overlap the second fin separation insulating portion FS2B. A vertical-direction (Z direction) height of the portion of the dummy gate structure DGB arranged on the first fin separation insulating portion FS1 may be substantially equal to that of the portion of the dummy gate structure DGB arranged on the second fin separation insulating portion FS2B. A detailed configuration of the dummy gate structure DGB is almost the same as that of the dummy gate structure DG described above with reference to FIGS. 2 and 3A through 3D.

Figure 8:
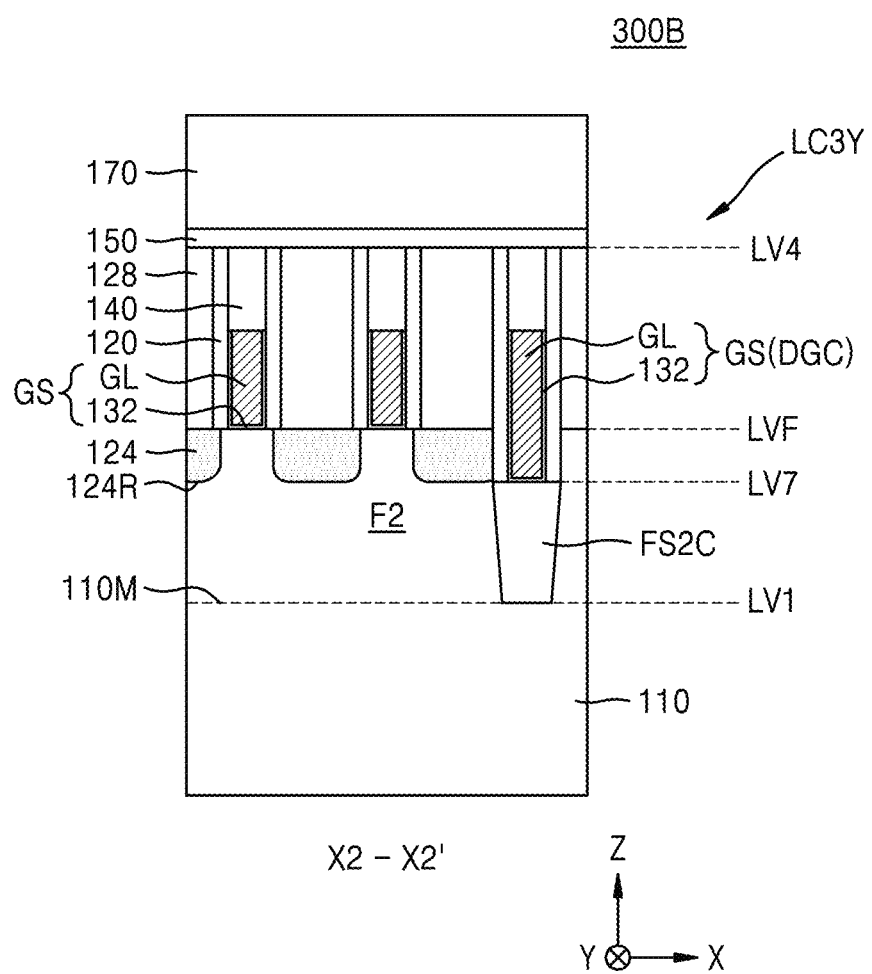
FIG. 8 is a cross-sectional view for explaining an IC device according to other embodiments of inventive concepts.

FIG. 8 is a cross-sectional view for explaining an IC device 300B according to other embodiments of inventive concepts. The IC device 300B of FIG. 8 may have the planar layout illustrated in FIG. 5. FIG. 8 illustrates a cross-sectional structure corresponding to a cross-section taken along the line X2-X2' of FIG. 5. The same reference characters and numerals in FIG. 8 as those in FIGS. 2 through 7B denote the same elements, and thus their description will be omitted herein.

Referring to FIG. 8, the IC device 300B includes a logic cell LC3Y. The logic cell LC3Y may be one of the plurality of logic cells LC that constitute the cell block 12 of FIG. 1. The logic cell LC3Y has almost the same configuration as the logic cell LC3 described above with reference to FIGS. 6A through 6D. However, the logic cell LC3Y includes a second fin separation insulating portion FS2C instead of the second fin separation insulating portion FS2A. The second fin separation insulating portion FS2C extends along the vertical boundary line VL of the cell boundary CB in the second device region RX2. The second fin separation insulating portion FS2C has almost the same configuration as the second fin separation insulating portion FS2A described above with reference to FIGS. 6A through 6D. However, an uppermost surface vertical level LV7 of the second fin separation insulating portion FS2C is lower than the uppermost surface vertical level LVF of the plurality of first and second fin-type active regions F1 and F2 and is higher than the uppermost surface vertical level LV3 (see FIG. 6A) of the first fin separation insulating portion FS1. The second fin separation insulating portion FS2C may include a silicon oxide layer, a silicon nitride layer, a SiOCN layer, a SiCN layer, or a combination thereof.

The plurality of gate structures GS may include a dummy gate structure DGC overlapping the vertical boundary line VL of the cell boundary CB. The dummy gate structure DGC may include a portion arranged on the first fin separation insulating portion FS1 such as to vertically overlap the first fin separation insulating portion FS1, and a portion arranged on the second fin separation insulating portion FS2C such as to vertically overlap the second fin separation insulating portion FS2C. A vertical-direction (Z direction) height of the portion of the dummy gate structure DGC arranged on the second fin separation insulating portion FS2C may be less than that of the portion of the dummy gate structure DGC arranged on the first fin separation insulating portion FS1. A detailed configuration of the dummy gate structure DGC is almost the same as that of the dummy gate structure DG described above with reference to FIGS. 2 and 3A through 3D.

Because the IC devices 300A and 300B illustrated in FIGS. 7A and 7B and FIG. 8 respectively include the first fin separation insulating portions FS1 and the second fin separation insulating portions FS2B and FS2C having different structures from each other around the cell boundary CB in the first device region RX1 and the second device region RX2 of the logic cells LC3X and LC3Y, respectively, carrier mobility may independently improve according to a conductive type of each channel region in the first device region RX1 and the second device region RX2 including channel regions of different conductive types from each other, and an active region area corresponding to the first width W1 of the first fin separation insulating portion FS1 may be further utilized in the second device region RX2 of each of the logic cells LC3X and LC3Y. Thus, while a stable fin separation region may be provided between transistors included in each of the IC devices 300A and 300B, improved performance may be provided according to a channel type of each of the transistors, and availability of an active region within each of the logic cells LC3X and LC3Y may be improved.

Figure 9:
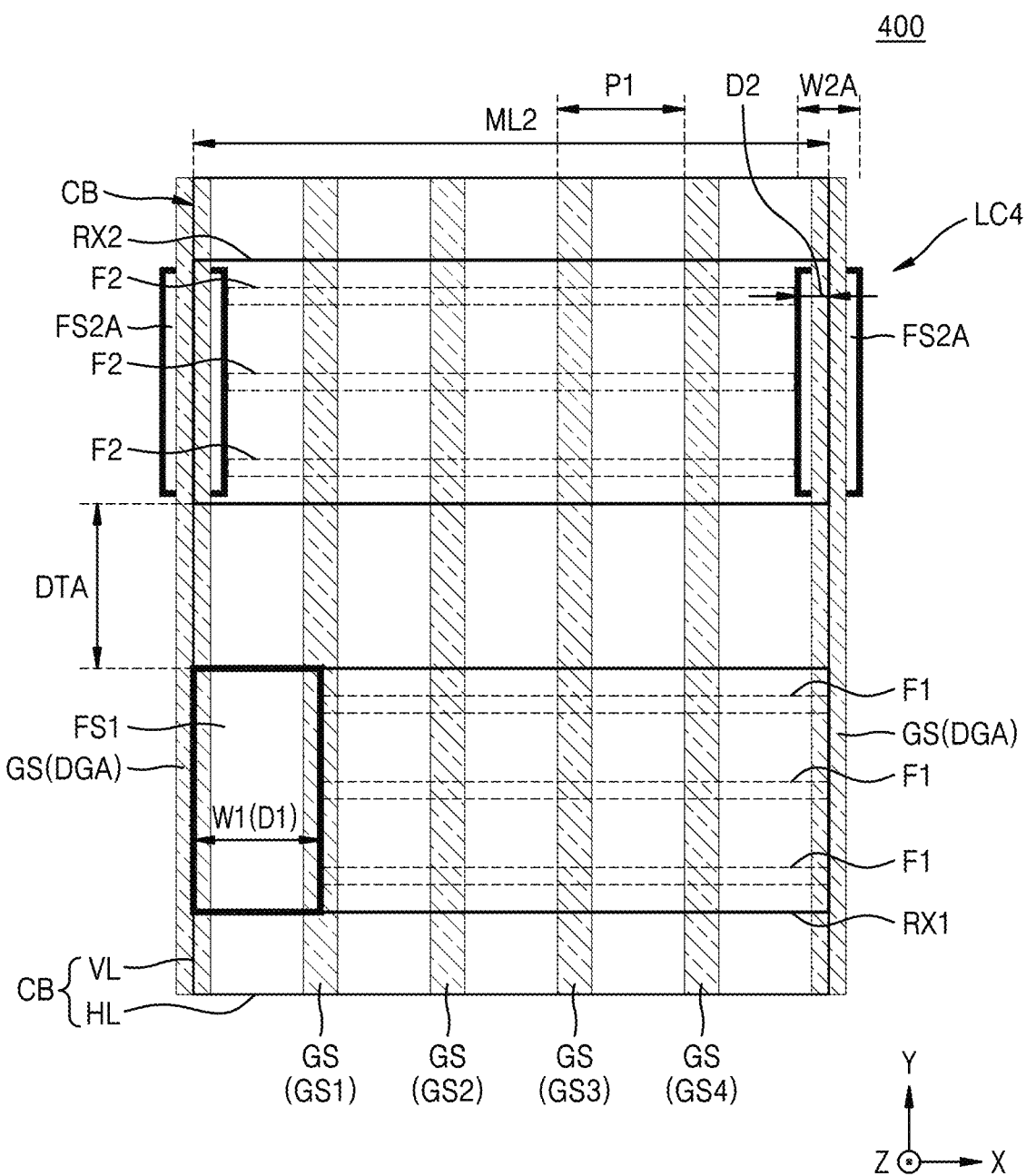
FIG. 9 is a layout diagram for explaining an IC device according to other embodiments of inventive concepts.

FIG. 9 is a layout diagram for explaining an IC device 400 according to other embodiments of inventive concepts. The same reference characters and numerals in FIG. 9 as those in FIGS. 5 and 6A through 6D denote the same elements, and thus their description will be omitted herein.

Referring to FIG. 9, the IC device 400 includes a logic cell LC4 having an area defined by the cell boundary CB. The logic cell LC4 may be one of the plurality of logic cells LC that constitute the cell block 12 of FIG. 1. The logic cell LC4 has almost the same configuration as the logic cell LC3 described above with reference to FIGS. 5 and 6A through 6D. However, locations of a first device region RX1 and a first fin separation insulating portion FS1 in the logic cell LC4 are different from those in the logic cell LC3 of FIG. 5. The configuration of the logic cell LC3 of FIG. 5 and that of the logic cell LC4 of FIG. 9 may be symmetrical with each other about one of a pair of vertical boundary lines VL.

Figure 10A:
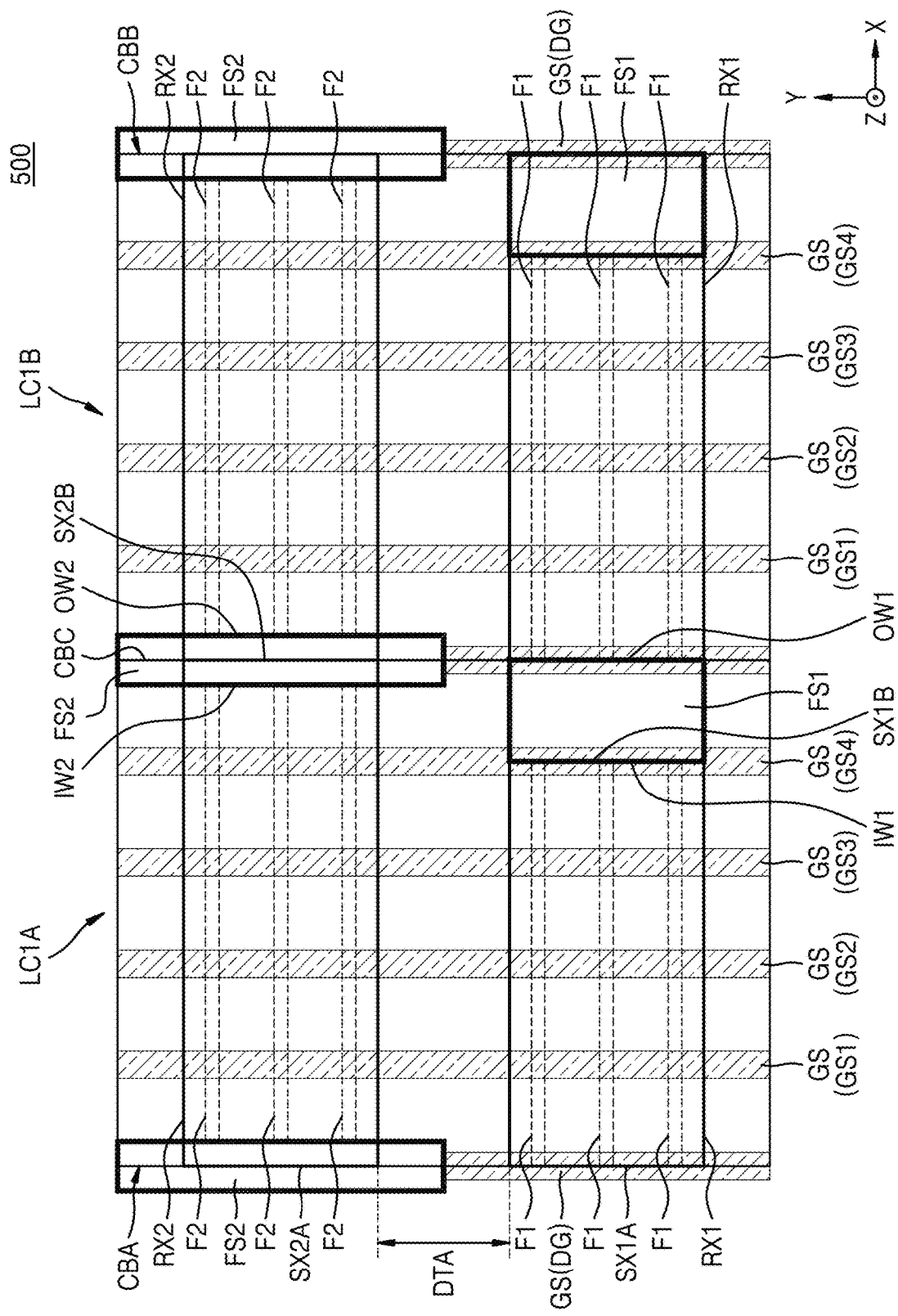
FIG. 10A is a planar layout diagram for explaining an IC device according to other embodiments of inventive concepts.

FIG. 10A is a planar layout diagram for explaining an IC device 500 according to other embodiments of inventive concepts. The same reference characters and numerals in FIG. 10A as those in FIGS. 1 through 3D denote the same elements, and thus their description will be omitted herein.

Referring to FIG. 10A, the IC device 500 includes a first logic cell LC1A and a second logic cell LC1B arranged adjacent to each other in the width direction (X direction) with a cell boundary contact portion CBC therebetween. The IC device 500 may constitute the logic cell block 12 of FIG. 1.

A first cell boundary CBA defining the area of the first logic cell LC1A and a second cell boundary CBB defining the area of the second logic cell LC1B may meet each other at the cell boundary contact portion CBC and may share the cell boundary contact portion CBC. Each of the first logic cell LC1A and the second logic cell LC1B may have substantially the same configuration as the logic cell LC1 described above with reference to FIGS. 2 and 3A through 3D.

The first fin separation insulating portion FS1 located within the first logic cell LC 1A may have a first inner sidewall IW1 facing the plurality of first fin-type active regions F1 formed in the first device region RX1 of the first logic cell LC1A, and a first outer sidewall OW1 aligned with the cell boundary contact portion CBC. The second fin separation insulating portion FS2 may overlap the cell boundary contact portion CBC and may extend in the Y direction along the cell boundary contact portion CBC. The second fin separation insulating portion FS2 may have a second inner sidewall IW2 facing the plurality of second fin-type active regions F2 formed in the second device region RX2 of the first logic cell LC1A, and a second outer sidewall OW2 located within the second logic cell LC1B.

Within the first logic cell LC1A, the first device region RX1 may include a first lateral side SX1A and a second lateral side SX1B opposite to each other in the width direction (X direction). The first lateral side SX1A of the first device region RX1 is aligned with the first cell boundary CBA, and the second lateral side SX1B of the first device region RX1 is apart from the first cell boundary CBA with the first fin separation insulating portion FS1 therebetween. Within the first logic cell LC1A, the second device region RX2 may include a first lateral side SX2A and a second lateral side SX2B opposite to each other in the width direction (X direction). Each of the first lateral side SX2A and the second lateral side SX2B of the second device region RX2 may be aligned with the first cell boundary CBA.

The second logic cell LC1B is adjacent to the first logic cell LC1A with the cell boundary contact portion CBC therebetween in the width direction (X direction), and has almost the same configuration as the first logic cell LC1A. The first device region RX1 and the second device region RX2 of the second logic cell LC1B may be referred to as a neighboring first device region RX1 and a neighboring second device region RX2. One of a pair of opposite lateral sides of the neighboring first device region RX1 in the width direction (X direction) is aligned with the cell boundary contact portion CBC, and the other lateral side is apart from the second cell boundary CBB.

The first device region RX1 of the first logic cell LC1A and the first device region RX1 of the second logic cell LC1B are aligned in a straight line in the X direction, and are apart from each other with the first fin separation insulating portion FS1 therebetween. The second device region RX2 of the first logic cell LC1A and the neighboring second device region RX2 of the second logic cell LC1B are aligned in a straight line in the X direction and adjoin each other.

Figure 10B:
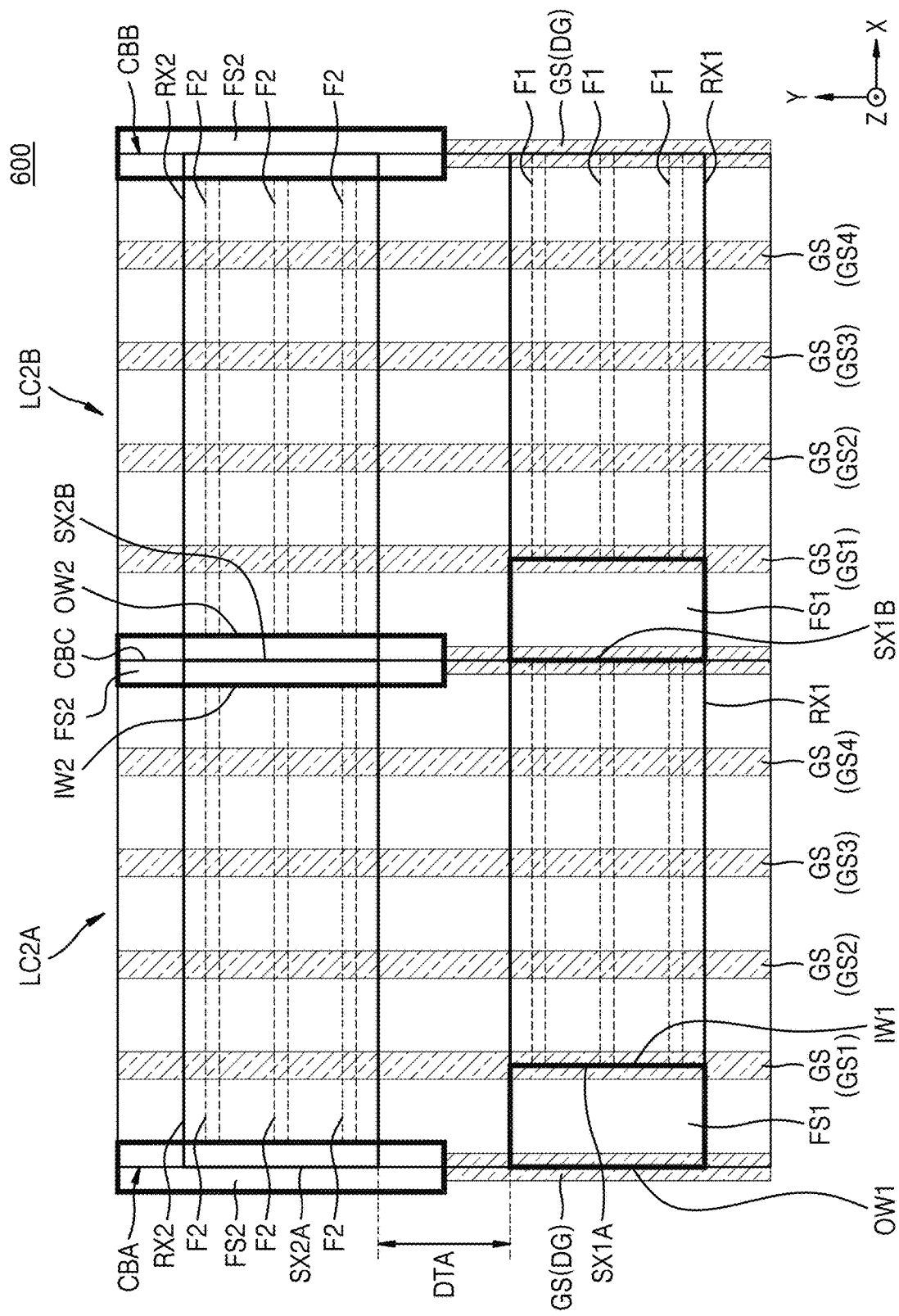
FIG. 10B is a planar layout diagram for explaining an IC device according to other embodiments of inventive concepts.

FIG. 10B is a planar layout diagram for explaining an IC device 600 according to other embodiments of inventive concepts. The same reference characters and numerals in FIG. 10B as those in FIGS. 1 through 10A denote the same elements, and thus their description will be omitted herein.

Referring to FIG. 10B, the IC device 600 includes a first logic cell LC2A and a second logic cell LC2B arranged adjacent to each other in the width direction (X direction) with a cell boundary contact portion CBC therebetween. The IC device 600 may constitute the logic cell block 12 of FIG. 1.

Each of the first logic cell LC2A and the second logic cell LC2B may have substantially the same configuration as the logic cell LC2 described above with reference to FIG. 4, and the IC device 600 may have substantially the same configuration as the IC device 500 of FIG. 10A. However, in the IC device 600, a first lateral side SX1A of the first device region RX1 located in the first logic cell LC2A may face the first fin separation insulating portion FS1, and a second lateral side SX1B of the first device region RX1 may be aligned with the cell boundary contact portion CBC. The first fin separation insulating portion FS1 may have a first inner sidewall IW1 facing the plurality of first fin-type active regions F1 formed in the first device region RX1 of the first logic cell LC1A, and a first outer sidewall OW1 aligned with a first cell boundary CBA. The first lateral side SX1A of the first device region RX1 may be apart from the first cell boundary CBA with the first fin separation insulating portion FS1 therebetween.

The second logic cell LC2B is adjacent to the first logic cell LC2A with the cell boundary contact portion CBC therebetween in the width direction (X direction), and has almost the same configuration as the first logic cell LC2A. The first device region RX1 and the second device region RX2 of the second logic cell LC2B may be referred to as a neighboring first device region RX1 and a neighboring second device region RX2.

One of a pair of opposite lateral sides of the first fin separation insulating portion FS1 in the width direction (X direction) of the second logic cell LC2B may be aligned with the cell boundary contact portion CBC, and the other lateral side may adjoin the neighboring first device region RX1. One of a pair of opposite lateral sides of the neighboring first device region RX1 in the width direction (X direction) of the second logic cell LC2B is apart from the cell boundary contact portion CBC with the first fin separation insulating portion FS1 therebetween, and the other lateral side is aligned with the second cell boundary CBB.

Figure 11A:
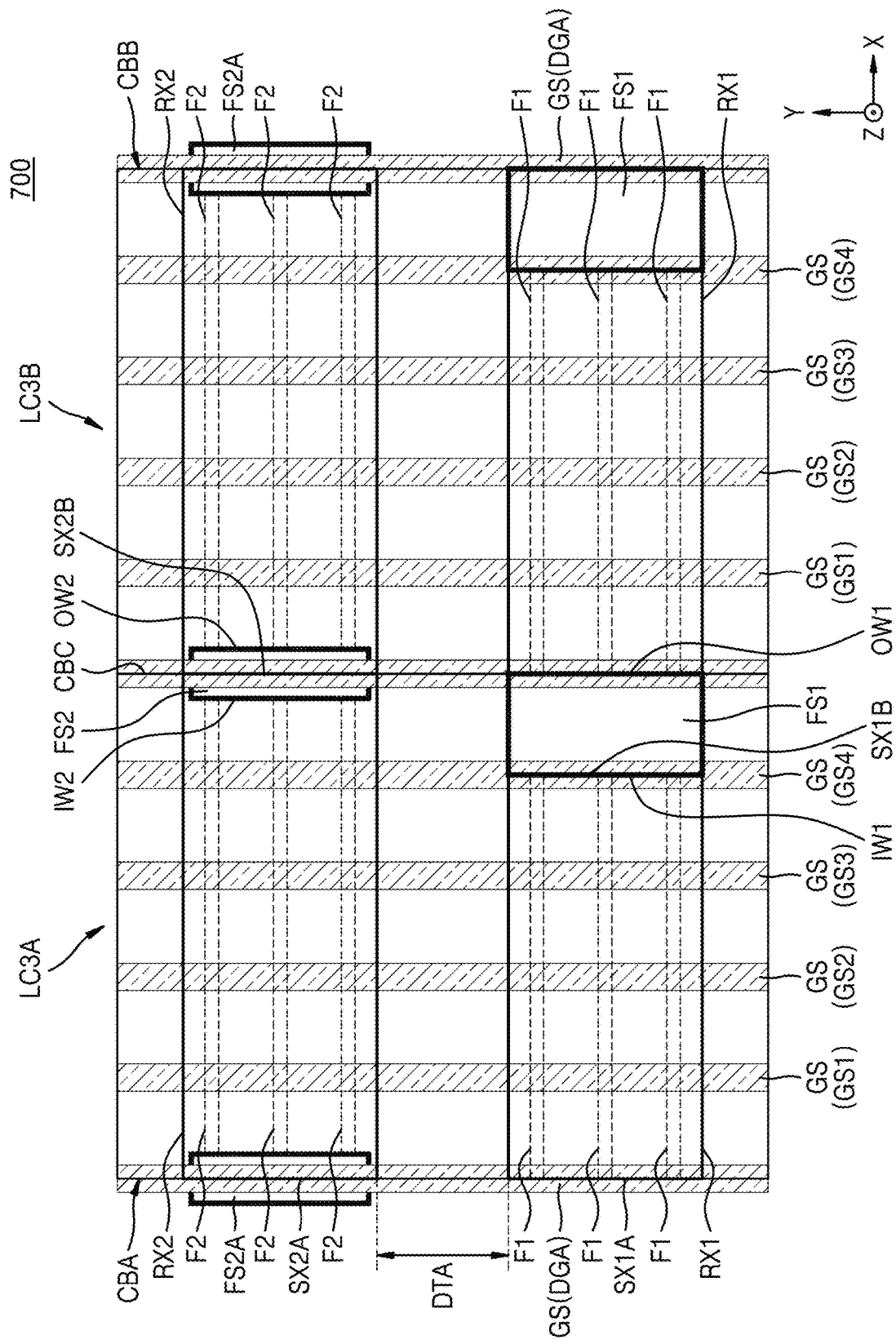
FIG. 11A is a planar layout diagram for explaining an IC device according to other embodiments of inventive concepts.

FIG. 11A is a planar layout diagram for explaining an IC device 700 according to other embodiments of inventive concepts. The same reference characters and numerals in FIG. 11A as those in FIGS. 1 through 10B denote the same elements, and thus their description will be omitted herein.

Referring to FIG. 11A, the IC device 700 includes a first logic cell LC3A and a second logic cell LC3B arranged adjacent to each other in the width direction (X direction) with a cell boundary contact portion CBC therebetween. The IC device 700 may constitute the logic cell block 12 of FIG. 1.

A first cell boundary CBA defining the area of the first logic cell LC3A and a second cell boundary CBB defining the area of the second logic cell LC3B may meet each other at the cell boundary contact portion CBC and may share the cell boundary contact portion CBC. Each of the first logic cell LC3A and the second logic cell LC3B may have substantially the same configuration as the logic cell LC3 described above with reference to FIGS. 5 and 6A through 6D.

The first fin separation insulating portion FS1 located within the first logic cell LC3A may have a first inner sidewall IW1 facing the plurality of first fin-type active regions F1 formed in the first device region RX1 of the first logic cell LC3A, and a first outer sidewall OW1 aligned with the cell boundary contact portion CBC. The second fin separation insulating portion FS2 may overlap the cell boundary contact portion CBC and may extend in the Y direction along the cell boundary contact portion CBC. The second fin separation insulating portion FS2 may have a second inner sidewall IW2 facing the plurality of second fin-type active regions F2 formed in the second device region RX2 of the first logic cell LC3A, and a second outer sidewall OW2 located within the second logic cell LC3B.

In the first logic cell LC3A, the first lateral side SX1A of the first device region RX1 is aligned with the first cell boundary CBA, and the second lateral side SX1B of the first device region RX1 is apart from the first cell boundary CBA with the first fin separation insulating portion FS1 therebetween. In the first logic cell LC3A, each of the first lateral side SX2A and the second lateral side SX2B of the second device region RX2 may be aligned with the first cell boundary CBA.

The second logic cell LC3B is adjacent to the first logic cell LC3A with the cell boundary contact portion CBC therebetween in the width direction (X direction), and has almost the same configuration as the first logic cell LC3A. The first device region RX1 and the second device region RX2 of the second logic cell LC3B may be referred to as a neighboring first device region RX1 and a neighboring second device region RX2. One of a pair of opposite lateral sides of the neighboring first device region RX1 in the width direction (X direction) is aligned with the cell boundary contact portion CBC, and the other lateral side is apart from the second cell boundary CBB.

Figure 11B:
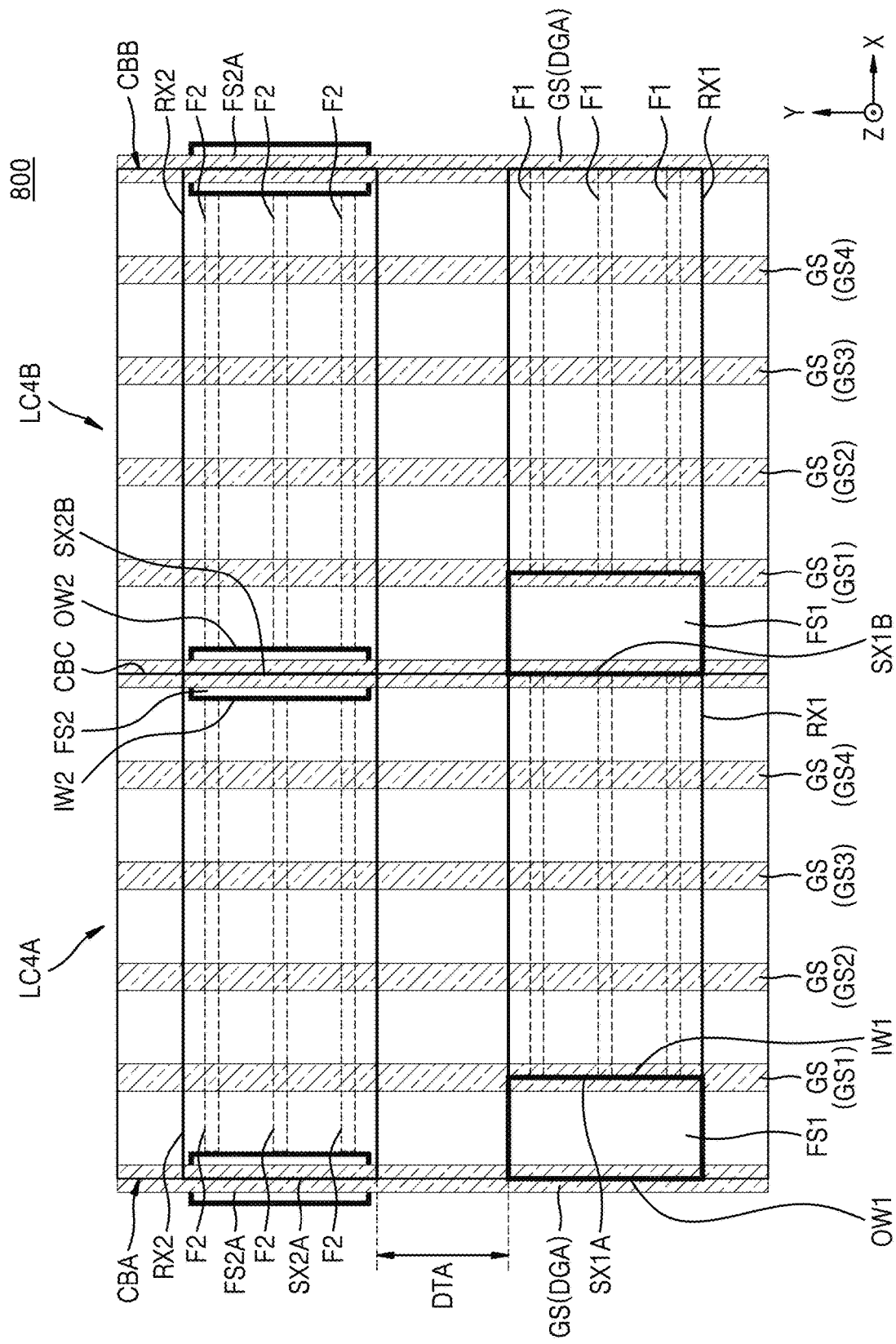
FIG. 11B is a planar layout diagram for explaining an IC device according to other embodiments of inventive concepts.
Figure 12A:
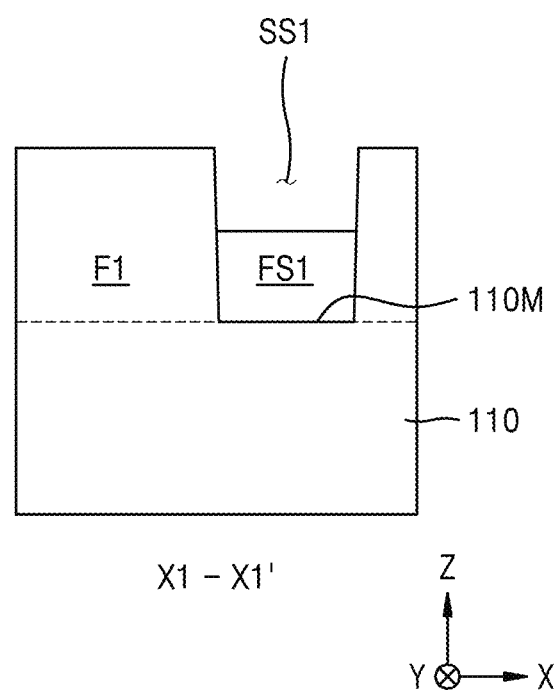
FIGS. 12A through 19D are cross-sectional views for explaining a method of manufacturing an IC device, according to embodiments of inventive concepts, wherein FIGS. 12A, 13A, . . . , and 19A are cross-sectional structures according to a process sequence of a portion corresponding to a cross-section taken along line X1-X1' of FIG. 2, FIGS. 12B, 13B, . . . , and 19B are cross-sectional structures according to a process sequence of a portion corresponding to a cross-section taken along line X2-X2' of FIG. 2, FIGS. 12C, 13C, . . . , and 19C are cross-sectional structures according to a process sequence of a portion corresponding to a cross-section taken along line Y1-Y1' of FIG. 2, and FIGS. 12D, 13D, . . . , and 19D are cross-sectional structures according to a process sequence of a portion corresponding to a cross-section taken along line Y2-Y2' of FIG. 2.
Figure 12B:
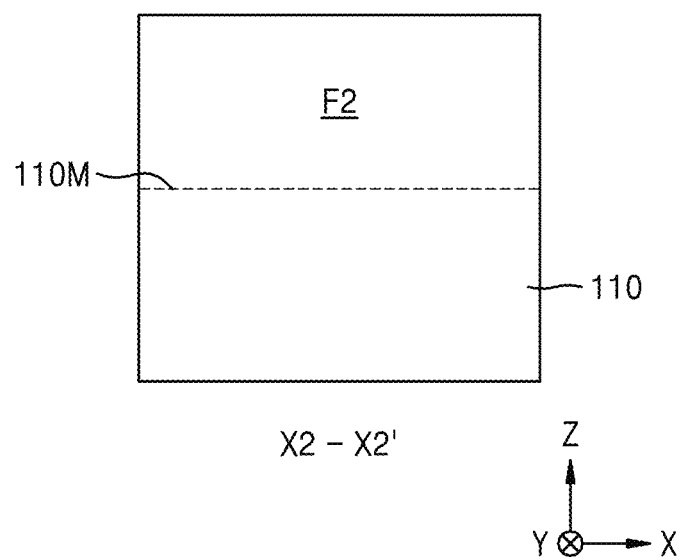
Figure 12C:
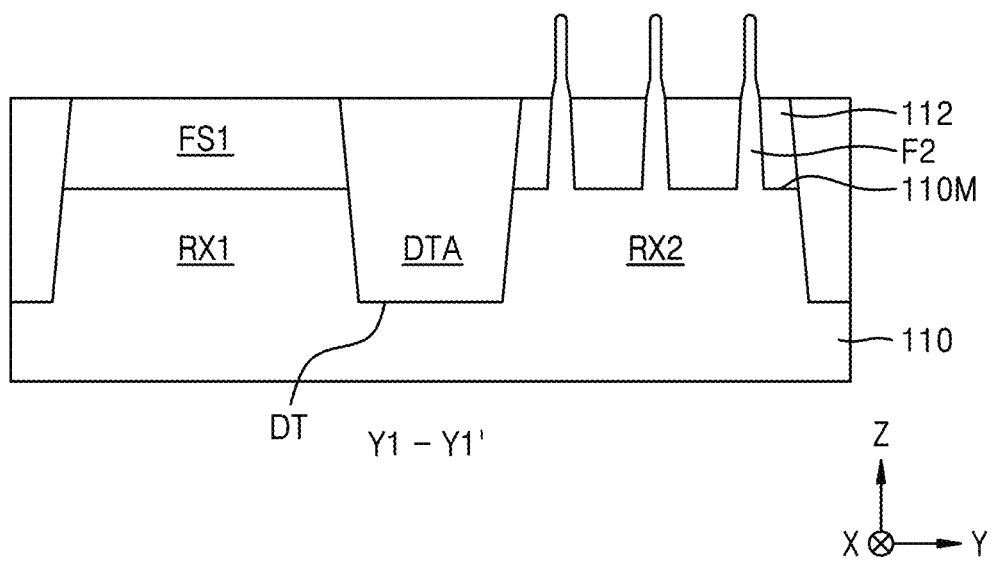
Figure 12D:
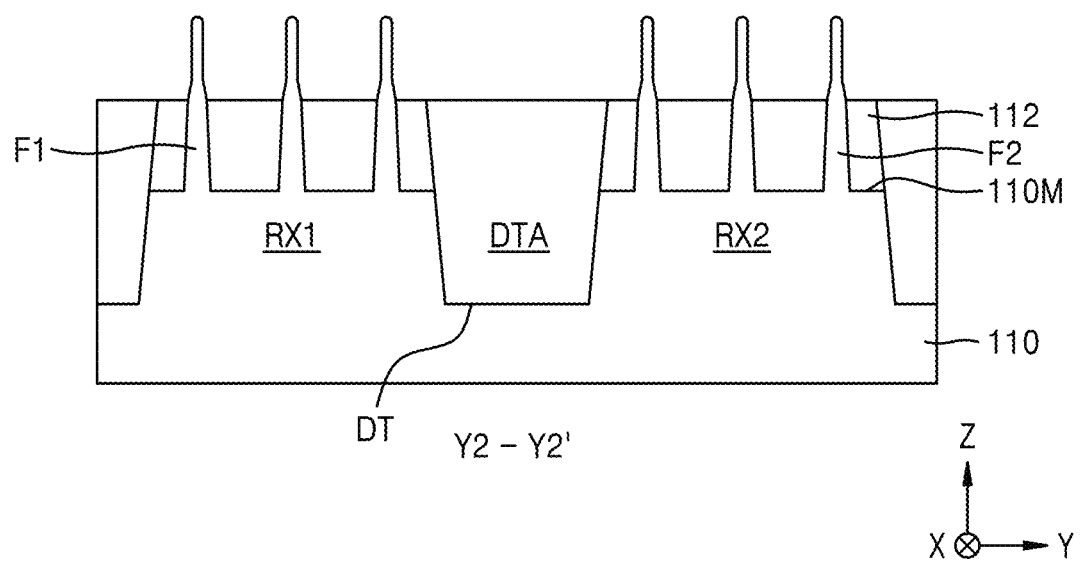
Figure 13A:
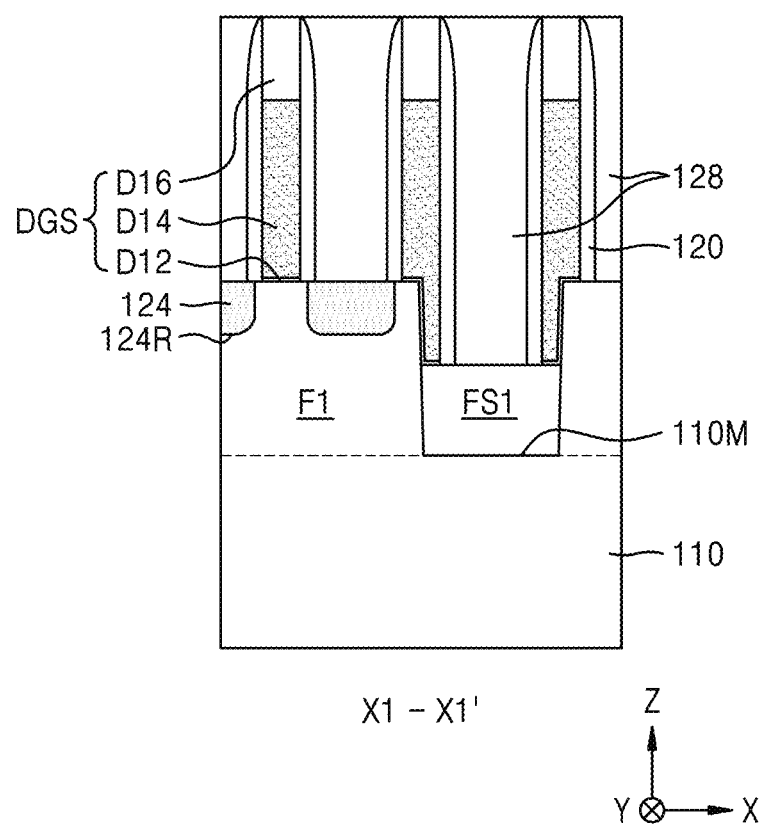
Figure 13B:
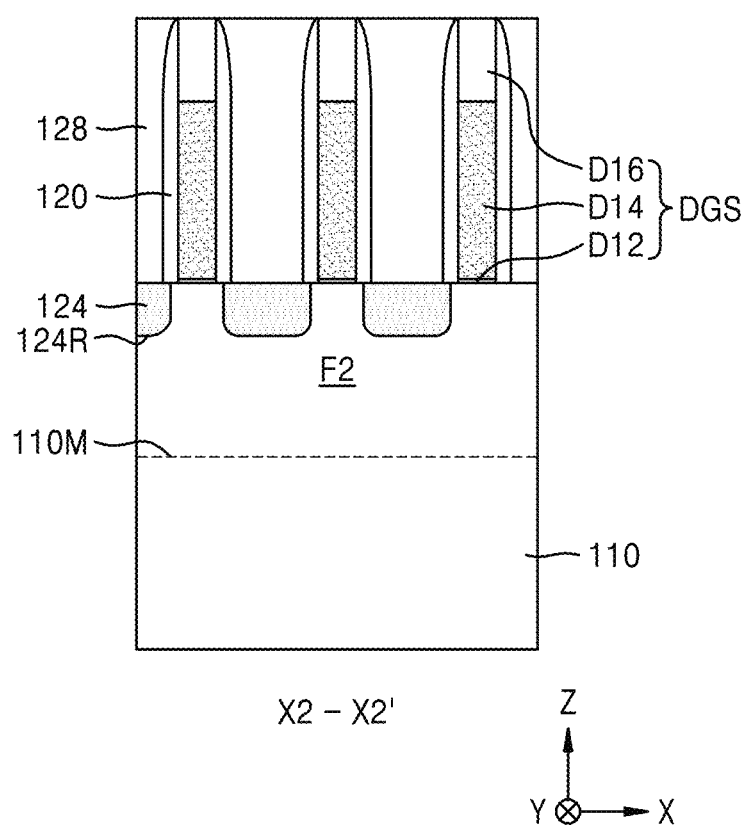
Figure 13C:
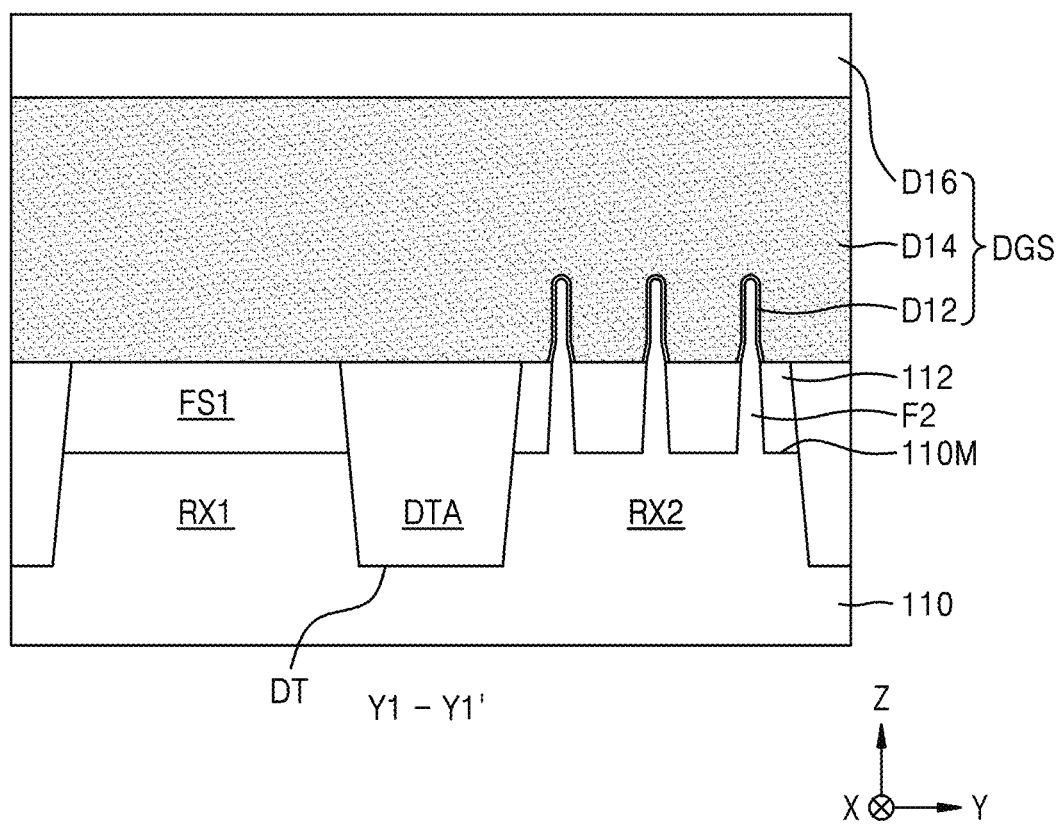
Figure 13D:
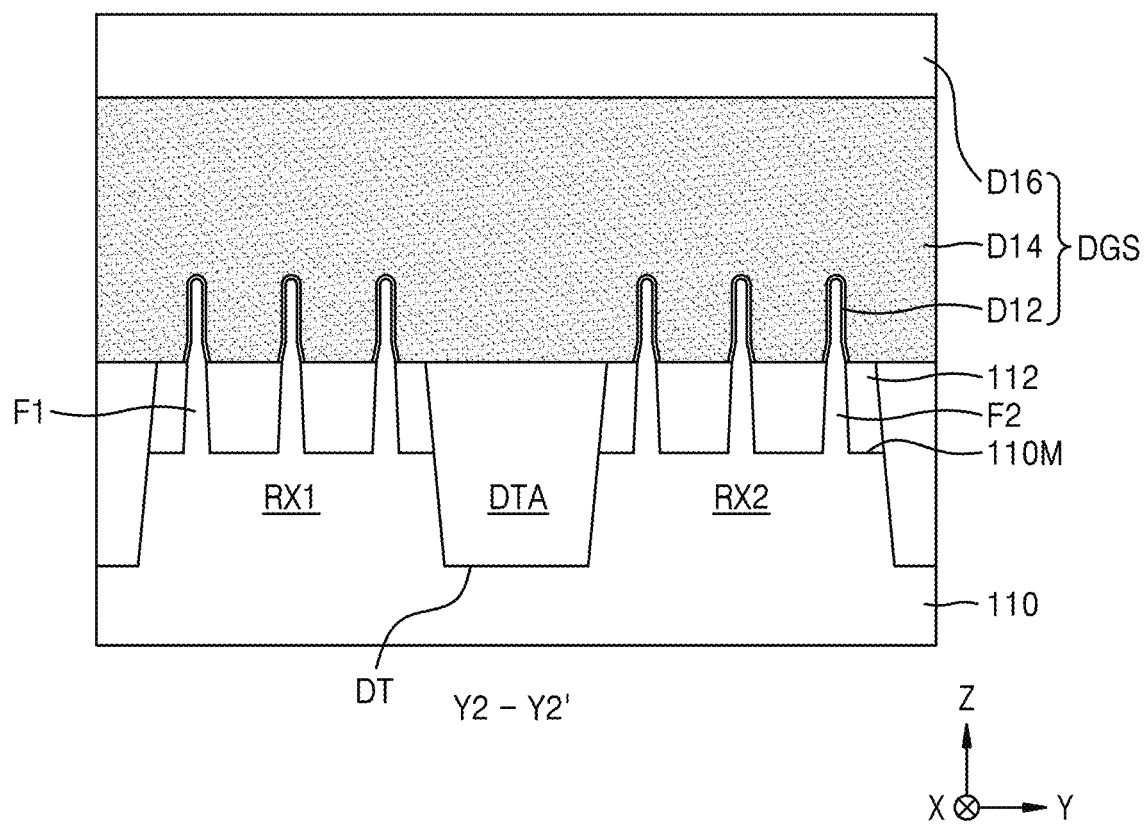
Figure 14A:
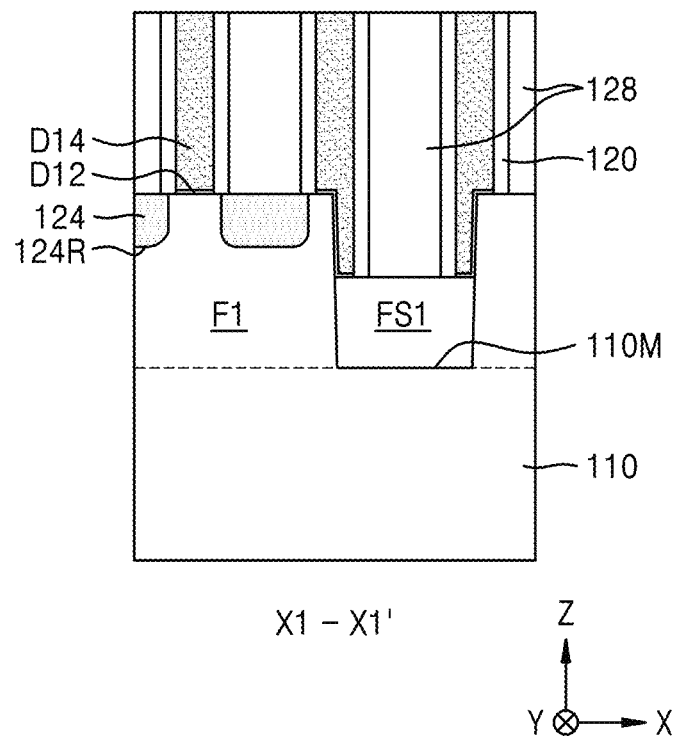
Figure 14B:
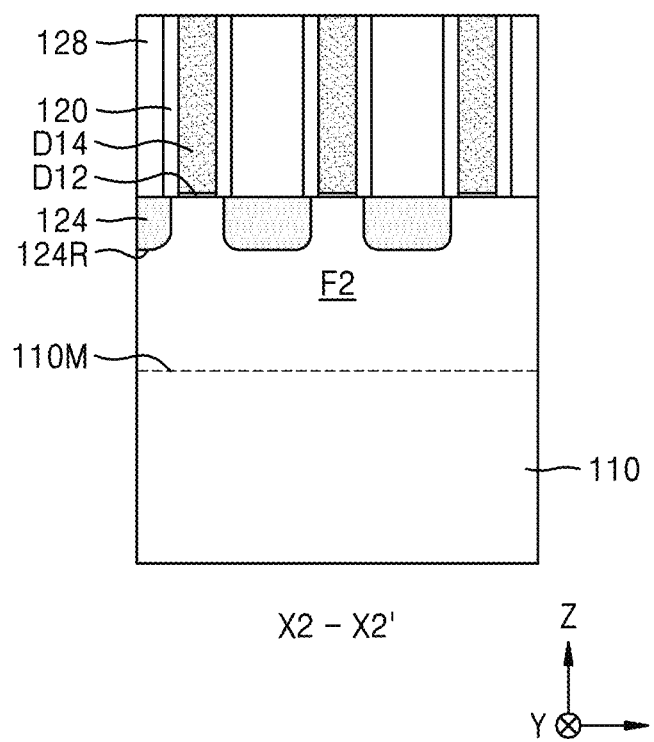
Figure 14C:
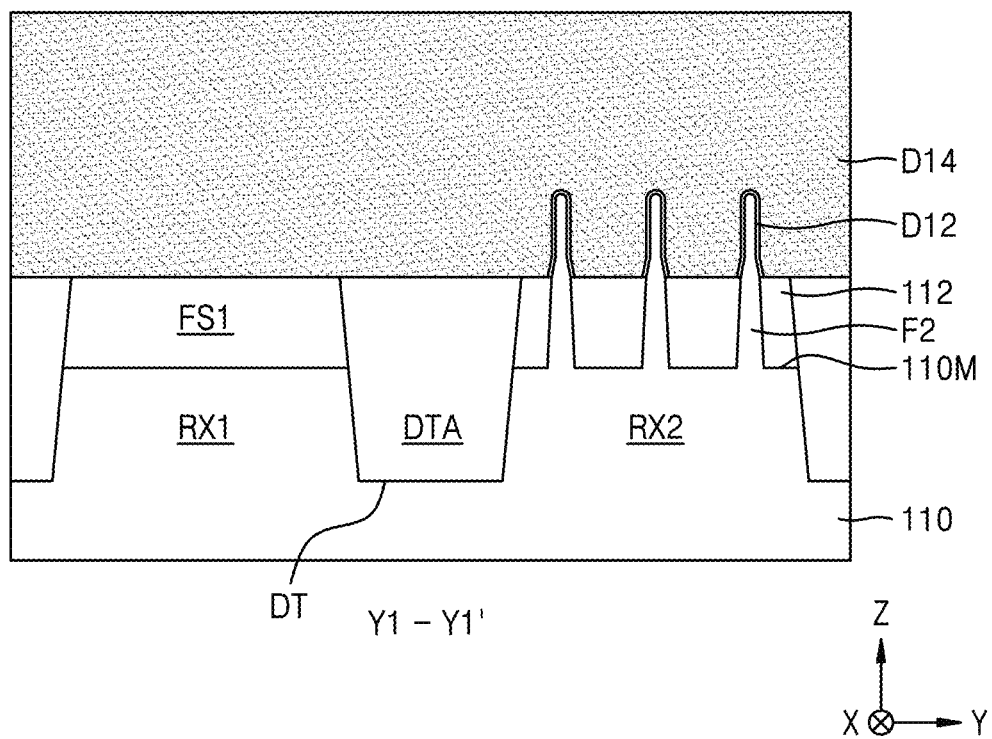
Figure 14D:
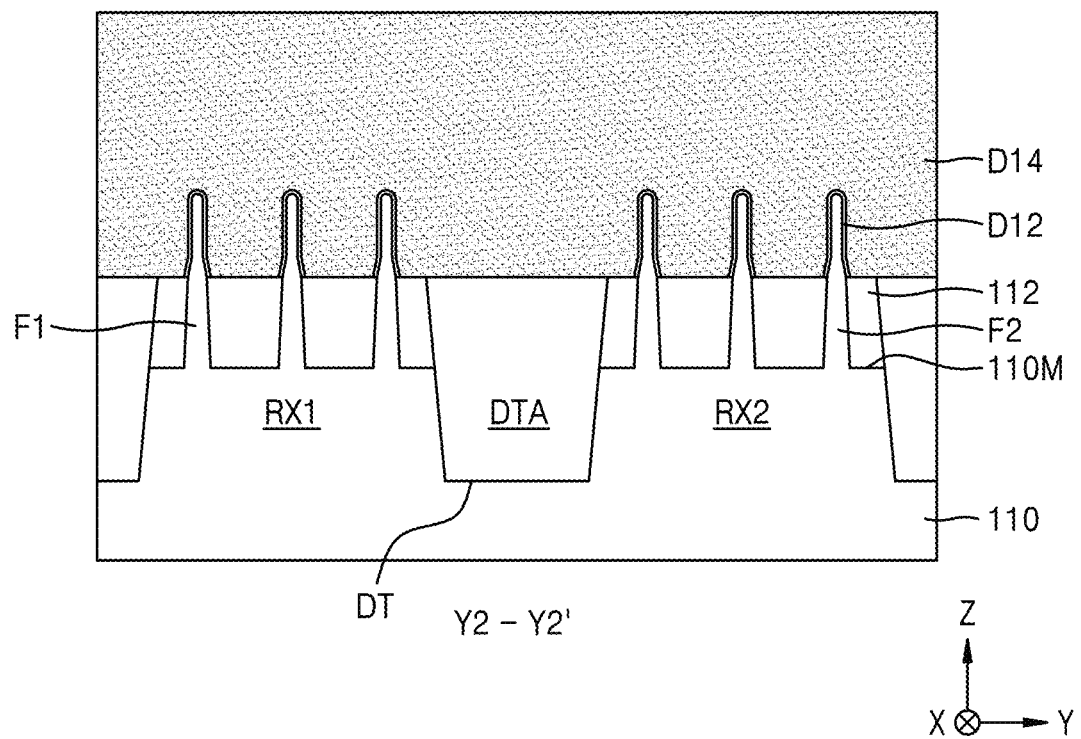
Figure 15A:
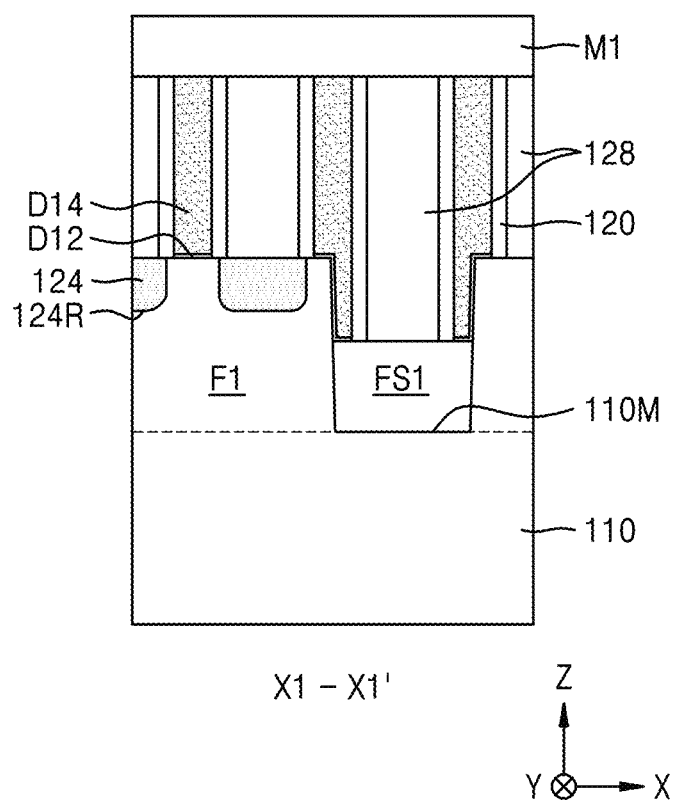
Figure 15B:
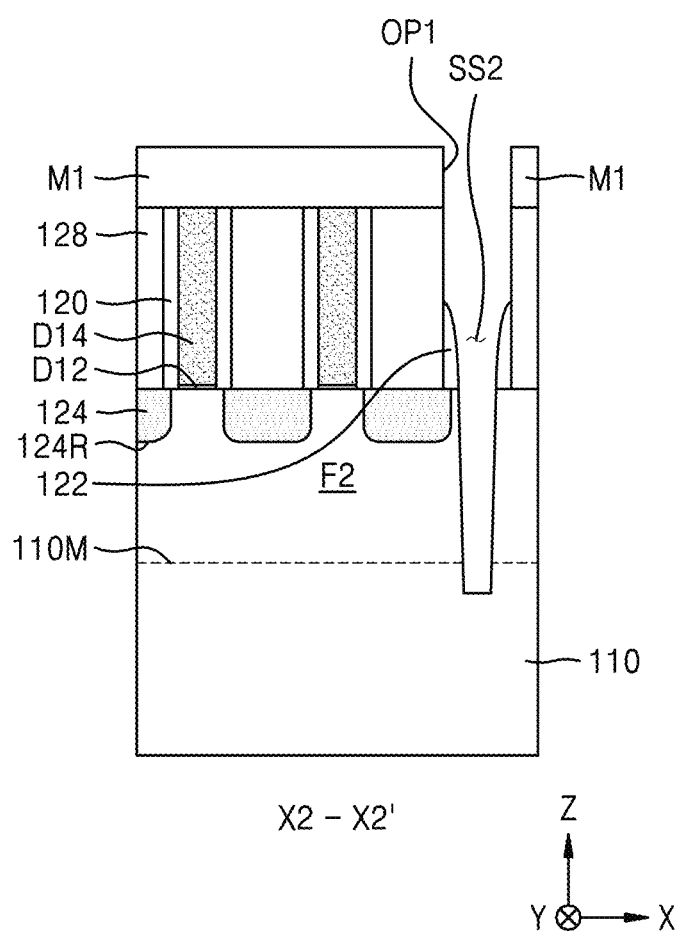
Figure 15C:
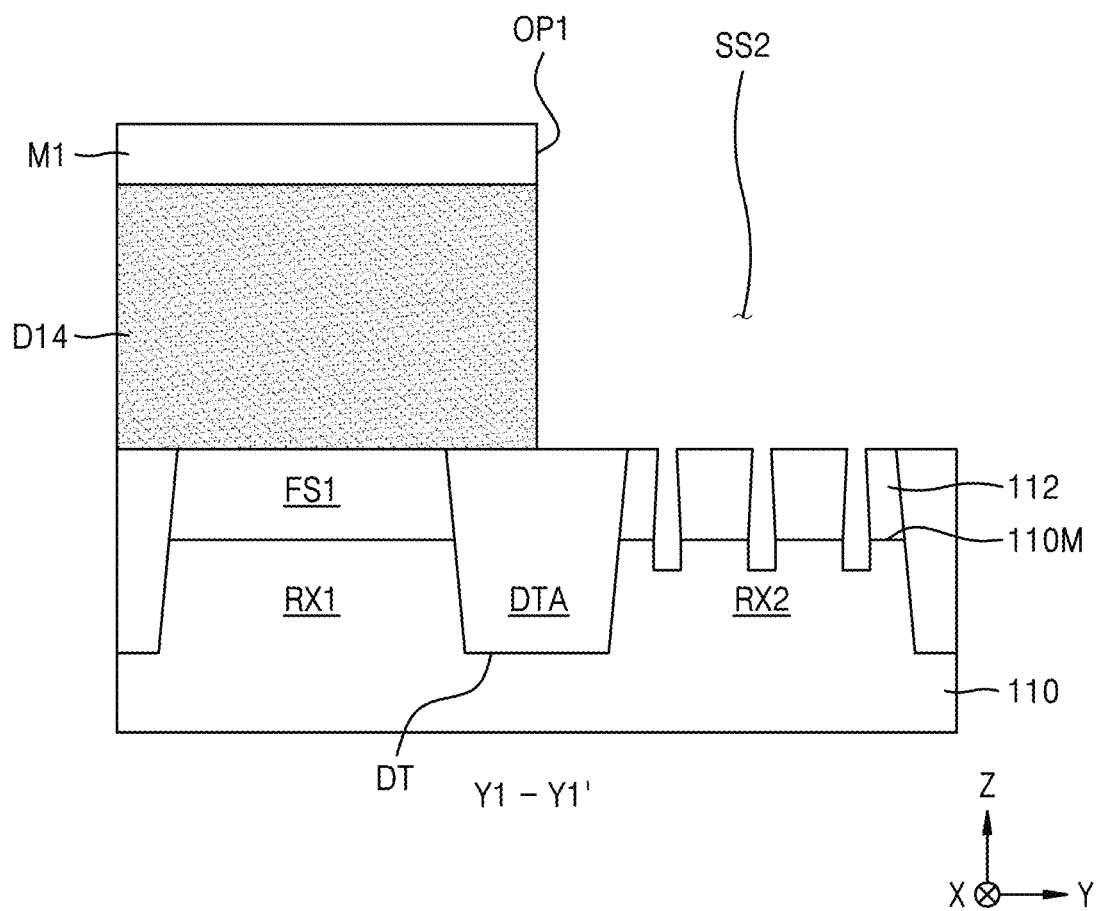
Figure 15D:
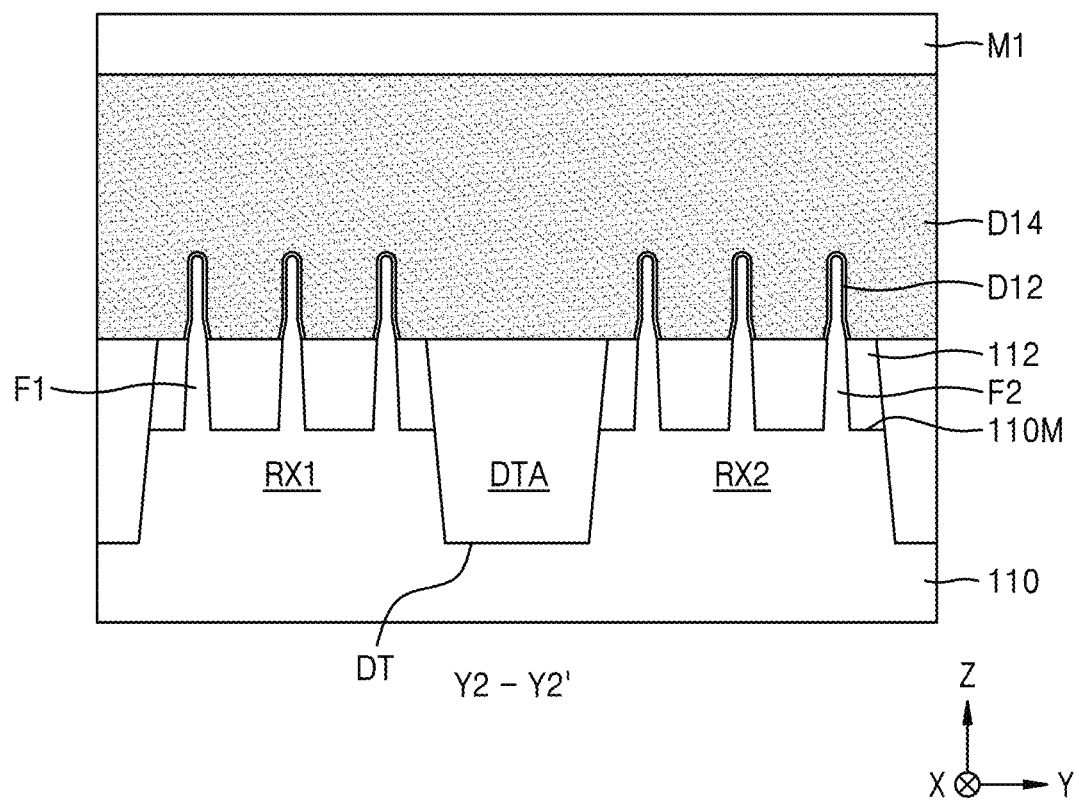
Figure 16A:
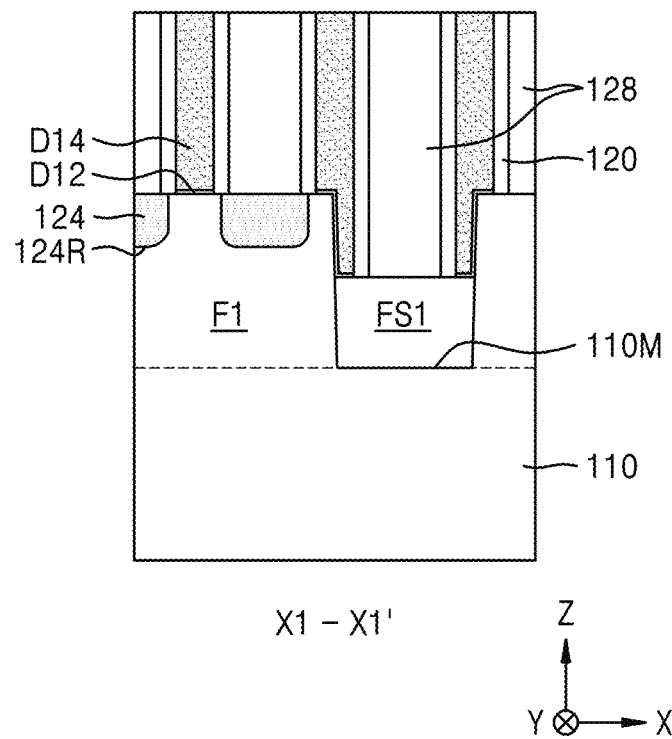
Figure 16B:
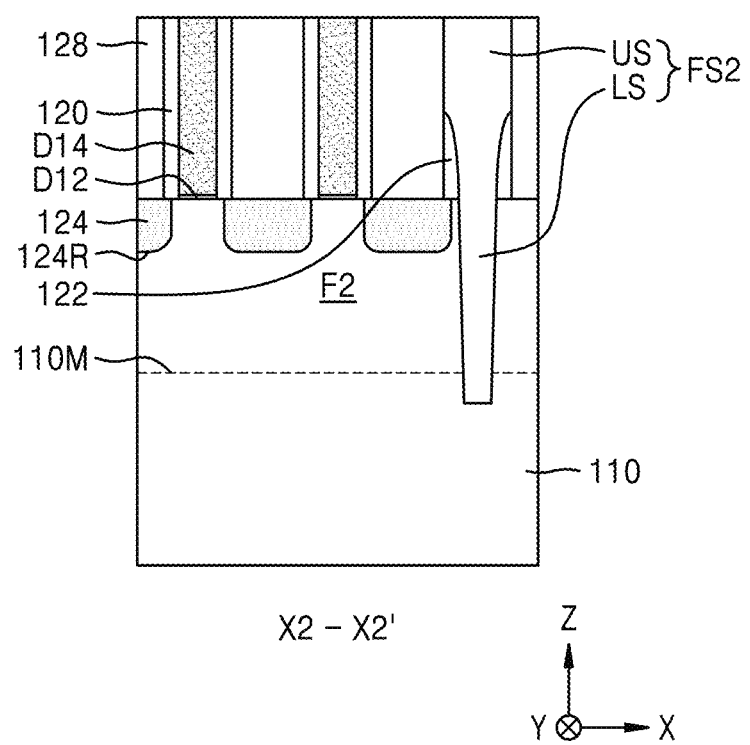
Figure 16C:
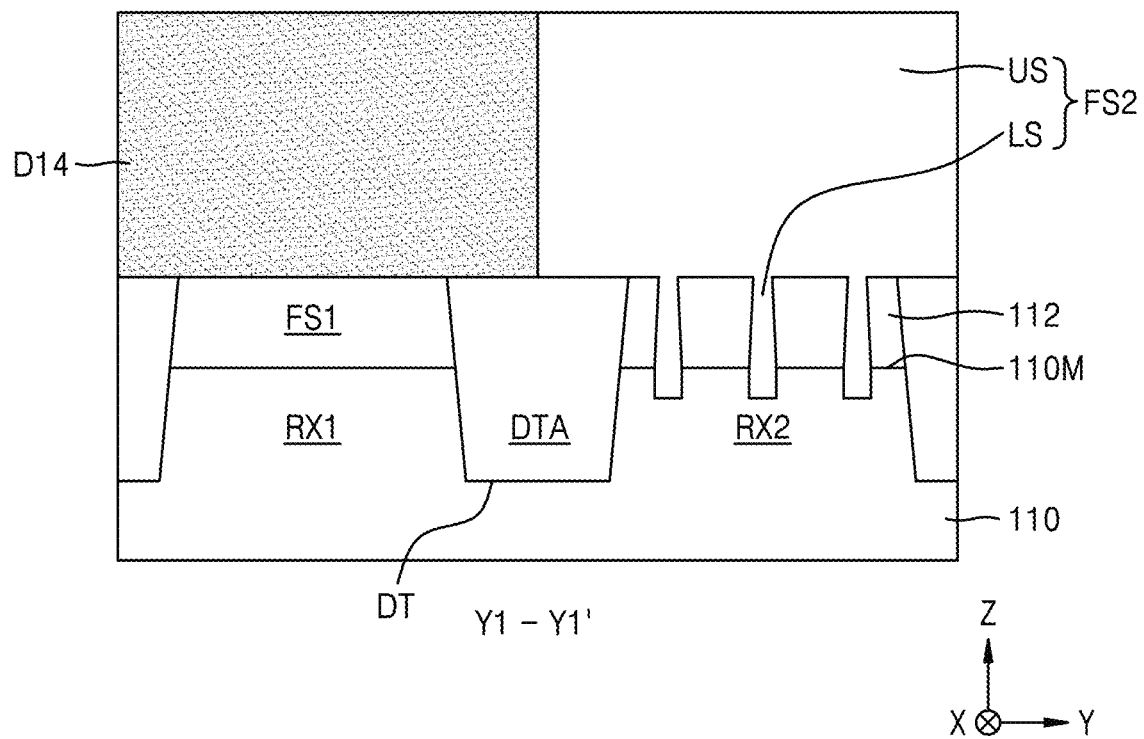
Figure 16D:
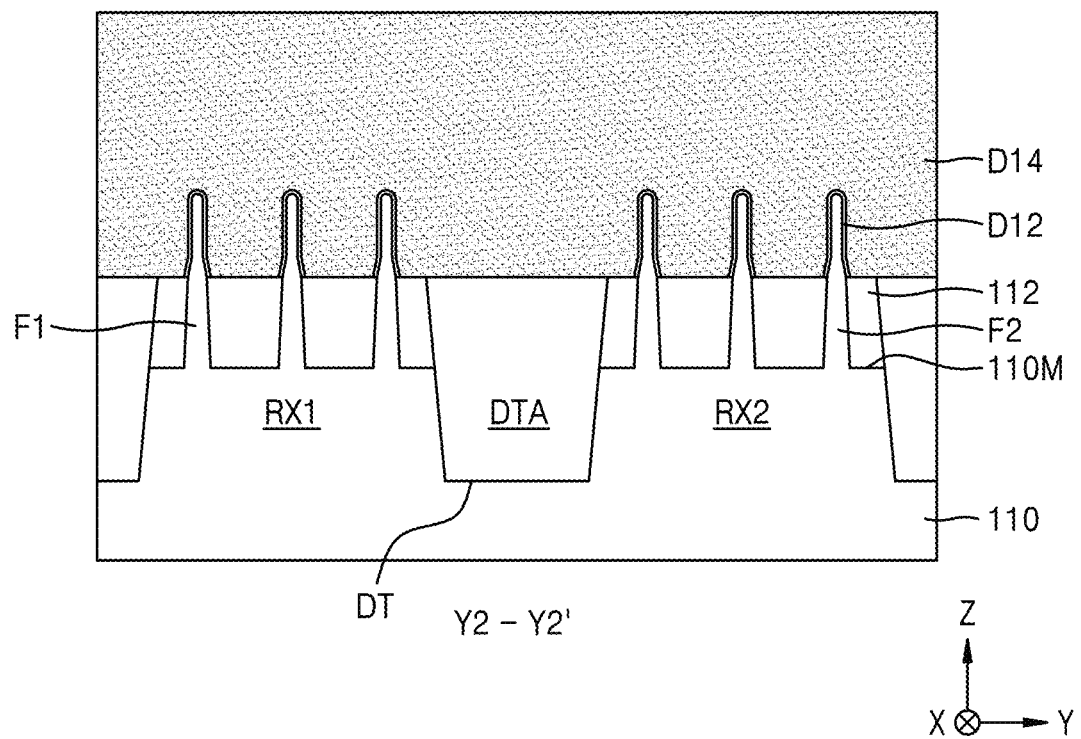
Figure 17A:
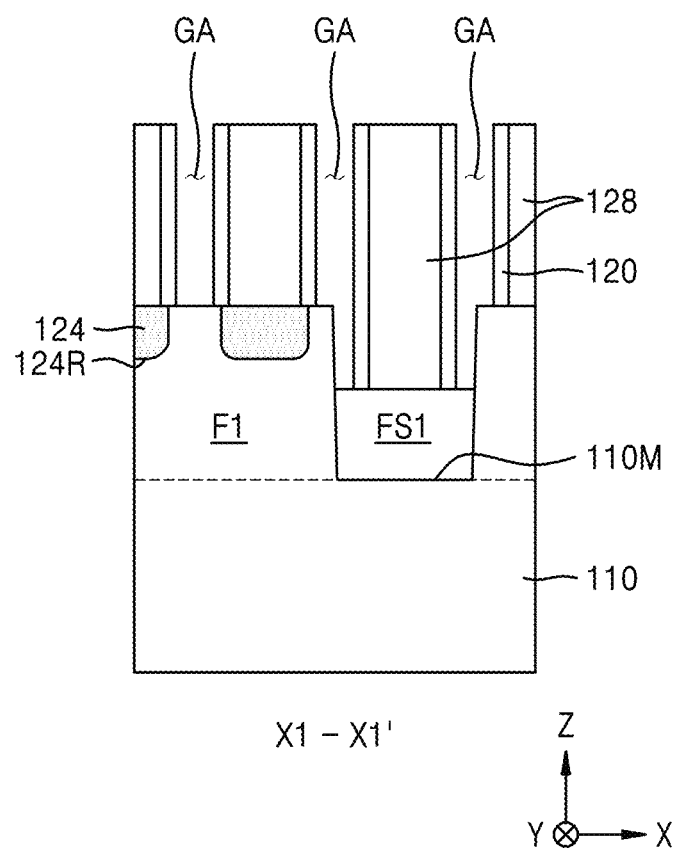
Figure 17B:
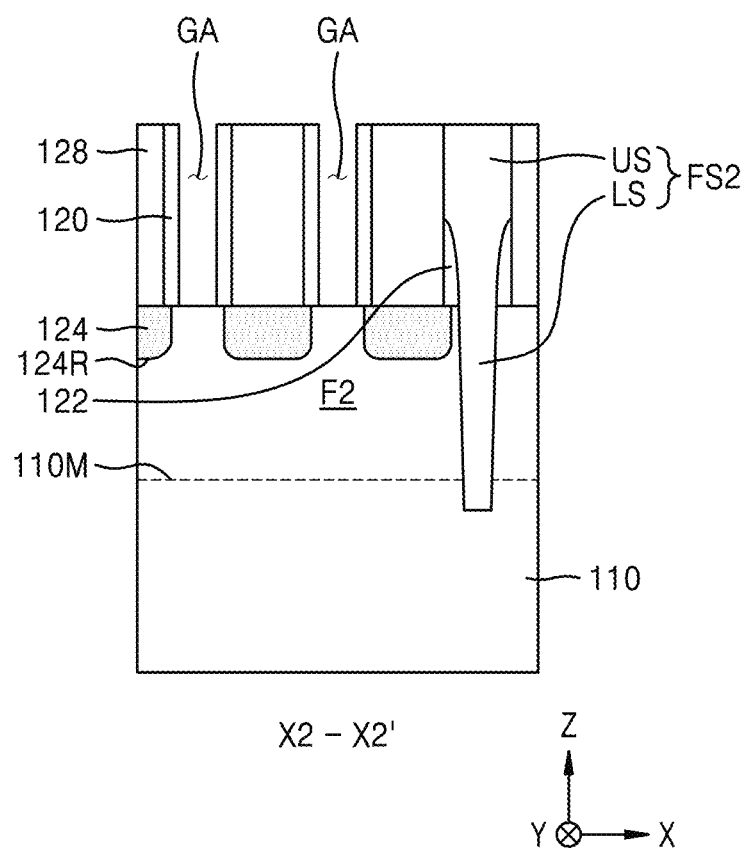
Figure 17C:
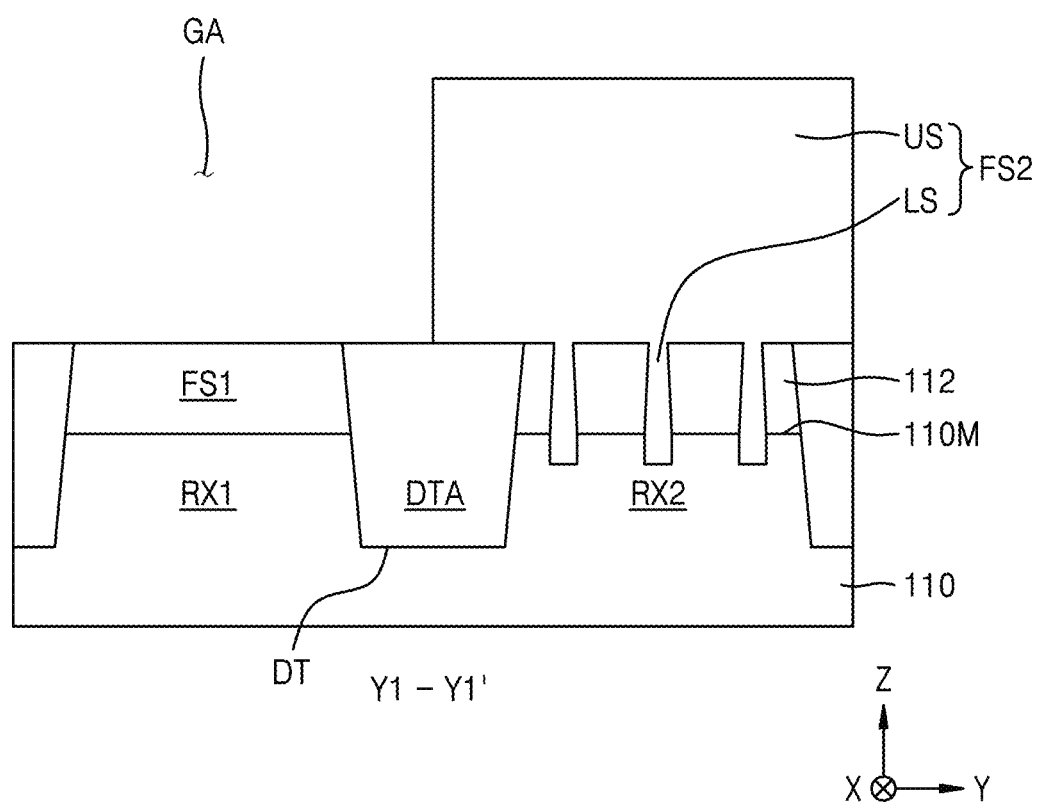
Figure 17D:
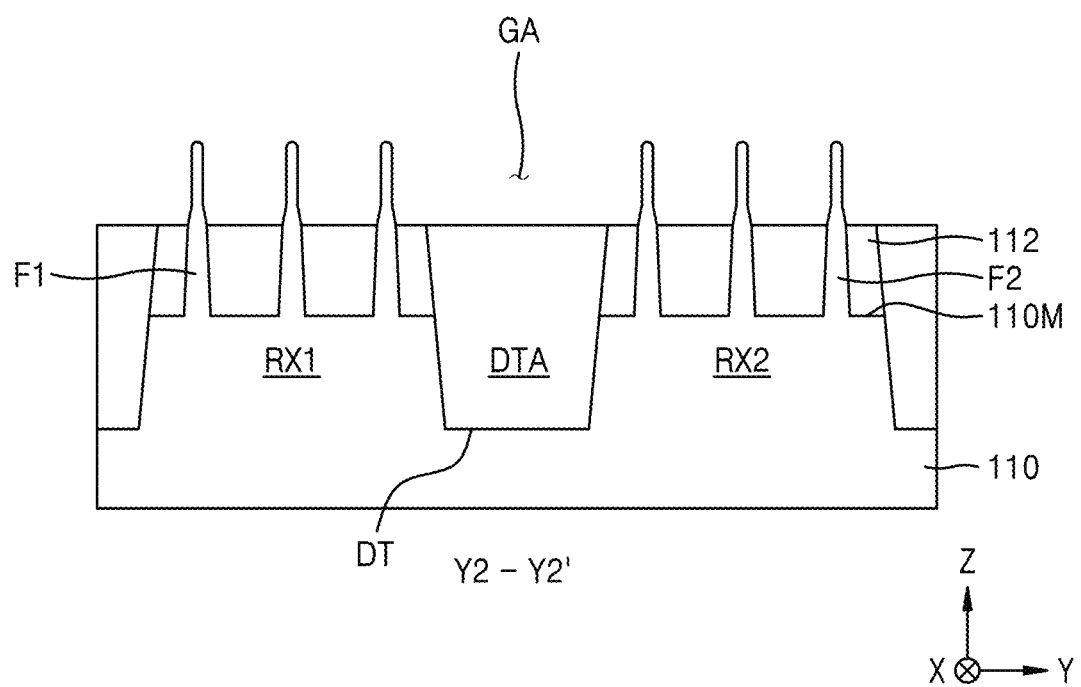
Figure 18A:
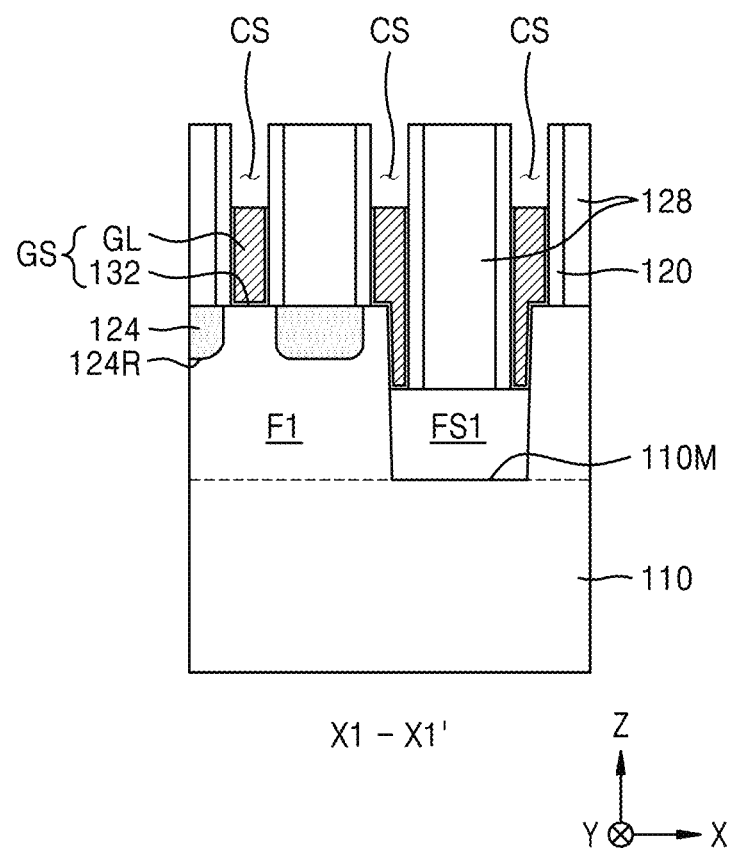
Figure 18B:
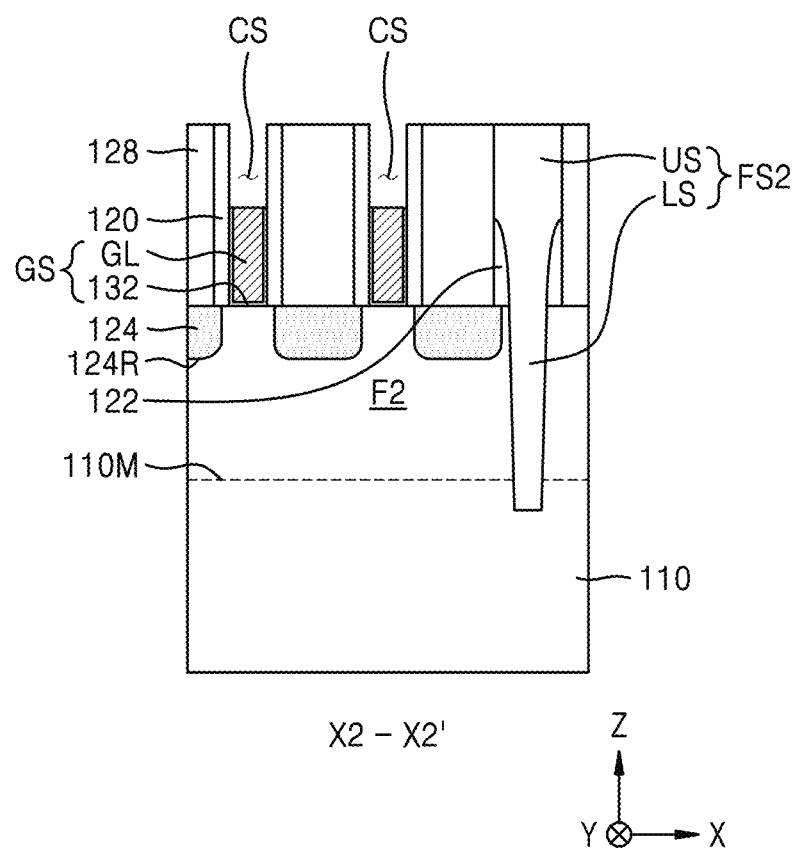
Figure 18C:
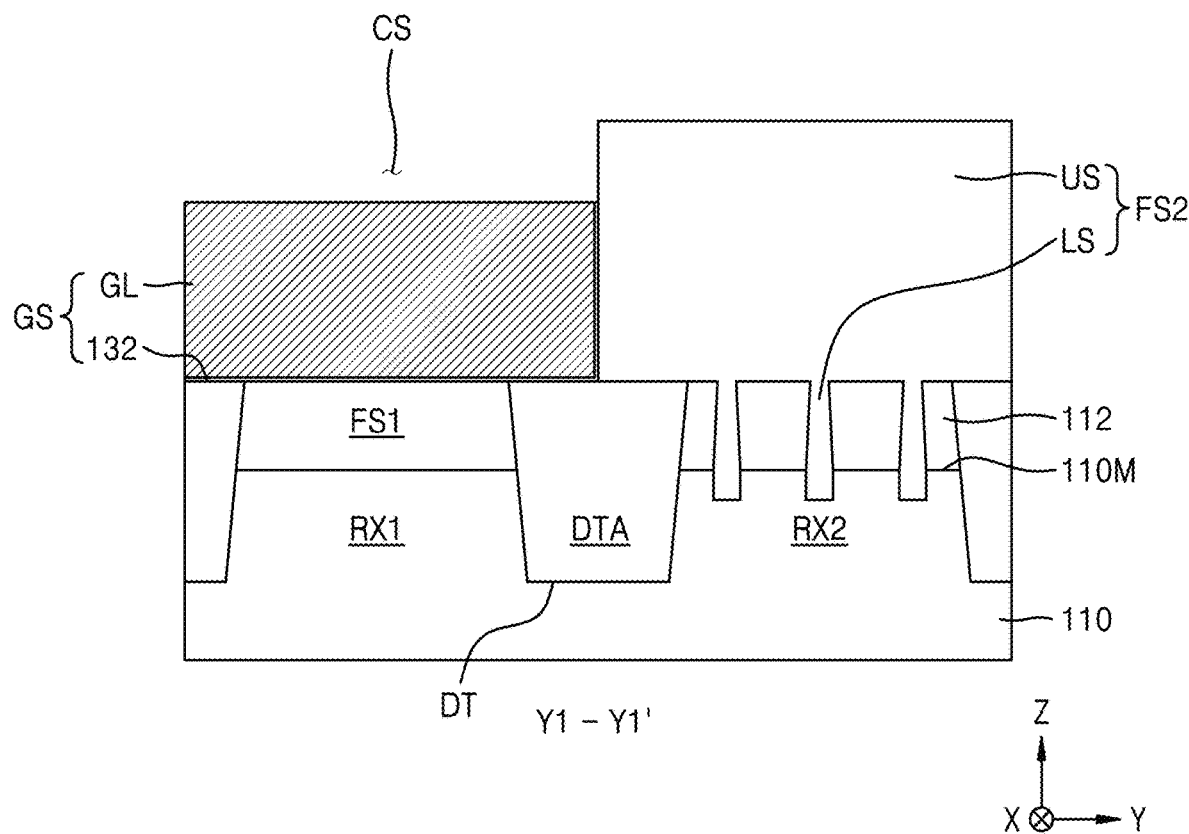
Figure 18D:
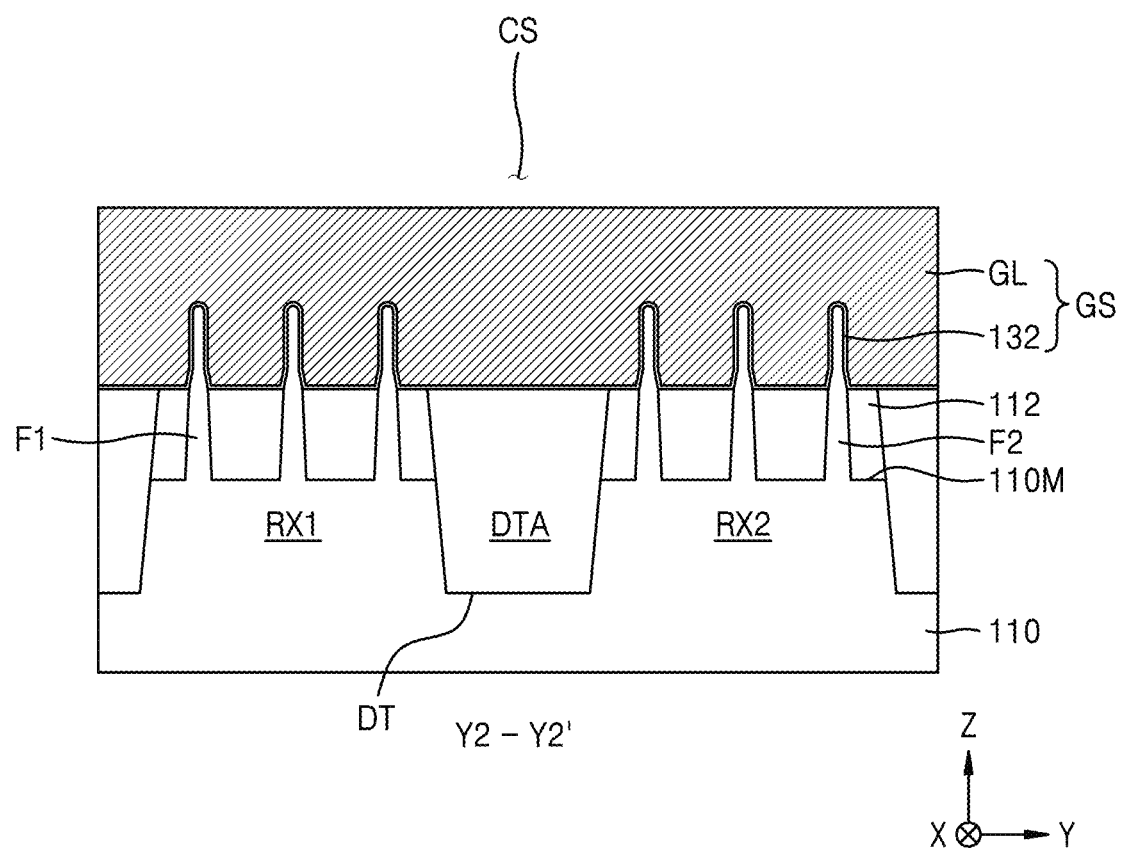
Figure 19A:
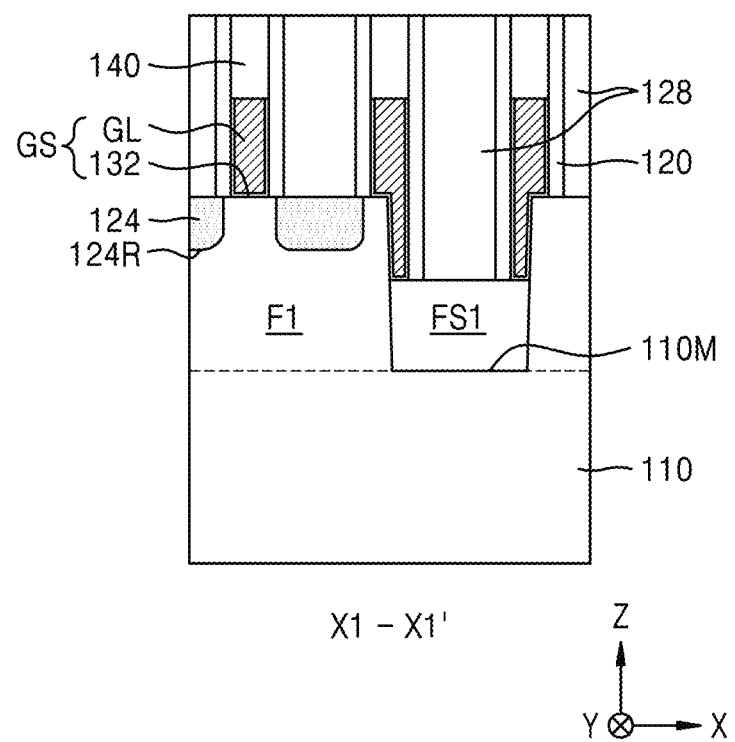
Figure 19B:
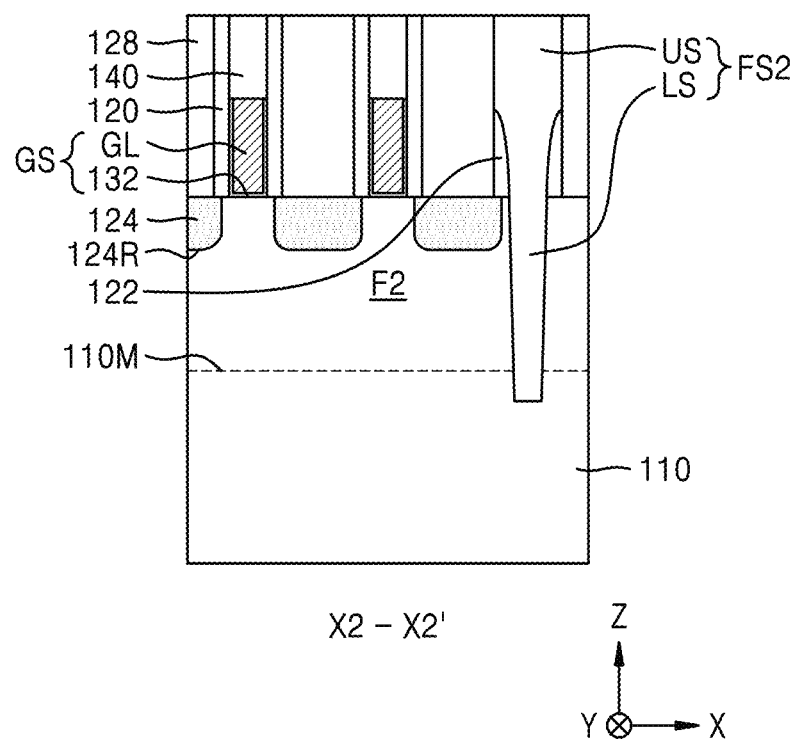
Figure 19C:
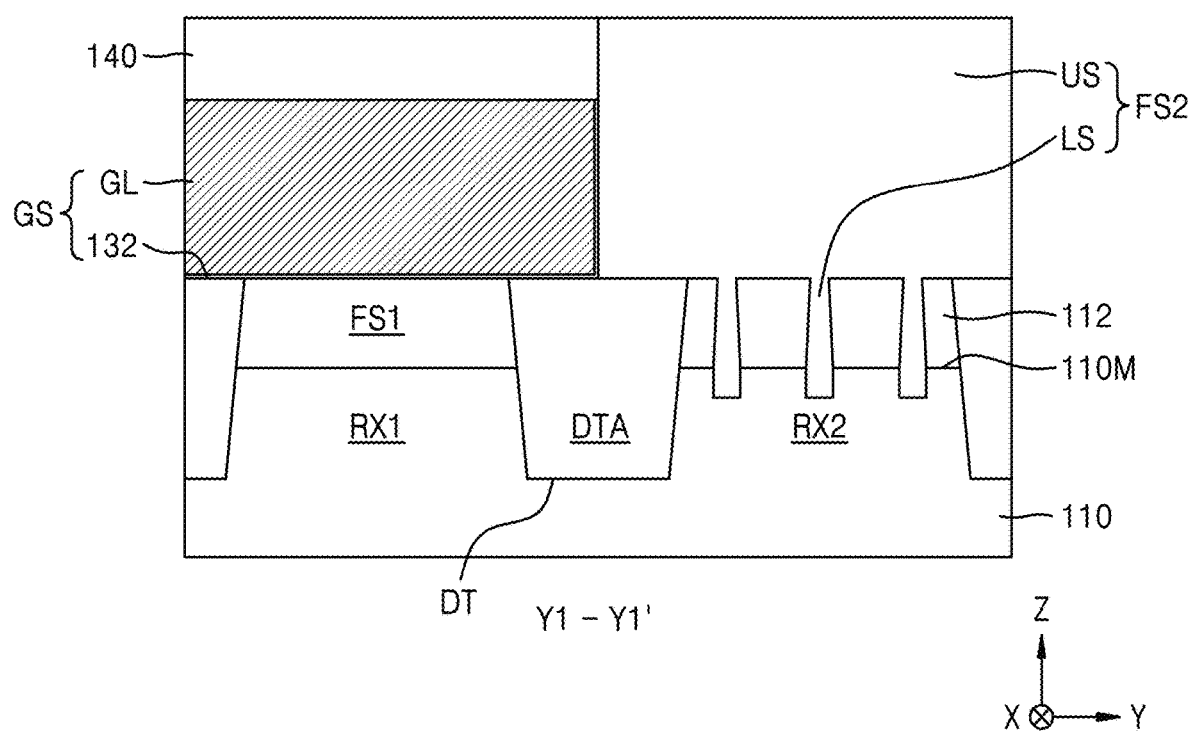
Figure 19D:
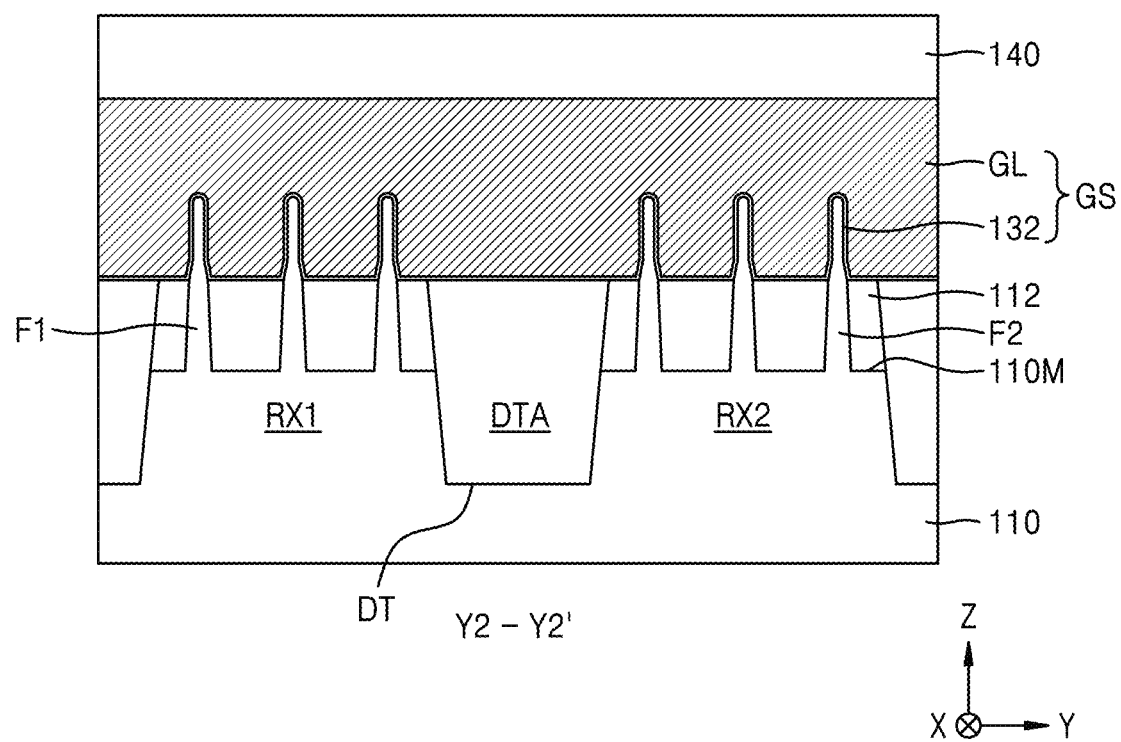

FIG. 11B is a planar layout diagram for explaining an IC device 800 according to other embodiments of inventive concepts. The same reference characters and numerals in FIG. 11B as those in FIGS. 1 through 11A denote the same elements, and thus their description will be omitted herein.

Referring to FIG. 11B, the IC device 800 includes a first logic cell LC4A and a second logic cell LC4B arranged adjacent to each other in the width direction (X direction) with a cell boundary contact portion CBC therebetween. The IC device 800 may constitute the logic cell block 12 of FIG. 1.

Each of the first logic cell LC4A and the second logic cell LC4B may have substantially the same configuration as the logic cell LC4 described above with reference to FIG. 9, and the IC device 800 may have substantially the same configuration as the IC device 700 of FIG. 11A. However, in the IC device 800, a first lateral side SX1A of the first device region RX1 located in the first logic cell LC4A may face the first fin separation insulating portion FS1, and a second lateral side SX1B of the first device region RX1 located in the first logic cell LC4A may be aligned with the cell boundary contact portion CBC. The first fin separation insulating portion FS1 may have a first inner sidewall 1W1 facing the plurality of first fin-type active regions F1 formed in the first device region RX1 of the first logic cell LC4A, and a first outer sidewall OW1 aligned with the first cell boundary CBA. The first lateral side SX1A of the first device region RX1 may be apart from the first cell boundary CBA with the first fin separation insulating portion FS1 therebetween.

The second logic cell LC4B is adjacent to the first logic cell LC4A with the cell boundary contact portion CBC therebetween in the width direction (X direction), and has almost the same configuration as the first logic cell LC4A. The first device region RX1 and the second device region RX2 of the second logic cell LC4B may be referred to as a neighboring first device region RX1 and a neighboring second device region RX2.

One of a pair of opposite lateral sides of the first fin separation insulating portion FS1 in the width direction (X direction) of the second logic cell LC4B may be aligned with the cell boundary contact portion CBC, and the other lateral side may adjoin the neighboring first device region RX1. One of a pair of opposite lateral sides of the neighboring first device region RX1 in the width direction (X direction) of the second logic cell LC4B is apart from the cell boundary contact portion CBC with first fin separation insulating portion FS1 therebetween, and the other lateral side is aligned with the second cell boundary CBB.

In an IC device including a plurality of logic cells adjacent to each other, like the IC devices 500, 600, 700, and 800 described above with reference to FIGS. 10A through 11B, even when the area of the logic cells is reduced due to down-scaling, fin separation insulating portions formed around a cell boundary contact portion CBC where the logic cells meet each other employ different structures from each other according to respective channel types of transistors included in the IC device. Thus, while improved performance may be provided according to a channel type of each of the transistors in the logic cells, stable fin separation regions may be provided between the transistors. Moreover, availability of an active region within each of the plurality of adjacent logic cells may be improved, and thus an IC device capable of providing improved performance may be obtained.

FIGS. 12A through 19D are cross-sectional views for explaining a method of manufacturing an IC device, according to embodiments of inventive concepts. In more detail, FIGS. 12A, 13A, . . . , and 19A are cross-sectional structures according to a process sequence of a portion corresponding to a cross-section taken along the line X1-X1' of FIG. 2, FIGS. 12B, 13B, . . . , and 19B are cross-sectional structures according to a process sequence of a portion corresponding to a cross-section taken along the line X2-X2' of FIG. 2, FIGS. 12C, 13C, . . . , and 19C are cross-sectional structures according to a process sequence of a portion corresponding to a cross-section taken along the line Y1-Y1' of FIG. 2, and FIGS. 12D, 13D, . . . , and 19D are cross-sectional structures according to a process sequence of a portion corresponding to a cross-section taken along the line Y2-Y2' of FIG. 2. A method of manufacturing the IC device 100 of FIG. 2 and FIGS. 3A through 3D will now be described with reference to FIGS. 12A through 19D. The same reference characters and numerals in FIGS. 12A through 19D as those in FIG. 2 and FIGS. 3A through 3D denote the same elements, and thus their description will be omitted herein.

Referring to FIGS. 12A through 12D, a plurality of first and second fin-type active regions F1 and F2 are formed by etching some regions of the substrate 110 in the first device region RX1 and the second device region RX2, respectively, and the device isolation layer 112 covering both side walls of a lower portion of each of the plurality of first and second fin-type active regions F1 and F2 are formed.

The deep trench DT defining the first device region RX1 and the second device region RX2 may be formed by etching a portion of the device isolation layer 112 and a portion of the substrate 110, and the device isolation region DTA may be formed to fill the deep trench DT. As the plurality of first fin-type active regions F1 are formed in the first device region RX1, a first fin separation space SS1 may be provided on the main surface 110M of the substrate 110. A portion of the device isolation layer 112 filling the first fin separation space SS1 may be included in the first fin separation insulating portion FS1.

Referring to FIGS. 13A through 13D, a plurality of dummy gate structures DGS each extending in the Y direction to be parallel to each other are formed over the first fin separation insulating portion FS1, the device isolation layer 112, the device isolation region DTA, and the plurality of first and second fin-type active regions F1 and F2. Each of the plurality of dummy gate structures DGS may include a dummy gate insulating layer D12, a dummy gate line D14, and a dummy gate insulating capping layer D16 stacked on the plurality of first and second fin-type active regions F1 and F2 in this stated order. The dummy gate insulating layer D12 may include silicon oxide. The dummy gate line D14 may include polysilicon. The dummy gate insulating capping layer D16 may include silicon nitride. Some of the plurality of dummy gate structures DGS may cover the first fin separation insulating portion FS1. First insulating spacers 120 may be formed on both sidewalls of the dummy gate structure DGS.

The plurality of recesses 124R may be formed by partially etching the plurality of first and second fin-type active regions F1 and F2 at both sides of the dummy gate structure DGS, and the plurality of source/drain regions 124 may be formed by forming semiconductor layers through epitaxial growth processes from inner walls of the plurality of recesses 124R. According to some embodiments, the first device region RX1 may be an NMOS transistor region, and the second device region RX2 may be a PMOS transistor region. In this case, the plurality of source/drain regions 124 on the first device region RX1 may include an epitaxially grown Si layer or an epitaxially grown SiC layer, and the plurality of source/drain regions 124 on the second device region RX2 may include a plurality of epitaxially grown SiGe layers.

The inter-gate insulating layer 128 covering the first fin separation insulating portion FS1, the device isolation layer 112, and the plurality of source/drain regions 124 may be formed between the plurality of dummy gate structures DGS.

Referring to FIGS. 14A through 14D, the dummy gate insulating capping layer D16 and its surrounding insulating layers are removed from a result of FIGS. 13A through 13D via chemical mechanical polishing (CMP), and thus, the dummy gate line D14 is exposed and heights of the inter-gate insulating layer 128 and the plurality of first insulating spacers 120 are lowered.

Referring to FIGS. 15A through 15D, a mask pattern M1 having an opening OP1 is formed on a result of FIGS. 14A through 14D. The mask pattern M1 may include silicon nitride, silicon oxide, or a combination thereof. Portions of the dummy gate line D14 corresponding to the second fin separation insulating portion FS2 (refer to FIG. 2) on the second device region RX2 may be exposed through the opening OP1 of the mask pattern M1.

The dummy gate line D14 exposed through the opening OP1 of the mask pattern M1 is selectively removed by using the mask pattern M1 as an etching mask, and the dummy gate insulating layer D12 exposed as a result is removed. Next, a second fin separation space SS2 is formed by etching portions of the plurality of second fin-type active regions F2 exposed through the opening OP1 on the second device region RX2.

While the dummy gate line D14, the dummy gate insulating layer D12, and the plurality of second fin-type active regions F2 are being etched to form the second fin separation space SS2, the first insulating spacers 120 exposed together to an etching atmosphere through the opening OP1 may also be partially consumed, and thus, the plurality of second insulating spacers 122, which is a result of lowering heights of the first insulating spacers 120, may be formed.

Referring to FIGS. 16A through 16D, an isolation insulating layer (not shown) filling the second fin separation space SS2 formed by depositing an insulating material on a result of FIGS. 15A through 15D, and then the mask pattern M1 and unnecessary portions of the isolation insulating layer are removed until an upper surface of the inter-gate insulating layer 128 is exposed. As a result, the second fin separation insulating portion FS2 having a portion of isolation insulating layer filling the second fin separation space SS2 may be obtained. The second fin separation insulating portion FS2 may include an upper insulating portion US and a lower insulating portion LS integrally connected to each other.

Referring to FIGS. 17A through 17D, a plurality of gate structure spaces GA are prepared on the first device region RX1 and the second device region RX2 by removing the plurality of dummy gate lines D14 and the plurality of dummy gate insulating layers D12 under the plurality of dummy gate lines D14 from a result of FIGS. 16A through 16D.

Referring to FIGS. 18A to 18D, the gate insulating layer 132 and the gate line GL filling a portion of each of the plurality of gate structure spaces GA are formed on a result of FIGS. 17A through 17D. In the gate structure space GA, a capping space CS may remain on the gate line GL.

According to some embodiments, before the gate insulating layer 132 is formed, an interface layer (not shown) may be formed on a surface of each of the plurality of first and second fin-type active regions F1 and F2 exposed through the plurality of gate structure spaces GA. The interface layer may be obtained by oxidizing a portion of the plurality of first and second fin-type active regions F1 and F2.

Referring to FIGS. 19A through 19D, the plurality of gate insulating capping layers 140 filling the plurality of capping spaces CS are formed on a result of FIGS. 18A through 18D.

A capping insulating layer that is thick enough to fill each of the plurality of capping spaces CS may be formed over the substrate 110 to form each of the gate insulating capping layers 140, and then, unnecessary portions of the capping insulating layer may be removed to expose an upper surface of each of the inter-gate insulating layer 128 and the second fin separation insulating portion FS2.

Next, the upper insulating capping layer 150 and the interlayer insulating layer 170 may be formed on a result of FIGS. 19A through 19D to thereby manufacture the IC device 100 illustrated in FIGS. 2 and 3A through 3D.

FIGS. 20A through 20D are cross-sectional views for explaining a method of manufacturing an IC device, according to other embodiments of inventive concepts. In detail, FIGS. 20A through 20D are cross-sectional structures according to a process sequence of a portion corresponding to a cross-section taken along the line X2-X2' of FIG. 5. A method of manufacturing the IC device 300 of FIG. 5 and FIGS. 6A through 6D will now be described with reference to FIGS. 20A through 20D. The same reference characters and numerals in FIGS. 20A through 20D as those in FIG. 5 and FIGS. 6A through 6D denote the same elements, and thus their description will be omitted herein.

Figure 20A:
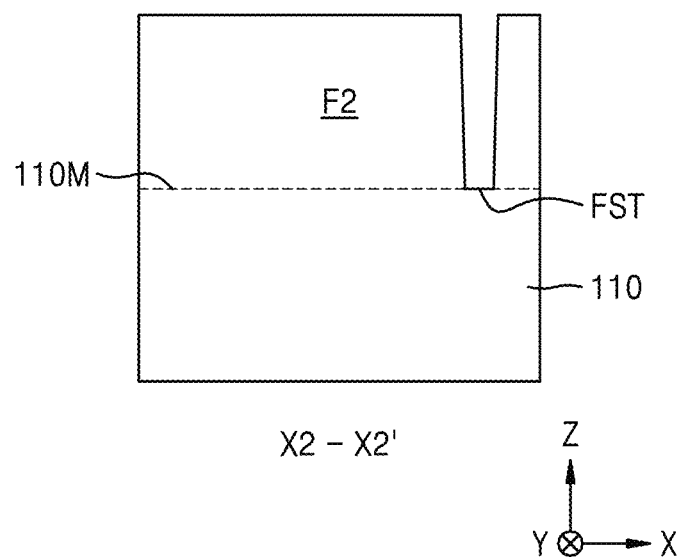
FIGS. 20A through 20D are cross-sectional views for explaining a method of manufacturing an IC device, according to other embodiments of inventive concepts.

Referring to FIG. 20A, similar to the method described above with reference to FIGS. 12A through 12D, the plurality of first and second fin-type active regions F1 and F2 are formed by etching some regions of the substrate 110 in the first device region RX1 and the second device region RX2, respectively, and a fin separation trench FST is formed by partially etching each of the plurality of second fin-type active regions F2 on the second device region RX2.

Figure 20B:
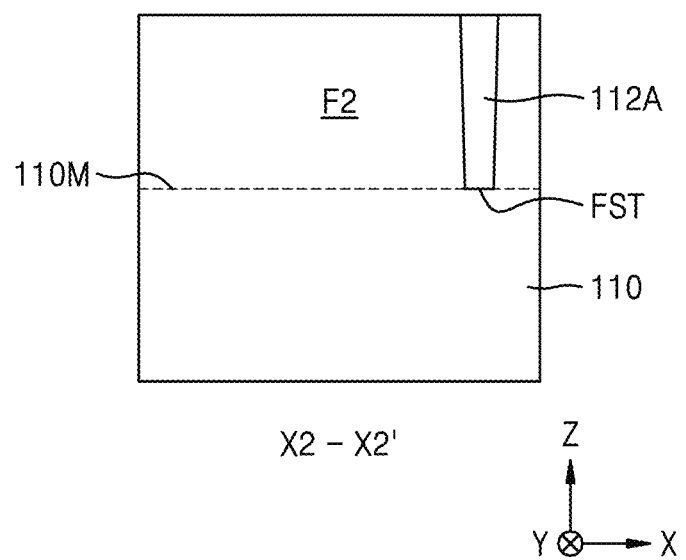

Referring to FIG. 20B, a separation insulating layer 112A is formed to fill the fin separation trench FST. The separation insulating layer 112A may be an insulating layer for forming the device isolation layer 112 described above with reference to FIGS. 12A through 12D. The separation insulating layer 112A may be formed to fill spaces between the plurality of first fin-type active regions F1 and between the plurality of second fin-type active regions F2 on the first device region RX1 and the second device region RX2 (see FIG. 5 and FIGS. 6A through 6D).

Figure 20C:
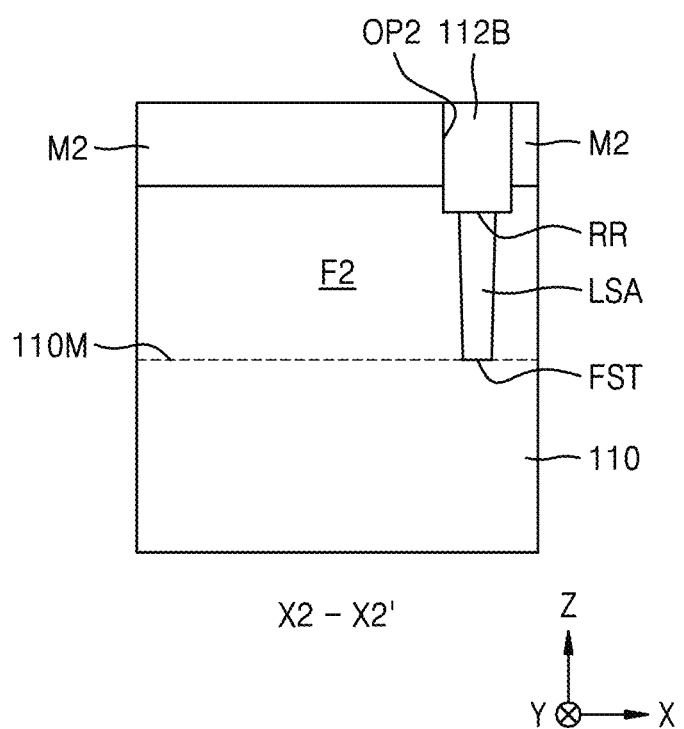

Referring to FIG. 20C, a mask pattern M2 having an opening OP2 partially exposing the separation insulating layer 112A and the plurality of second fin-type active regions F2 around the separation insulating layer 112A is formed on a result of FIG. 20B. The mask pattern M2 may be formed to cover the plurality of first fin-type active regions F1, the plurality of second fin-type active regions F2, and the separation insulating layer 112A filling the spaces between the plurality of first fin-type active regions F1 and between the plurality of second fin-type active regions F2 on the first device region RX1 and the second device region RX2 (see FIG. 5 and FIGS. 6A through 6D). The mask pattern M2 may include a material having an etch selectivity with respect to the separation insulating layer 112A. For example, the mask pattern M2 may include a nitride layer, a spin on hardmask (SOH) layer, or a combination thereof.

A recess region RR is formed by partially etching the separation insulating layer 112A and the plurality of second fin-type active regions F2 around the separation insulating layer 112A by certain thicknesses by using the mask pattern M2 as an etching mask. After the recess region RR is formed, a portion of the separation insulating layer 112A remaining in the fin separation trench FST may be included in the lower insulating pattern LSA.

An upper insulating layer 112B filling the recess region RR and the opening OP2 of the mask pattern M2 is formed. The upper insulating layer 112B may include the same material as that included in the separation insulating layer 112A or a different material from that included in the separation insulating layer 112A.

Figure 20D:
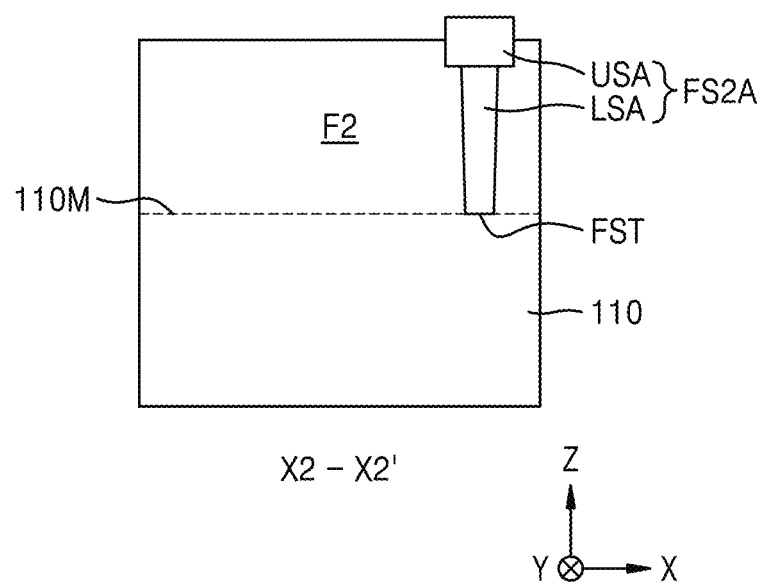

Referring to FIG. 20D, the mask pattern M2 is removed from a result of FIG. 20C to thereby expose the plurality of first fin-type active regions F1, the plurality of second fin-type active regions F2, and the separation insulating layer 112A (not shown) filling the spaces between the plurality of first fin-type active regions F1 and between the plurality of second fin-type active regions F2 on the first device region RX1 and the second device region RX2 (see FIG. 5 and FIGS. 6A through 6D). Thereafter, the device isolation layer 112 of FIG. 6D covering both side walls of the lower portion of each of the plurality of first and second fin-type active regions F1 and F2 is formed by etching the separation insulating layer 112A and the upper insulating layer 112B each exposed over the substrate 110 from upper surfaces thereof by certain thicknesses such that respective upper portions of the plurality of first and the second fin-type active regions F1 and F2 are exposed, and at the same time the upper insulating pattern USA including a remaining portion of the upper insulating layer 112B is formed. The lower insulating pattern LSA and the upper insulating pattern USA may be included in the second fin separation insulating portion FS2A. A portion of the device isolation layer 112 may be included in the first fin separation insulating portion FS1 of FIGS. 6A and 6C.

Then, similar processes to those described above with reference to FIGS. 13A through 19D may be performed, and thus the IC device 300 of FIG. 5 and FIGS. 6A through 6D may be manufactured.

The IC device 300A of FIGS. 7A and 7B and the IC device 300B of FIG. 8 may be formed using a similar method to that described above with reference to FIGS. 20A through 20D. However, after a fin separation trench is formed on a substrate via a similar process to the process of forming the fin separation trench FST with reference to FIG. 20A, the second fin separation insulating portion FS2B or the second fin separation insulating portion FS2C may be formed within the fin separation trench using a similar method to the process of forming the separation insulating layer 112A with reference to FIG. 20B. Similar processes to those described above with reference to FIGS. 13A through 19D may be performed, and thus the IC device 300 of FIG. 5 and FIGS. 6A through 6D may be manufactured. Although example methods of manufacturing some IC devices according to inventive concepts have been described with reference to FIGS. 12A through 20D, other IC devices having various structures may be implemented using various methods corresponding to modifications made to the above-described example methods without departing from the spirit of inventive concepts.

While inventive concepts have been particularly shown and described with reference to embodiments thereof, it will be understood that various changes in form and details may be made therein without departing from the spirit and scope of the following claims.

What is claimed is:

1. An integrated circuit (IC) device comprising:
a substrate including a first device region and a second device region spaced apart from each other;
a gate structure extending in a first direction over the first device region;
a first fin-type active region extending in a second direction on the first device region, the second direction being perpendicular to the first direction;
a second fin-type active region extending in the second direction on the second device region;
a first fin separation insulating portion adjacent to the first device region; and
a second fin separation insulating portion adjacent to the second device region,
wherein the first device region and the second device region have different lengths in the second direction, and wherein
the first device region and the second device region are spaced apart from each other in the first direction,
the first fin-type active region protrudes from an upper surface of the first device region,
the second fin-type active region protrudes from an upper surface of the second device region,
the first fin separation insulating portion has a first width in the second direction, and
the second fin separation insulating portion has a second width in the second direction, the second width being different from the first width.

2. The IC device of claim 1, wherein the first width of the first fin separation insulating portion corresponds to a difference between a first length of the first device region and a second length of the second device region in the second direction.

3. The IC device of claim 1, wherein a first lowermost surface of the first fin separation insulating portion and a second lowermost surface of the second fin separation insulating portion are at different vertical levels.

4. The IC device of claim 1, wherein
an uppermost surface of the first fin-type active region is at a first vertical level, and
an uppermost surface of the first fin separation insulating portion is at a second vertical level lower than the first vertical level.

5. The IC device of claim 1, wherein
the second fin separation insulating portion comprises a lower insulating portion and an upper insulating portion connected to each other,
the lower insulating portion has a sidewall facing an end of the second fin-type active region, and
the upper insulating portion has a top surface higher than a top surface of the gate structure.

6. The IC device of claim 1, wherein a first lowermost surface vertical level of the second fin separation insulating portion is lower than a second lowermost surface vertical level of the second fin-type active region.

7. The IC device of claim 1, further comprising:
a dummy gate structure vertically overlying the second fin separation insulating portion,
wherein a first vertical length of the dummy gate structure is smaller than a second vertical length of the gate structure.

8. The IC device of claim 1, further comprising:
a dummy gate structure vertically overlying the second fin separation insulating portion,
wherein a first vertical length of the dummy gate structure on the second fin separation insulating portion is greater than a second vertical length of the gate structure.

9. The IC device of claim 1, further comprising:
a dummy gate structure vertically overlying the second fin separation insulating portion,
wherein the second fin separation insulating portion has a sidewall facing an end of the second fin-type active region and a top surface lower than a top surface of the second fin-type active region.

10. The IC device of claim 9, further comprising:
a source/drain region in the second fin-type active region,
wherein a lowermost surface of the dummy gate structure is at a level lower than a lowermost part of the source/drain region.

11. The IC device of claim 9, further comprising:
a source/drain region in the second fin-type active region,
wherein a lowermost surface of the dummy gate structure is at a level equal to or higher than a lowermost part of the source/drain region.

12. An integrated circuit (IC) device comprising:
a substrate including a first device region, a device isolation region, and a second device region in a logic cell defined by a cell boundary,
wherein the device isolation region is between the first device region and the second device region in a first direction, and the first device region and the second device region have different lengths in a second direction perpendicular to the first direction;
a first fin-type active region extending in the second direction on the first device region;
a second fin-type active region extending in the second direction on the second device region;
a plurality of gate structures extending in the first direction over the first device region, the device isolation region, and the second device region;
a first fin separation insulating portion interposed between the first device region and the cell boundary; and
a pair of second fin separation insulating portions vertically overlying the second device region and the cell boundary and extending in the first direction along the cell boundary, wherein the second fin-type active region is interposed between the pair of second fin separation insulating portions.

13. The IC device of claim 12, wherein
the first fin separation insulating portion is between a first end of the first fin-type active region and a vertical boundary line of the cell boundary,
one of the pair of second fin separation insulating portions is between a second end of the second fin-type active region and the vertical boundary line of the cell boundary, and a first shortest distance in the second direction between the vertical boundary line and the first end of the first fin-type active region is greater than a second shortest distance in the second direction between the vertical boundary line and the second end of the second fin-type active region.

14. The IC device of claim 12, wherein
the first fin-type active region has a first end contacting the first fin separation insulating portion, and
the second fin-type active region has both ends contacting the pair of second fin separation insulating portions.

15. The IC device of claim 12, further comprising a dummy gate structure extending in the first direction and vertically overlying the first fin separation insulating portion and the device isolation region,
wherein the dummy gate structure has an end facing a sidewall of one of the pair of second fin separation insulating portions.

16. The IC device of claim 12, further comprising:
a dummy gate structure extending in the first direction and vertically overlying the first fin separation insulating portion, the device isolation region, and one of the pair of second fin separation insulating portions.

17. An integrated circuit (IC) device comprising:
a substrate including a trench;
a first logic cell and a second logic cell that are adjacent to each other in a width direction on the substrate,
wherein the first logic cell includes a first device region, the second logic cell includes a second device region, and the first device region and the second device region have different lengths in the width direction, the trench is recessed into the substrate to define the first device region and the second device region, and a portion of the trench extends in the width direction between the first device region and the second device region;
a fin separation insulating portion interposed between the first logic cell and the second logic cell and adjacent to the second device region, the fin separation insulating portion extending in a height direction perpendicular to the width direction;
a plurality of fin-type active regions extending in the width direction on the first device region and the second device region, wherein one of the plurality of fin-type active regions has a first end facing the fin separation insulating portion, the plurality of fin-type active regions include a first-fin-type active region protruding from an upper surface of the first device region and a second fin-type active region protruding from an upper surface of the second device region; and
a plurality of gate structures extending in the height direction, wherein the plurality of the gate structures includes a first gate structure extending over the first device region and a second gate structure extending over the second device region.

18. The IC device of claim 17, wherein a first lowermost surface vertical level of the fin separation insulating portion is lower than a second lowermost surface vertical level of the one of the plurality of fin-type active regions.

19. The IC device of claim 17, further comprising:
another fin separation insulating portion adjacent to the first device region,
wherein a first lowermost surface of the fin separation insulating portion and a second lowermost surface of the another fin separation insulating portion are at different vertical levels.

* * * * *